(12) United States Patent
Matsuno et al.

(10) Patent No.: US 12,738,317 B2
(45) Date of Patent: Sep. 15, 2026

(54) THREE-DIMENSIONAL MEMORY DEVICE WITH INTEGRATED CONTACT AND SUPPORT STRUCTURE AND METHOD OF MAKING THE SAME

(71) Applicant: SANDISK TECHNOLOGIES LLC, Addison, TX (US)

(72) Inventors: Koichi Matsuno, Fremont, CA (US); Johann Alsmeier, San Jose, CA (US)

(73) Assignee: Sandisk Technologies, Inc., Milpitas, CA (US)

( * ) Notice: Subject to any disclaimer, the term of this patent is extended or adjusted under 35 U.S.C. 154(b) by 383 days.

(21) Appl. No.: 18/356,825

(22) Filed: Jul. 21, 2023

(65) Prior Publication Data

US 2024/0274191 A1 Aug. 15, 2024

Related U.S. Application Data

(60) Provisional application No. 63/484,619, filed on Feb. 13, 2023.

(51) Int. Cl.
*G11C 16/04* (2006.01)
*H10B 43/10* (2023.01)
(Continued)

(52) U.S. Cl.
CPC ......... *G11C 16/0483* (2013.01); *H10B 43/10* (2023.02); *H10B 43/27* (2023.02);
(Continued)

(58) Field of Classification Search
CPC ............................ G11C 16/0483; H10B 43/35
(Continued)

(56) References Cited

U.S. PATENT DOCUMENTS 9,601,502 B2 3/2017 Sano et al.
9,853,038 B1 * 12/2017 Cui ........................ H10B 43/35
(Continued)

FOREIGN PATENT DOCUMENTS

KR 1020170139390 A 12/2017
KR 1020180095499 A 8/2018

OTHER PUBLICATIONS

Endoh, T. et al., “Novel Ultra High Density Memory with a Stacked-Surrounding Gate Transistor (S-SGT) Structured Cell,” IEDM Proc., (2001), 33-36.
(Continued)

*Primary Examiner* — Dzung Tran
(74) *Attorney, Agent, or Firm* — THE MARBURY LAW GROUP PLLC

(57) ABSTRACT

A memory device includes a first-tier alternating stack of first insulating layers and electrically conductive layers located over a substrate, a second-tier alternating stack of second insulating layers and second electrically conductive layers overlying the first-tier alternating stack, a memory stack structure vertically extending through the first-tier alternating stack and the second-tier alternating stack, and a first support and contact assembly vertically extending through the first-tier alternating stack and the second-tier alternating stack. The first support and contact assembly includes a first contact via structure contacting an annular top surface of an electrically conductive layer, a first dielectric pillar structure underlying the reference-level electrically conductive layer, and a first-tier dielectric spacer that laterally surrounds the first contact via structure.

9 Claims, 46 Drawing Sheets

(51) Int. Cl.
*H10B 43/27* (2023.01)
*H10B 43/35* (2023.01)
*H10W 20/41* (2026.01)
*H10W 20/42* (2026.01)

(52) U.S. Cl.
CPC ............ *H10B 43/35* (2023.02); *H10W 20/42* (2026.01); *H10W 20/435* (2026.01)

(58) Field of Classification Search
USPC .......................................................... 517/314
See application file for complete search history.

(56) References Cited

U.S. PATENT DOCUMENTS

| | | | |
|---|---|---|---|
| 9,960,181 | B1 | 5/2018 | Cui et al. |
| 10,269,625 | B1 * | 4/2019 | Matovu ............. H01L 21/31053 |
| 10,957,706 | B2 | 3/2021 | Otsu et al. |
| 10,971,514 | B2 | 4/2021 | Otsu et al. |
| 11,450,679 | B2 | 9/2022 | Tanaka et al. |
| 11,488,975 | B2 | 11/2022 | Totoki et al. |
| 11,495,612 | B2 | 11/2022 | Tanaka et al. |
| 2017/0179026 | A1 * | 6/2017 | Toyama .............. H01L 23/5226 |
| 2017/0358590 | A1 * | 12/2017 | Kang ..................... H10B 43/35 |
| 2018/0197874 | A1 | 7/2018 | Oshiki et al. |
| 2018/0277596 | A1 | 9/2018 | Mori |
| 2019/0252396 | A1 | 8/2019 | Mushiga et al. |
| 2022/0005818 | A1 | 1/2022 | Tanaka et al. |
| 2022/0005824 | A1 | 1/2022 | Tanaka et al. |
| 2022/0130852 | A1 | 4/2022 | Totoki et al. |
| 2022/0352091 | A1 | 11/2022 | Yu et al. |
| 2022/0352196 | A1 | 11/2022 | Shimomura et al. |
| 2022/0352197 | A1 | 11/2022 | Matsuno et al. |
| 2022/0406379 | A1 | 12/2022 | Takeguchi et al. |
| 2022/0406793 | A1 | 12/2022 | Takeguchi et al. |
| 2023/0038557 | A1 | 2/2023 | Ogawa et al. |
| 2023/0041950 | A1 | 2/2023 | Chibvongodze et al. |
| 2023/0045001 | A1 | 2/2023 | Ogawa et al. |

OTHER PUBLICATIONS

U.S. Appl. No. 17/556,298, filed Dec. 20, 2021, SanDisk Technologies LLC.
U.S. Appl. No. 17/663,951, filed May 18, 2022, SanDisk Technologies LLC.
U.S. Appl. No. 17/678,499, filed Feb. 23, 2022, SanDisk Technologies LLC.
U.S. Appl. No. 17/682,515, filed Feb. 28, 2022, SanDisk Technologies LLC.
U.S. Appl. No. 17/682,550, filed Feb. 28, 2022, SanDisk Technologies LLC.
U.S. Appl. No. 17/684,922, filed Mar. 2, 2022, SanDisk Technologies LLC.
U.S. Appl. No. 17/804,184, filed May 26, 2022, SanDisk Technologies LLC.
U.S. Appl. No. 17/806,390, filed Jun. 10, 2022, SanDisk Technologies LLC.
U.S. Appl. No. 17/806,579, filed Jun. 13, 2022, SanDisk Technologies LLC.
U.S. Appl. No. 17/807,804, filed Jun. 20, 2022, SanDisk Technologies LLC.
U.S. Appl. No. 18/062,807, filed Dec. 7, 2022, SanDisk Technologies LLC.
U.S. Appl. No. 18/221,689, filed Jul. 13, 2023, SanDisk Technologies LLC.
U.S. Appl. No. 18/221,711, filed Jul. 13, 2023, SanDisk Technologies LLC.
U.S. Appl. No. 18/349,578, filed Jul. 10, 2023, SanDisk Technologies LLC.
U.S. Appl. No. 18/352,726, filed Jul. 14, 2023, SanDisk Technologies LLC.
U.S. Appl. No. 18/352,752, filed Jul. 14, 2023, SanDisk Technologies LLC.
U.S. Appl. No. 18/353,577, filed Jul. 17, 2023, SanDisk Technologies LLC.
U.S. Appl. No. 18/354,246, filed Jul. 18, 2023, SanDisk Technologies LLC.
U.S. Appl. No. 18/354,269, filed Jul. 18, 2023, SanDisk Technologies LLC.
ISR—Notification of Transmittal of The International Search Report and Written Opinion of the International Searching Authority for International Patent Application No. PCT/US2023/083681, mailed Apr. 15, 2024, 7 pages.
IPRP—WO—Notification Concerning Transmittal of International Preliminary Report on Patentability and Written Opinion of the International Searching Authority for International Patent Application No. PCT/US2024/083681, mailed Aug. 28, 2025, 6 pages.
MOIP Office Communication for Korean Patent Application No. 10-2025-7014035, mailed Apr. 25, 2026, 6 pages.

* cited by examiner

THREE-DIMENSIONAL MEMORY DEVICE WITH INTEGRATED CONTACT AND SUPPORT STRUCTURE AND METHOD OF MAKING THE SAME

FIELD

The present disclosure relates generally to the field of semiconductor devices, and particularly to a three-dimensional memory device including integrated contact and support structures and methods for manufacturing the same.

BACKGROUND

Three-dimensional vertical NAND strings having one bit per cell are disclosed in an article by T. Endoh et al., titled "Novel Ultra High Density Memory With A Stacked-Surrounding Gate Transistor (S-SGT) Structured Cell", IEDM Proc. (2001) 33-36.

SUMMARY

According to an aspect of the present disclosure, a memory device is provided, which comprises: a first-tier alternating stack of first insulating layers and first electrically conductive layers located over a substrate; a second-tier alternating stack of second insulating layers and second electrically conductive layers overlying the first-tier alternating stack; memory openings vertically extending through the first-tier alternating stack and the second-tier alternating stack; memory opening fill structures located in the memory openings, wherein each of the memory opening fill structures comprises a respective vertical stack of memory elements; and a first support and contact assembly vertically extending through the first-tier alternating stack and the second-tier alternating stack and comprising: a first contact via structure contacting an annular top surface of a first reference electrically conductive layer that is one of the first electrically conductive layers of the first-tier alternating stack and having a top surface located above a horizontal plane including a topmost surface of the second-tier alternating stack; a first dielectric pillar structure having at least one first laterally-protruding fin portion that protrudes outward at each level of a first subset of the first electrically conductive layers that underlies the first reference electrically conductive layer; and a first-tier dielectric spacer that laterally surrounds the first contact via structure, not in direct contact with the first dielectric pillar structure, and vertically extending through each first electrically conductive layer within a second subset of the first electrically conductive layers that overlies the first reference electrically conductive layer.

According to another aspect of the present disclosure, a memory device comprises a first-tier alternating stack of first insulating layers and first electrically conductive layers located over a substrate; a second-tier alternating stack of second insulating layers and second electrically conductive layers overlying the first-tier alternating stack; memory openings vertically extending through the first-tier alternating stack and the second-tier alternating stack; memory opening fill structures located in the memory openings, wherein each of the memory opening fill structures comprises a respective vertical semiconductor channel and a vertical stack of memory elements; a first support and contact assembly vertically extending through the first-tier alternating stack and the second-tier alternating stack and comprising a first contact via structure contacting an annular top surface of a first reference electrically conductive layer that is one of the first electrically conductive layers of the first-tier alternating stack, and a first dielectric pillar structure underlying the first contact via structure, wherein the first dielectric pillar structure lacks an air gap therein; and a second support and contact assembly vertically extending through the first-tier alternating stack and the second-tier alternating stack and comprising a second contact via structure contacting an annular top surface of a second reference electrically conductive layer that is one of the second electrically conductive layers of the second-tier alternating stack, and a second dielectric pillar structure underlying the second contact via structure, wherein the second dielectric pillar structure includes an air gap therein.

According to another aspect of the present disclosure, a method of forming a memory device comprises: forming a first-tier alternating stack of first insulating layers and first sacrificial material layers over a substrate; forming a first-tier via cavity in the first-tier alternating stack; vertically extending a center region of the first-tier via cavity into an upper portion of the substrate without vertically extending a peripheral region of the first-tier via cavity; filling the first-tier via cavity with a first dielectric layer stack and a first sacrificial via fill material portion; forming a second-tier alternating stack of second insulating layers and second sacrificial material layers over the first-tier alternating stack; forming a second-tier via cavity through each second sacrificial material layer of the second-tier alternating stack; filling the second-tier via cavity with a second dielectric layer stack and a second sacrificial via fill material portion; replacing the first sacrificial material layers and the second sacrificial material layers with electrically conductive layers and second electrically conductive layers, respectively; forming a contact via cavity by removing the second sacrificial via fill material portion and the first sacrificial via fill material portion; physically exposing an annular top surface segment of a reference-level electrically conductive layer that is one of the electrically conductive layers by removing an annular portion of the first dielectric layer stack; and forming a first contact via structure in the contact via cavity.

DETAILED DESCRIPTION

Figure 1A:
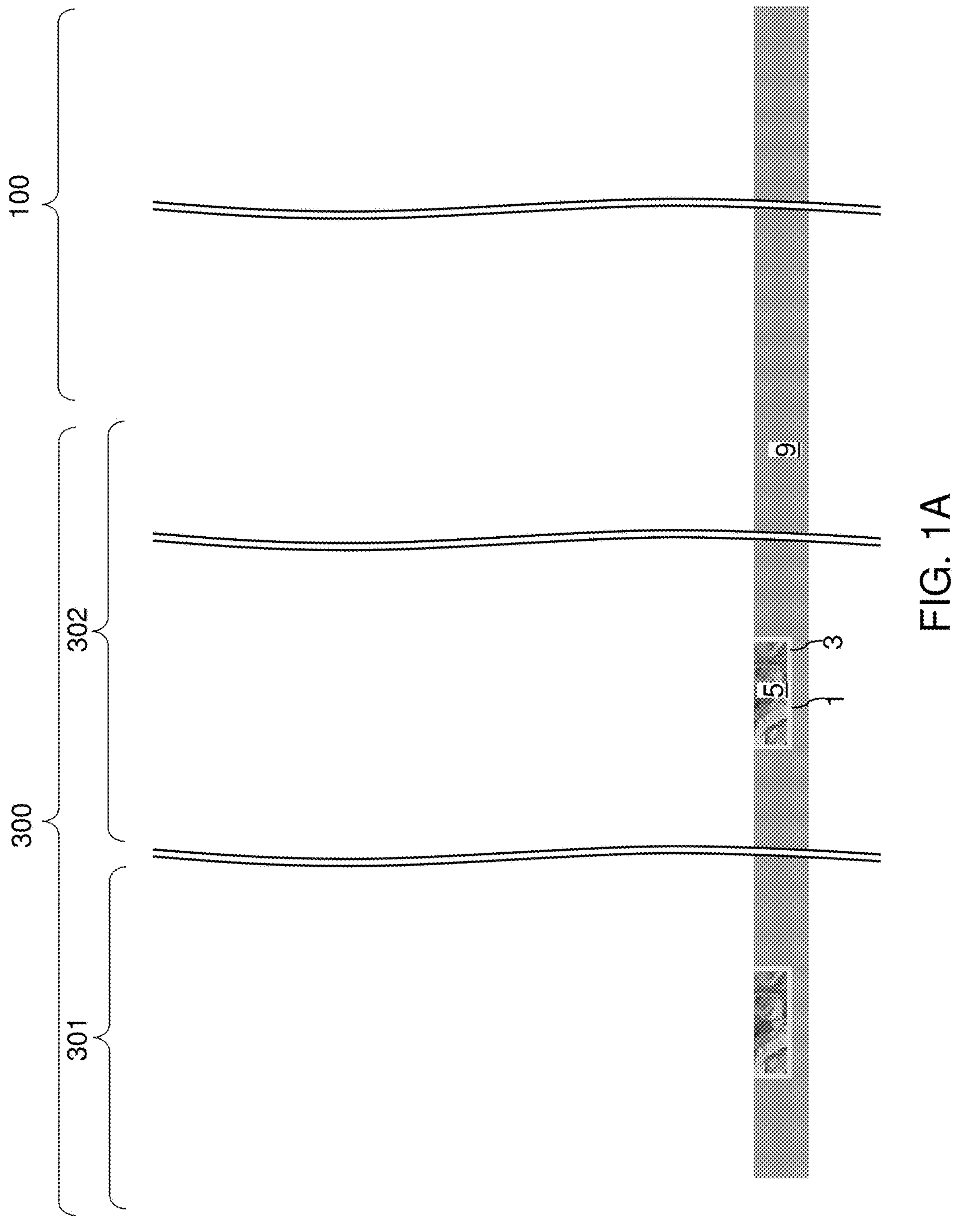
FIG. 1A is a vertical cross-sectional view of an exemplary structure after formation of combinations of a substrate dielectric liner and a sacrificial substrate pad structure according to an embodiment of the present disclosure.

As discussed above, the present disclosure is directed to a three-dimensional memory device including integrated contact and support structures and methods for manufacturing the same, the various aspects of which are described below.

The drawings are not drawn to scale. Multiple instances of an element may be duplicated where a single instance of the element is illustrated, unless absence of duplication of elements is expressly described or clearly indicated otherwise. Ordinals such as "first," "second," and "third" are employed merely to identify similar elements, and different ordinals may be employed across the specification and the claims of the instant disclosure. The term "at least one" element refers to all possibilities including the possibility of a single element and the possibility of multiple elements.

The same reference numerals refer to the same element or similar element. Unless otherwise indicated, elements having the same reference numerals are presumed to have the same composition and the same function. Unless otherwise indicated, a "contact" between elements refers to a direct contact between elements that provides an edge or a surface shared by the elements. If two or more elements are not in direct contact with each other or among one another, the two elements are "disjoined from" each other or "disjoined among" one another. As used herein, an element located "on" a second element can be located on the exterior side of a surface of the second element or on the interior side of the second element. As used herein, an element is located "directly on" a second element if there exist a physical contact between a surface of the element and a surface of the second element. As used herein, an element is "electrically connected to" a second element if there exists a conductive path consisting of at least one conductive material between the element and the second element. As used herein, a "prototype" structure or an "in-process" structure refers to a transient structure that is subsequently modified in the shape or composition of at least one component therein.

As used herein, a "layer" refers to a material portion including a region having a thickness. A layer may extend over the entirety of an underlying or overlying structure, or may have an extent less than the extent of an underlying or overlying structure. Further, a layer may be a region of a homogeneous or inhomogeneous continuous structure that has a thickness less than the thickness of the continuous structure. For example, a layer may be located between any pair of horizontal planes between, or at, a top surface and a bottom surface of the continuous structure. A layer may extend horizontally, vertically, and/or along a tapered surface. A substrate may be a layer, may include one or more layers therein, or may have one or more layer thereupon, thereabove, and/or therebelow.

Generally, a semiconductor die, or a semiconductor package, can include a memory chip. Each semiconductor package contains one or more dies (for example one, two, or four). The die is the smallest unit that can independently execute commands or report status. Each die contains one or more planes (typically one or two). Identical, concurrent operations can take place on each plane, although with some restrictions. Each plane contains a number of blocks, which are the smallest unit that can be erased by in a single erase operation. Each block contains a number of pages, which are the smallest unit that can be programmed, i.e., a smallest unit on which a read operation can be performed.

Figure 1B:
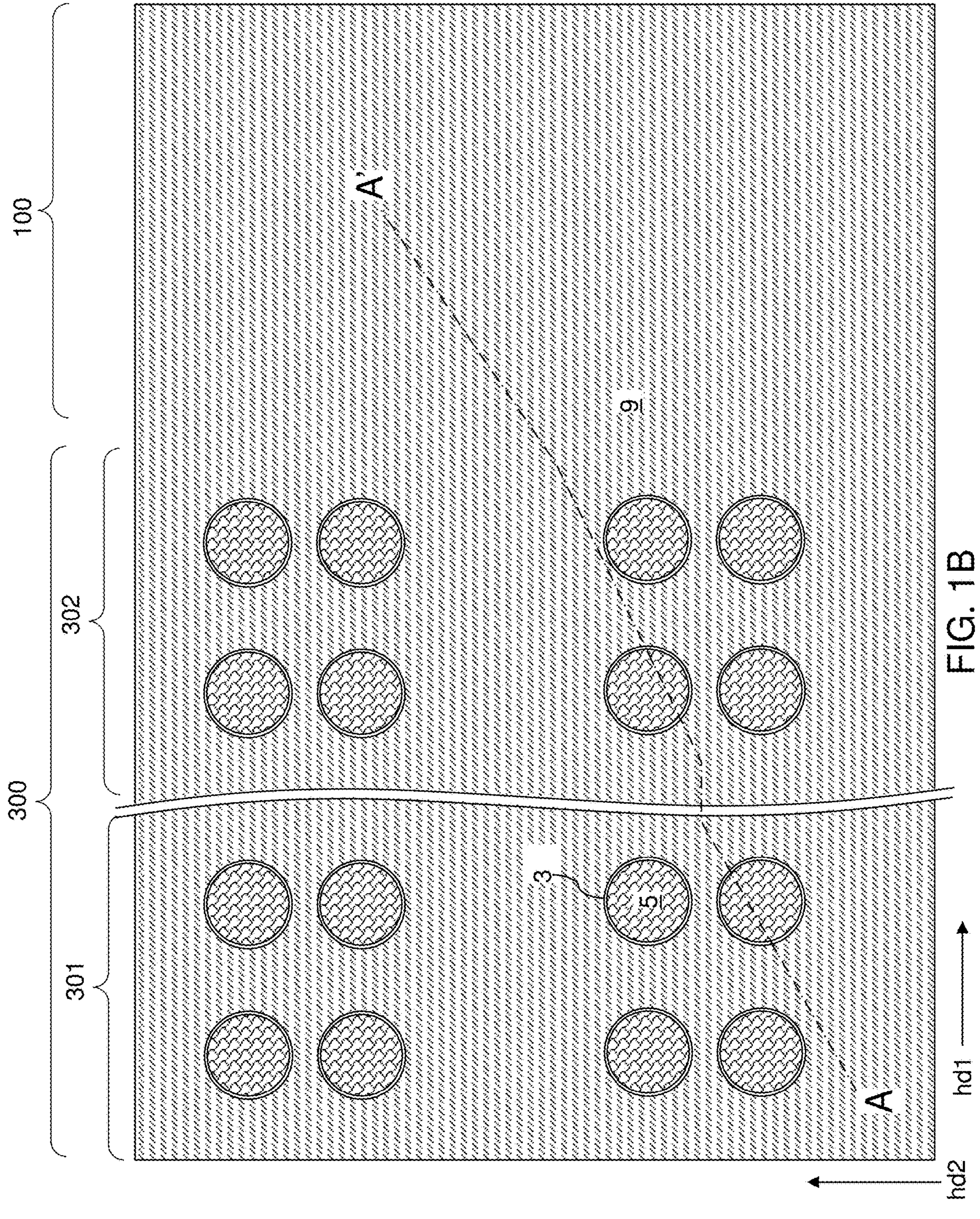
FIG. 1B is a top-down view of the exemplary structure of FIG. 1A. The hinged vertical plane A-A' is the plane of the vertical cross-sectional view of FIG. 1A.

Referring to FIGS. 1A and 1B, an exemplary structure according to an embodiment of the present disclosure is illustrated, which includes a substrate 9 containing a semiconductor material layer at least at an upper portion thereof. The semiconductor material layer may comprise a single crystalline semiconductor material layer or a polycrystalline semiconductor material layer. The substrate 9 may or may not comprise additional layers (such as dielectric material layers embedding metal interconnect structures) and/or semiconductor devices (such as a peripheral circuit for controlling operation of a three-dimensional memory array to be subsequently formed) underneath the semiconductor material layer. In one embodiment, the substrate 9 may comprise a commercially available semiconductor wafer such as a single crystalline silicon wafer. The semiconductor material layer may comprise an upper portion of the silicon wafer, a doped well in the silicon wafer, an epitaxial silicon layer on the silicon wafer, etc.

An array of substrate recesses 1 may be formed in the upper portion of the substrate in a contact region 300. The contact region 300 may comprise a first contact region 301 in which first contact via structures providing electrical connections to first electrically conductive layers are subsequently formed, and a second contact region 302 in which second contact via structures providing electrical connections to second electrically conductive layers are subsequently formed. A memory array region 100 can be provided adjacent to the contact region. In one embodiment, the substrate recesses 1 may be arranged as rows that laterally extend along a first horizontal direction (e.g., word line direction) hd1, which is the perpendicular to a boundary between the memory array region 100 and the contact region 300. The rows of the substrate recesses 1 may be laterally spaced apart from each other along a second horizontal direction (e.g., bit line direction) hd2, which can be perpendicular to the first horizontal direction hd1 and is parallel to the boundary between the memory array region 100 and the contact region 300.

The depth of the substrate recesses 1 may be in a range from 50 nm to 500 nm, and the lateral dimensions (such as a diameter) of the recesses may be in a range from 200 nm to 2,000 nm, although lesser and greater dimensions may also be employed for the depth and the lateral dimensions. A substrate dielectric liner layer including a dielectric material (such as silicon oxide) can be deposited in the substrate recesses 1, and a sacrificial fill material (which is also referred to as a sacrificial substrate fill material or a substrate pad fill material) can be deposited in remaining volumes of the substrate recesses. The sacrificial fill material may comprise a carbon material (e.g., amorphous carbon or diamond-like carbon) or a metal (e.g., tungsten). Excess portions of the sacrificial fill material and the substrate dielectric liner layer can be removed from above the horizontal plane including a top surface of the substrate 9 by performing a planarization process such as a chemical mechanical planarization process. Each remaining portion of the sacrificial fill material constitutes a sacrificial substrate pad 5. Each remaining portion of the substrate dielectric liner layer constitutes a substrate dielectric liner 3. Each contiguous combination of a substrate dielectric liner 3 and a sacrificial substrate pad 5 fills a respective substrate recess 1.

Figure 2A:
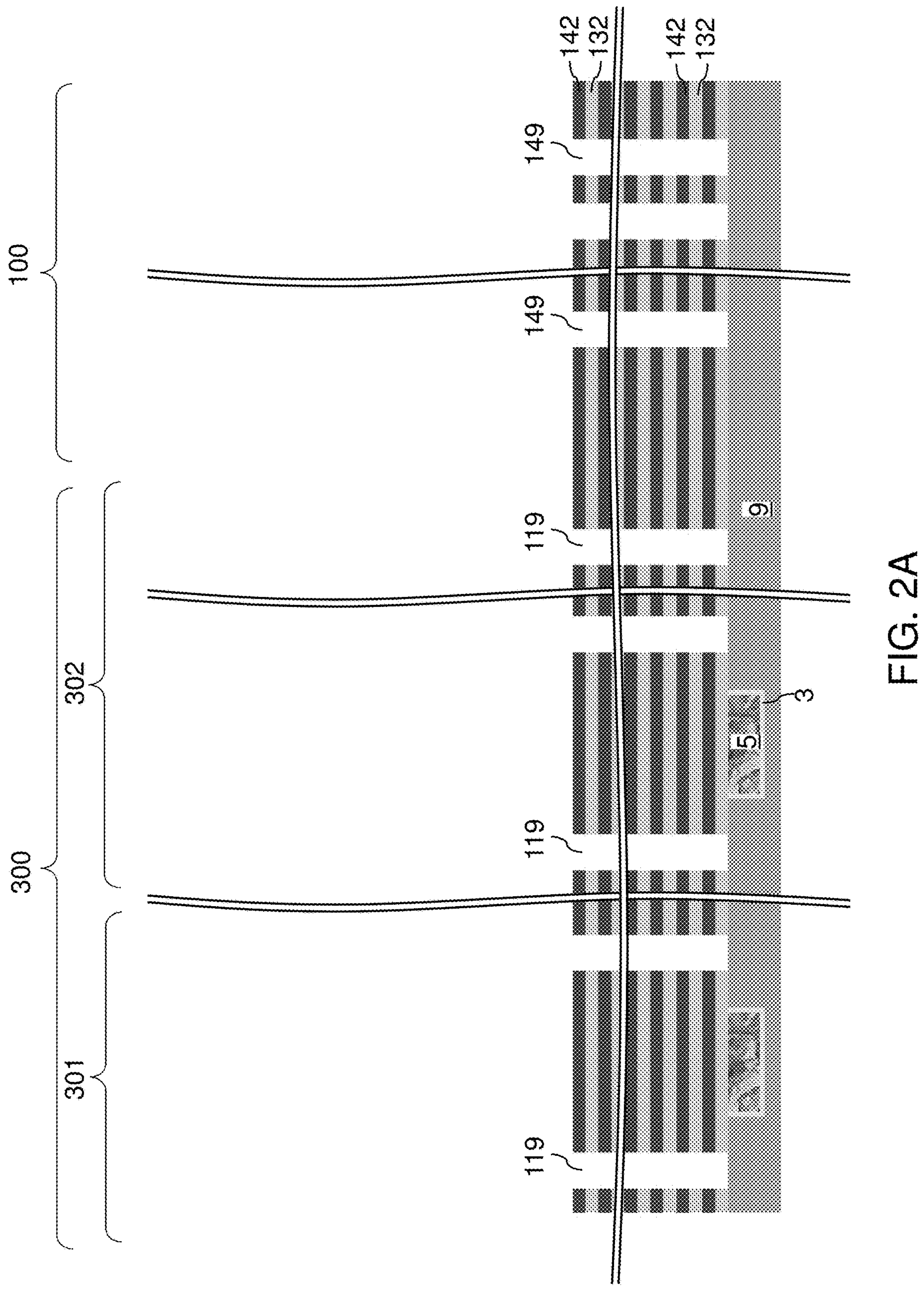
FIG. 2A is a vertical cross-sectional view of the exemplary structure after formation of a first-tier alternating stack of first insulating layers and first sacrificial material layers, first-tier memory openings, and first-tier support openings according to an embodiment of the present disclosure.
Figure 2B:
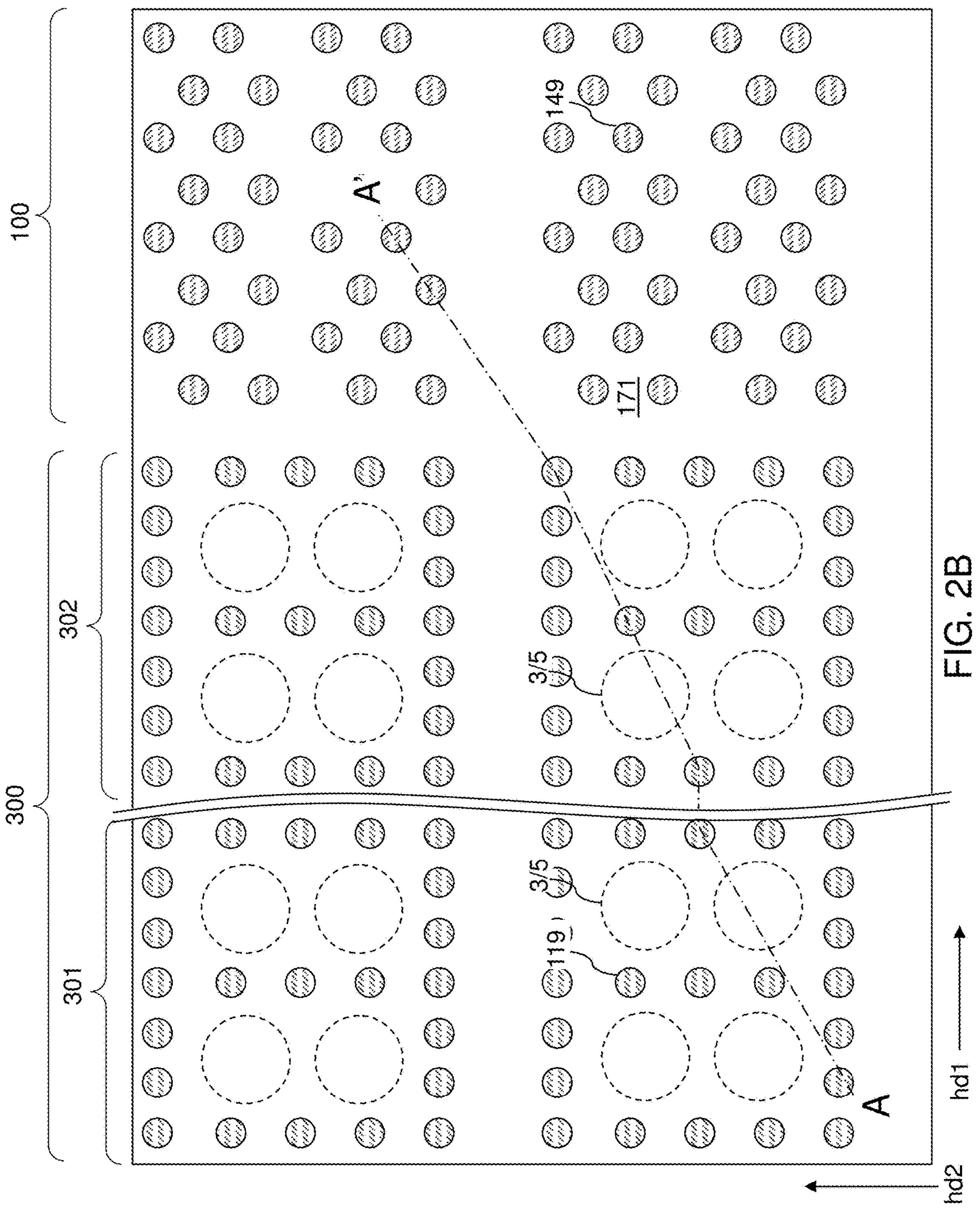
FIG. 2B is a partial see-through top-down view of the exemplary structure of FIG. 2A. The hinged vertical plane A-A' is the plane of the vertical cross-sectional view of FIG. 2A.

Referring to FIGS. 2A and 2B, a first-tier alternating stack of first insulating layers 132 and first sacrificial material layers 142 can be formed over the substrate 9. The first insulating layers 132 comprise an insulating material such as undoped silicate glass or a doped silicate glass, and the first sacrificial material layers 142 comprise a sacrificial material such as silicon nitride or a silicon-germanium alloy. The first-tier alternating stack (132, 142) may comprise multiple repetitions of a unit layer stack including a first insulating layer 132 and a first sacrificial material layer 142. The total number of repetitions of the unit layer stack within the first-tier alternating stack (132, 142) may be, for example, in a range from 8 to 1,024, such as from 32 to 256, although lesser and greater number of repetitions may also be employed. Each of the first insulating layers 132 may have a thickness in a range from 20 nm to 100 nm, such as from 30 nm to 60 nm, although lesser and greater thicknesses may also be employed. Each of the first sacrificial material layers 142 may have a thickness in a range from 20 nm to 100 nm, such as from 30 nm to 60 nm, although lesser and greater thicknesses may also be employed.

An etch mask layer (not shown) can be formed over the first-tier alternating stack (132, 142), and can be lithographically patterned to form various openings therein. An anisotropic etch process can be performed to transfer the pattern of the openings in the etch mask layer through the first-tier alternating stack (132, 142). First-tier openings (149, 119) can be formed through the first-tier alternating stack (132, 142). The first-tier openings (149, 119) may comprise first-tier memory openings 149 that vertically extend through each layer within the first-tier alternating stack (132, 142) in the memory array region 100, and may further comprise first-tier support openings 119 that are formed through the first-tier alternating stack (132, 142) in the contact region 300 and are subsequently employed to form support pillar structures therein. In one embodiment, the first-tier memory openings 149 may be formed in rows that laterally extend along the first horizontal direction hd1. The rows of first-tier memory openings 149 may be laterally spaced apart along the second horizontal direction hd1 that is perpendicular to the first horizontal direction hd1. In one embodiment, the first-tier memory openings 149 may be formed as periodic two-dimensional arrays (such as hexagonal periodic two-dimensional arrays). The etch mask layer can be subsequently removed.

Figure 3:
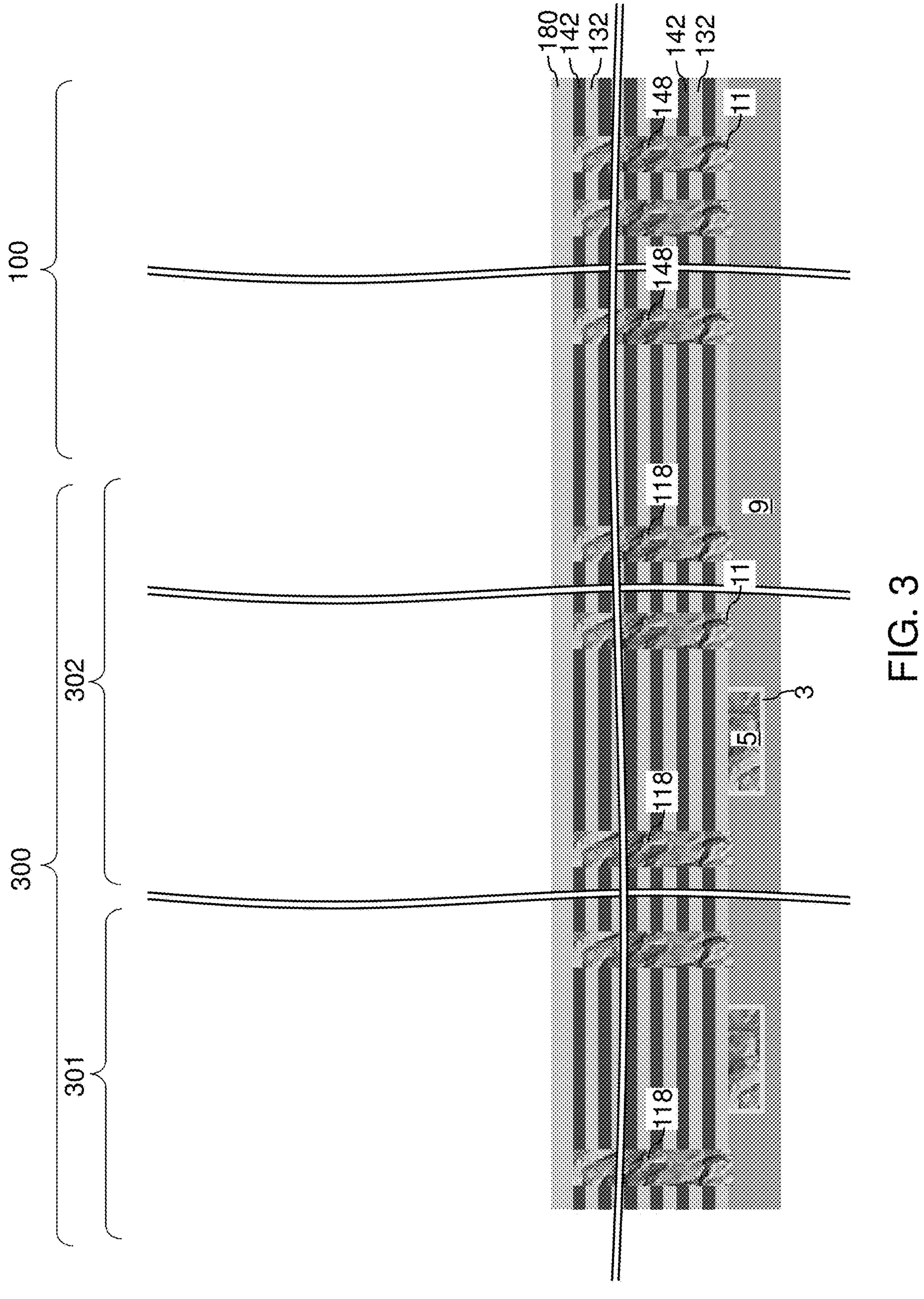
FIG. 3 is a vertical cross-sectional view of the exemplary structure after formation of first-tier sacrificial opening fill structures and an inter-tier insulating layer according to an embodiment of the present disclosure.

Referring to FIG. 3, pedestal channel portions 11 can optionally be formed at the bottom of each of the first-tier openings (149, 119). The pedestal channel portions 11 may comprise a semiconductor material that can be deposited by a selective semiconductor material deposition process which grows a semiconductor material from physically exposed surfaces of the substrate 9. A selective semiconductor deposition process such as a selective epitaxy process may be employed to form the pedestal channel portions 11. The pedestal channel portion 11 may comprise single crystalline silicon in epitaxial alignment with a single crystalline semiconductor material in the substrate 9, or may comprise a polycrystalline semiconductor material (e.g., polysilicon). In one embodiment the top surfaces of the pedestal channel portions 11 may be formed below an interface between the bottommost first insulating layer 132 and the bottommost first sacrificial material layer 142.

A first-tier sacrificial fill material may be deposited in the remaining unfilled volumes of the first-tier openings (149, 119). Excess portions of the first-tier sacrificial fill material can be removed from above the horizontal plane including the top surface of the topmost first insulating layer 132 by performing a planarization process. Each remaining portion of the first-tier sacrificial fill material constitutes a first-tier sacrificial opening fill structure (148, 118). The first-tier sacrificial opening fill structure (148, 118) comprises first-tier sacrificial memory opening fill structures 148 that are formed in the first-tier memory openings 149, and first-tier sacrificial support opening fill structures 118 that are formed in the first-tier support openings 119. The first-tier sacrificial fill material may comprise amorphous carbon, diamond-like carbon, a semiconductor material, organosilicate glass, a polymer material, or any other material that can be subsequently removed selective to materials of the first-tier alternating stack (132, 142) and the pedestal channel portions 11.

An insulating layer may be optionally formed over the first-tier alternating stack (132, 142). The insulating layer, if formed, is herein referred to as an inter-tier insulating layer 180. The inter-tier insulating layer 180 may have the same material composition as and about the same thickness range as the first insulating layers 132.

Figure 4A:
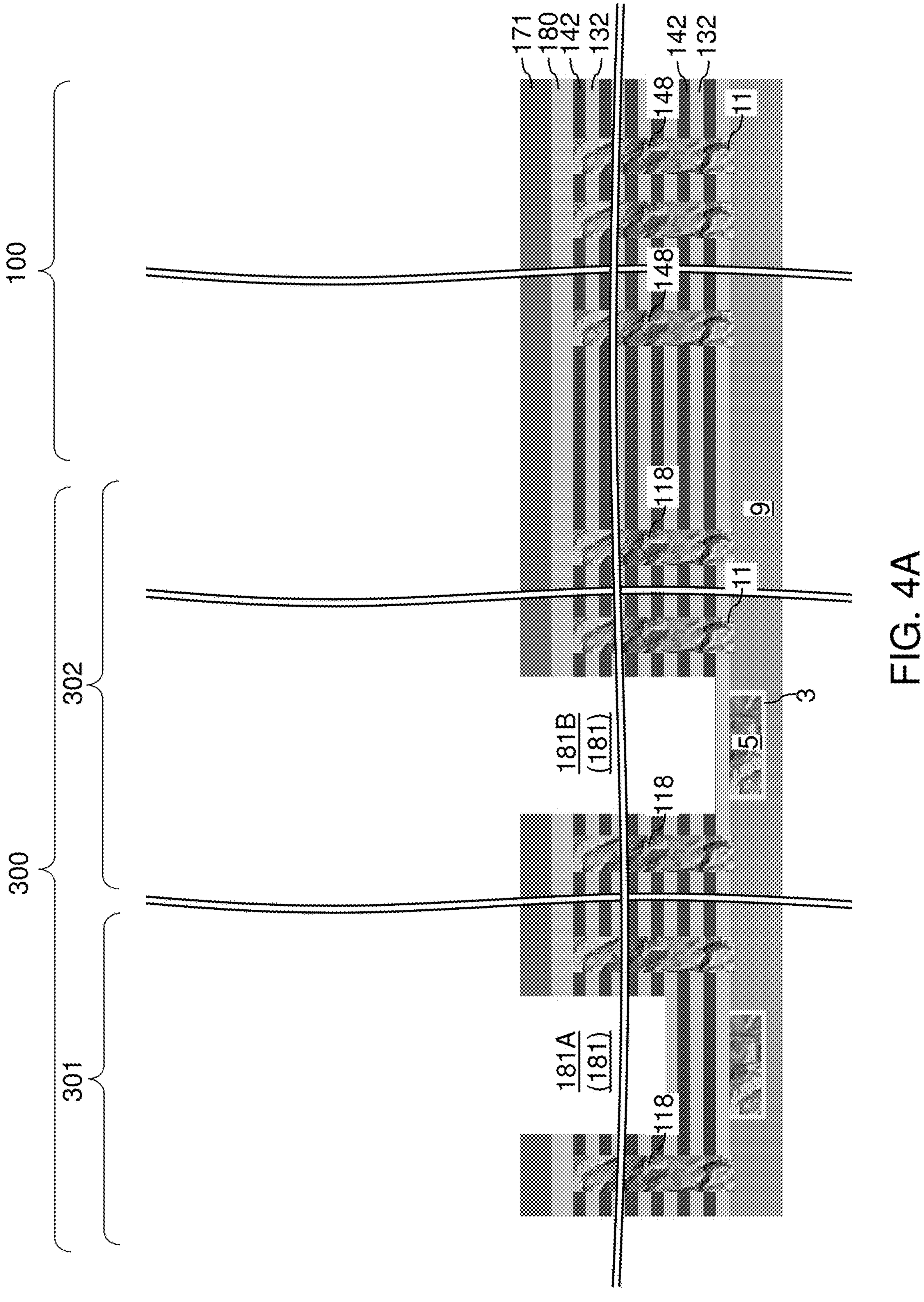
FIG. 4A is a vertical cross-sectional view of the exemplary structure after formation a first patterned hard mask layer and first-tier contact via cavities according to an embodiment of the present disclosure.
Figure 4B:
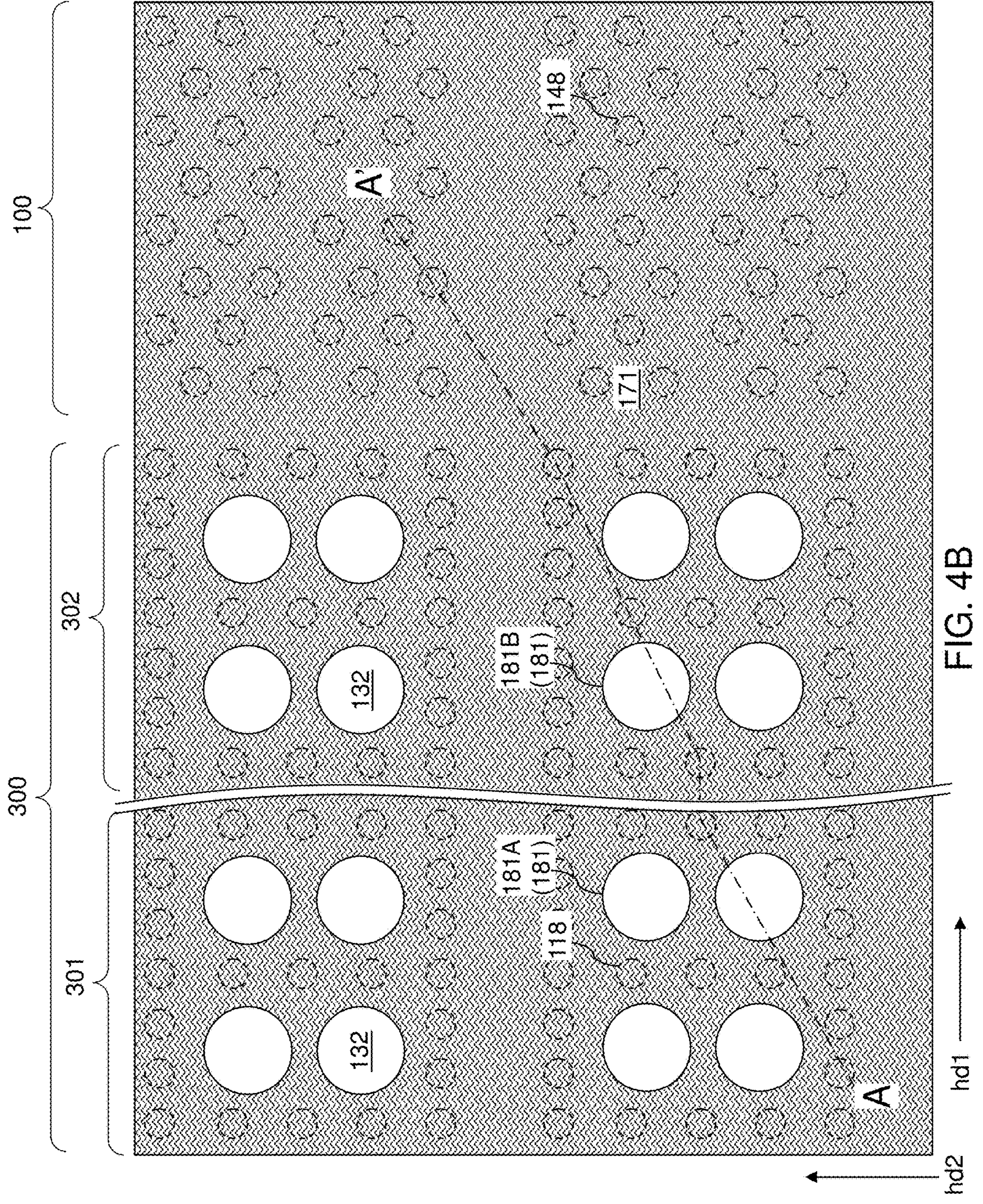
FIG. 4B is a partial see-through top-down view of the exemplary structure of FIG. 4A. The hinged vertical plane A-A' is the plane of the vertical cross-sectional view of FIG. 4A.

Referring to FIGS. 4A and 4B, a first patterned hard mask layer 171 may be formed above the inter-tier insulating layer 180 by depositing and patterning a hard mask material. The first patterned hard mask layer 171 comprises a material that can function as an etch mask material during subsequent anisotropic etch processes. In one embodiment, the first patterned hard mask layer 171 may comprise a semiconductor material, such as amorphous silicon, and may have a thickness in a range from 50 nm to 500 nm, although lesser and grater thicknesses may be employed. The hard mask material may be patterned by applying and lithographically patterning a photoresist material over the hard mask material, and by transferring the pattern in the photoresist material through the hard mask material. In one embodiment, the pattern of the openings in the first patterned hard mask layer 171 may be the same as the pattern of the substrate recesses 1 (in which the substrate dielectric liners 3 and a sacrificial substrate pads 5 are present), or may be modified from the pattern of the substrate recesses 1 such that each opening in the first patterned hard mask layer 171 has at least partial overlap with the pattern of a respective substrate recess 1. In some embodiments, each opening in the first patterned hard mask layer 171 may have a periphery that is located on or outside a periphery of a respective underlying substrate recess 1 in a top-down view.

First-tier via cavities 181 are formed through a respective subset of layers within the first-tier alternating stack (132, 142). Each of the first-tier via cavities 181 can vertically extend through the inter-tier dielectric layer 170 and through a respective subset of the first sacrificial material layers 142 and the first insulating layers 132 such that a top surface of a selected first insulating layer 132 is physically exposed at the bottom of each first-tier via cavity 181. In one embodiment, the first-tier via cavities 181 may have different depths from each other, and each first insulating layer 132 an be physically exposed to a respective overlying first-tier via cavity 181.

The first-tier via cavities 181 having different depths may be formed employing a plurality of masked anisotropic etch processes. In an illustrative example, the openings in the first patterned hard mask layer 171 may have the pattern of all of the first-tier via cavities 181 to be subsequently formed. An anisotropic etch process may be performed to transfer the pattern of the openings in the first patterned hard mask layer 171 through the inter-tier insulating layer 180

Subsequently, multiple iterations of a combination of a respective masking process and a respective anisotropic etch process may be performed to etch through a respective subset of first sacrificial material layers 142 and a respective subset of the first insulating layers 132. Each masking process forms a respective patterned photoresist layer (not shown) that masks a respective subset of the openings in the first patterned hard mask layer 171 without masking a respective complementary subset of the openings. Each anisotropic etch process etches a respective number of first sacrificial material layers 142 and a respective number of insulating layers 32 underneath each opening in the first pattered hard mask layer 171 that is not masked by a respective patterned photoresist layer. In one embodiment, the number of etched first sacrificial material layers 142 and etched first insulating layers 132 underneath unmasked openings in the first patterned hard mask layer 171 may be a non-negative integer power of 2, i.e., 1, 2, 4, 8, 16, 32, 64, etc. By employing a combination of various masking patterns for the patterned photoresist layers, the total depths of the first-tier via cavities 181 can be varied to enable physical exposure of the top surfaces of first insulating layers 132 at each level. The first patterned hard mask layer 171 can be subsequently removed.

The first-tier via cavities 181 may comprise first-type first-tier via cavities 181A that are formed in the first contact region 301 and second-type first-tier via cavities 181B that are formed in the second contact region 302. In one embodiment, the first-type first-tier via cavities 181A have various depths such that each of the first insulating layers 132 and the inter-tier insulating layer 180 has a top surface segment that is physically exposed to a respective overlying first-type first-tier via cavity 181A. In one embodiment, each of the second-type first-tier via cavities 181B may extend through each layer within the first-tier alternating stack (132, 142) except the bottommost first insulating layer 132. In this case, each of the second-type first-tier via cavities 181B may vertically extend through each first sacrificial material layer 142 in the first-tier alternating stack (132, 142). The lateral dimensions (such as diameters) of the first-tier via cavities 181 may be in a range from 200 nm to 3,000 nm, although lesser and greater lateral dimensions may also be employed.

Figure 5:
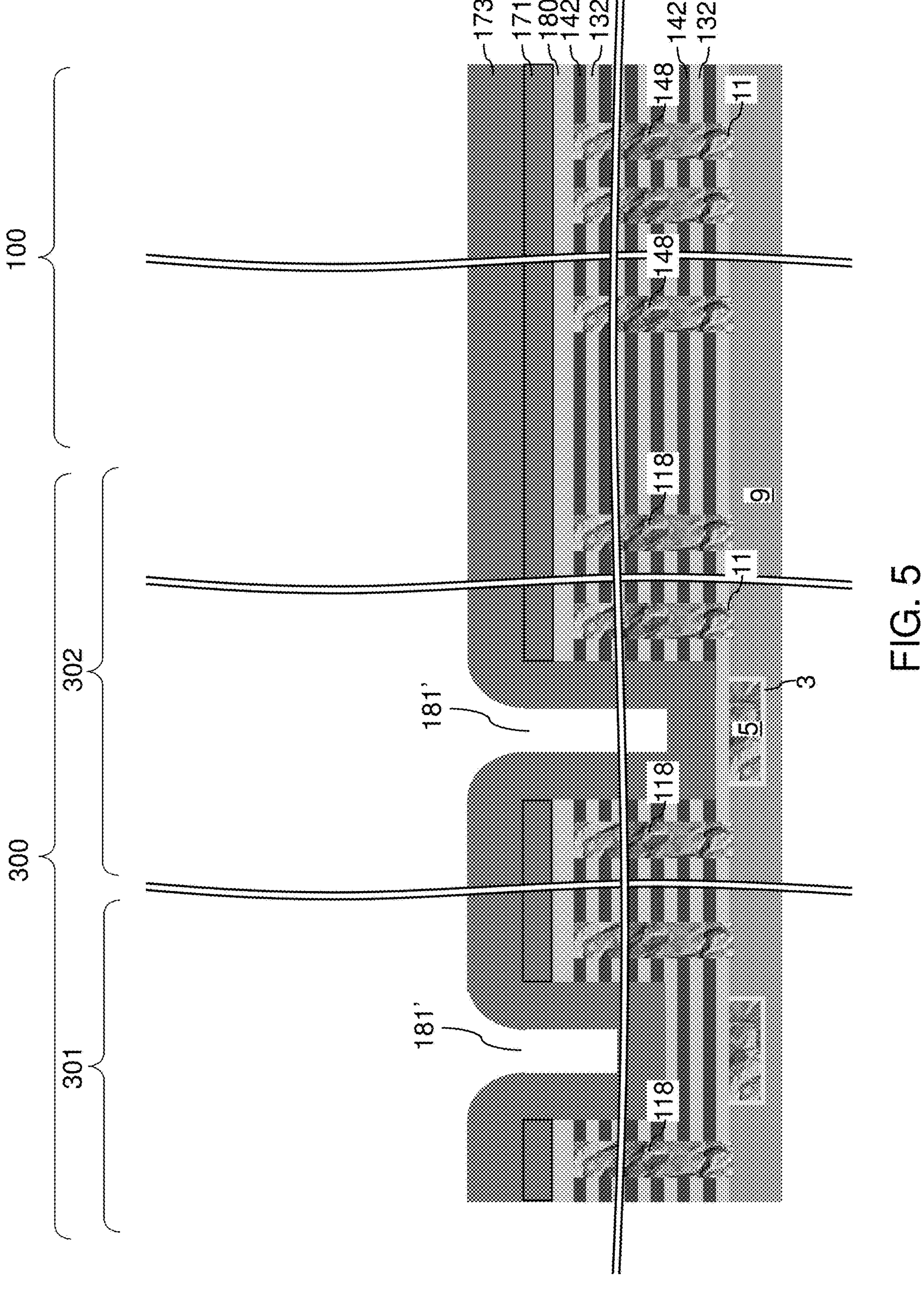
FIG. 5 is a vertical cross-sectional view of the exemplary structure after formation of a first sacrificial spacer material layer according to an embodiment of the present disclosure.

Referring to FIG. 5, a first sacrificial spacer material layer 173L can be deposited over the first patterned hard mask layer 171 and in peripheral portions of the first-tier via cavities 181. The first sacrificial spacer material layer 173L comprises a material that may be subsequently employed as an etch mask material for the materials of the first-tier alternating stack (132, 142). In one embodiment, the first sacrificial spacer material layer 173L comprises a semiconductor material, such as polysilicon or amorphous silicon. The thickness of the first sacrificial spacer material layers 173L may be in a range from 50 nm to 1,000 nm, although lesser and greater thicknesses may also be employed. A void 181' can be formed within each volume of the first-tier via cavities 181 that is not filled with the first sacrificial spacer material layer 173L.

Figure 6:
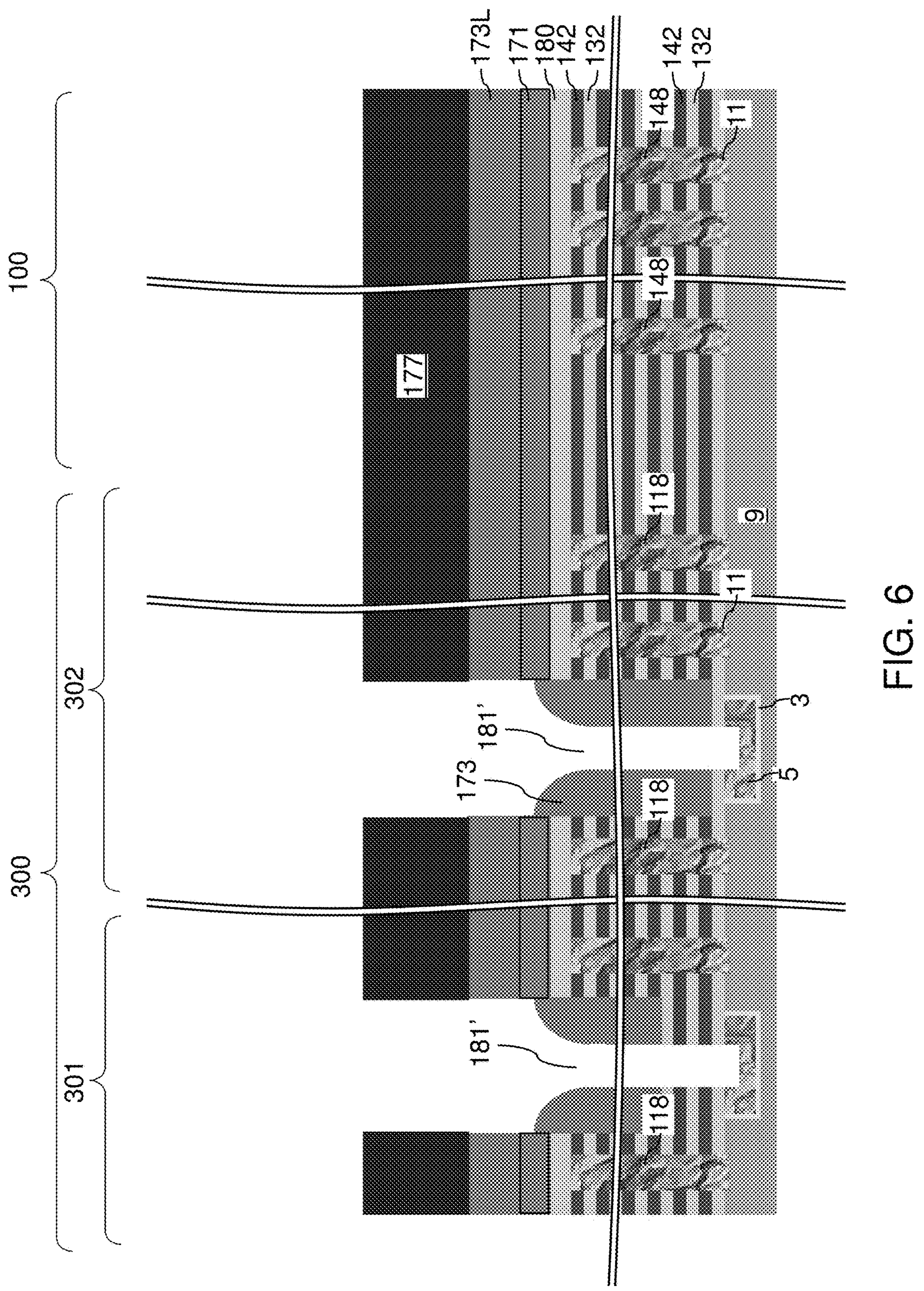
FIG. 6 is a vertical cross-sectional view of the exemplary structure after formation of a first patterned photoresist layer and after performing a first anisotropic etch process that vertically extends center portions of the first-tier contact via cavities according to an embodiment of the present disclosure.

Referring to FIG. 6, a first patterned photoresist layer 177 can be formed over the first sacrificial spacer material layer 173L. Generally, the first patterned photoresist layer 177 may have openings in the areas of the first-tier via cavities 181. For example, the openings in the first patterned photoresist layer 177 may be located at, or may be located within, a periphery of a respective one of the first-tier cavities 181 in a plan view, such as a top-down view.

A first anisotropic etch process can be performed to vertically extend center portions of the first-tier contact via cavities 181 that are laterally surrounded by vertically-extending portions of the first sacrificial spacer material layer 173L. The first anisotropic etch process may include a first anisotropic etch step that etches the material of the first sacrificial spacer material layer 173L. Portions of the first sacrificial spacer material layer 173L that are not masked by the first patterned photoresist layer 177 are vertically recessed uniformly. Each portion of the first sacrificial spacer material layer 173L that underlies a respective void 181' is etched through, and a top surface segment of a respective underlying first insulating layer 132 (or the inter-tier insulating layer 180) is physically exposed underneath the respective void 181'. A tubular portion of the first sacrificial spacer material layer 173L remains in the peripheral region of each first-tier via cavity 181 while a center portion of the first sacrificial spacer material layer 173L in each first-tier via cavity 181 is etched through during the first anisotropic etch step of the first anisotropic etch process. Each tubular portion of the first sacrificial spacer material layer 173L that remains in a respective first-tier cavity 181 constitutes a first sacrificial spacer 173.

The first anisotropic etch process may include a second anisotropic etch step that etches the materials of the first insulating layers 132 and the first sacrificial material layers 142 selective to the materials of the first sacrificial spacers 173 and the sacrificial substrate pads 5. The second anisotropic etch step of the first anisotropic etch process etches portions of the first-tier alternating stack (132, 142) that underlie the first-tier via cavities 181 and are not covered by the tubular portions of the first sacrificial spacer material layer 173L, i.e., the first sacrificial spacers 173. Each center region of the first-tier via cavities 181 can be vertically extended into a respective sacrificial substrate pad 5 that fills a respective substrate recess while the peripheral region of the first-tier via cavities 181 occupied by the first sacrificial spacers 173 are not vertically extended.

Figure 7:
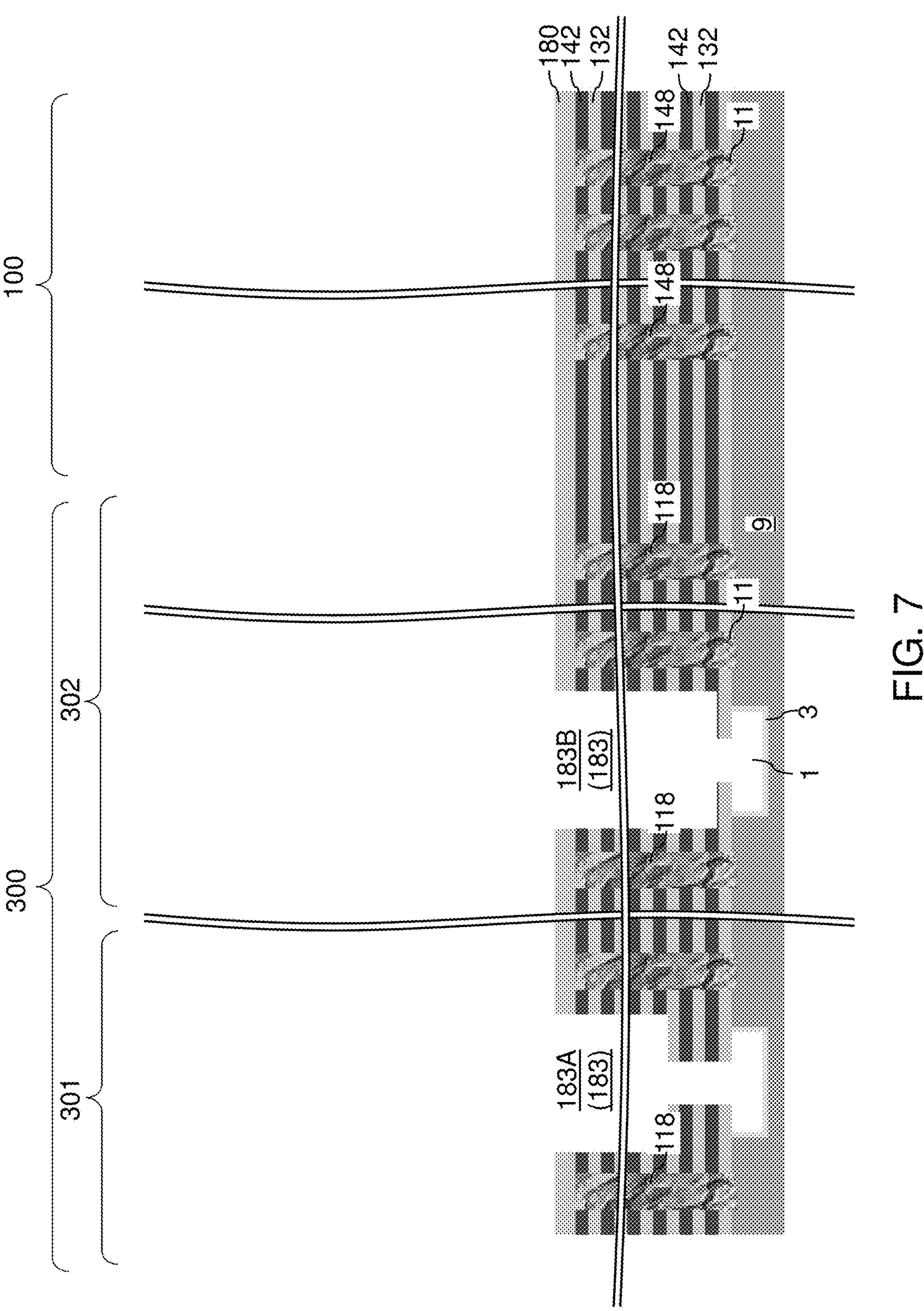
FIG. 7 is a vertical cross-sectional view of the exemplary structure after removal of remaining portions of the first sacrificial spacer material layer and the first patterned hard mask layer and removal of the sacrificial substrate pad structures according to an embodiment of the present disclosure.

Referring to FIG. 7, the first patterned photoresist layer 177, the first sacrificial spacer material layer 173L, the first sacrificial spacers 173, and the first patterned hard mask layer 171, and the sacrificial substrate pads 5 can be subsequently removed. For example, the first patterned photoresist layer 177 can be removed by performing an ashing process. In case the first sacrificial spacer material layer 173L, the first sacrificial spacers 173, and the first patterned hard mask layer 171, and the sacrificial substrate pads 5 comprise semiconductor materials, such as polysilicon or amorphous silicon, a wet etch process employing tetramethylammonium hydroxide (TMAH) or trimethyl-2 hydroxyethyl ammonium hydroxide ("hot TMY") may be performed to remove the first sacrificial spacer material layer 173L, the first sacrificial spacers 173, and the first patterned hard mask layer 171, and the sacrificial substrate pads 5. If the sacrificial substrate pads 5 comprise carbon, then they may be removed by ashing. Stepped cavities having a wider upper portion and a narrower lower portion can be formed.

After the above removal steps, the first-tier via cavities 181 vertically extend through the entirety of the first-tier alternating stack (132, 142) and are referred to as first through-tier cavities 183. The first through-tier cavities 183 extend into an upper portion of the substrate 9. Each of the first through-tier cavities 183 includes the entire volume of a respective one of the first-tier via cavities 181 as formed at the processing steps of FIGS. 4A and 4B. The first through-tier cavities 183 further comprise voids that are formed by the second anisotropic etch process and by removal of the first sacrificial spacers 173 and the sacrificial substrate pads 5. The first through-tier cavities 183 can include first-type through-tier cavities 183A that are formed in the first contact region 301 and second-type through-tier cavities 183B that are formed in the second contact region 302.

Figure 8:
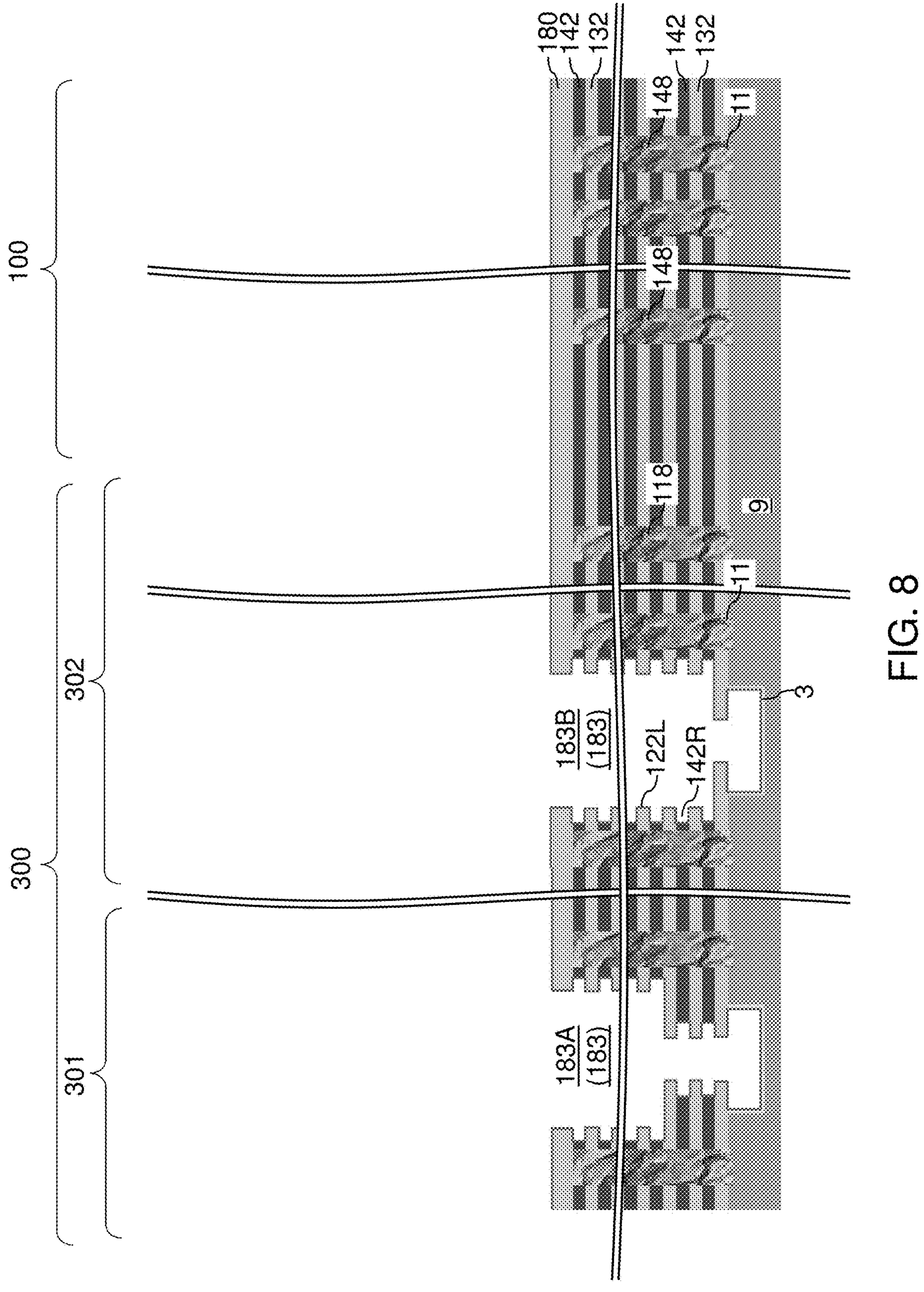
FIG. 8 is a vertical cross-sectional view of the exemplary structure after formation of a first continuous dielectric liner according to an embodiment of the present disclosure.

Referring to FIG. 8, a selective isotropic etch process can be performed to laterally recess the first sacrificial material layers 142 selective to the materials of the first insulating layers 132. For example, if the first sacrificial material layers 142 comprise silicon nitride, a wet etch process employing hot phosphoric acid can be performed to laterally recess the first sacrificial material layers 142. Generally, sidewalls of the first sacrificial material layers 142 may be laterally recessed relative to sidewalls of the first insulating layers 132 around the first through-tier cavities 183. Each of the first through-tier cavities 183 may comprise a respective set of lateral protrusions at each level of the first sacrificial material layers 142 (i.e., a lateral recess 142R is formed each level of the first sacrificial material layers 142). A first continuous dielectric liner layer 122L can be deposited in the first through-tier cavities 183, including in the lateral recesses 142R by a conformal deposition process. The first continuous dielectric liner layer 122L comprises a dielectric material, such as silicon oxide, and may have a thickness in a range from 3 nm to 10 nm, although lesser and greater thicknesses may also be employed. Alternatively, the silicon oxide first continuous dielectric liner layer 122L can be formed by radical oxidation (e.g., in-situ steam generation (ISSG)) of exposed silicon nitride sacrificial material layers 142.

Figure 9:
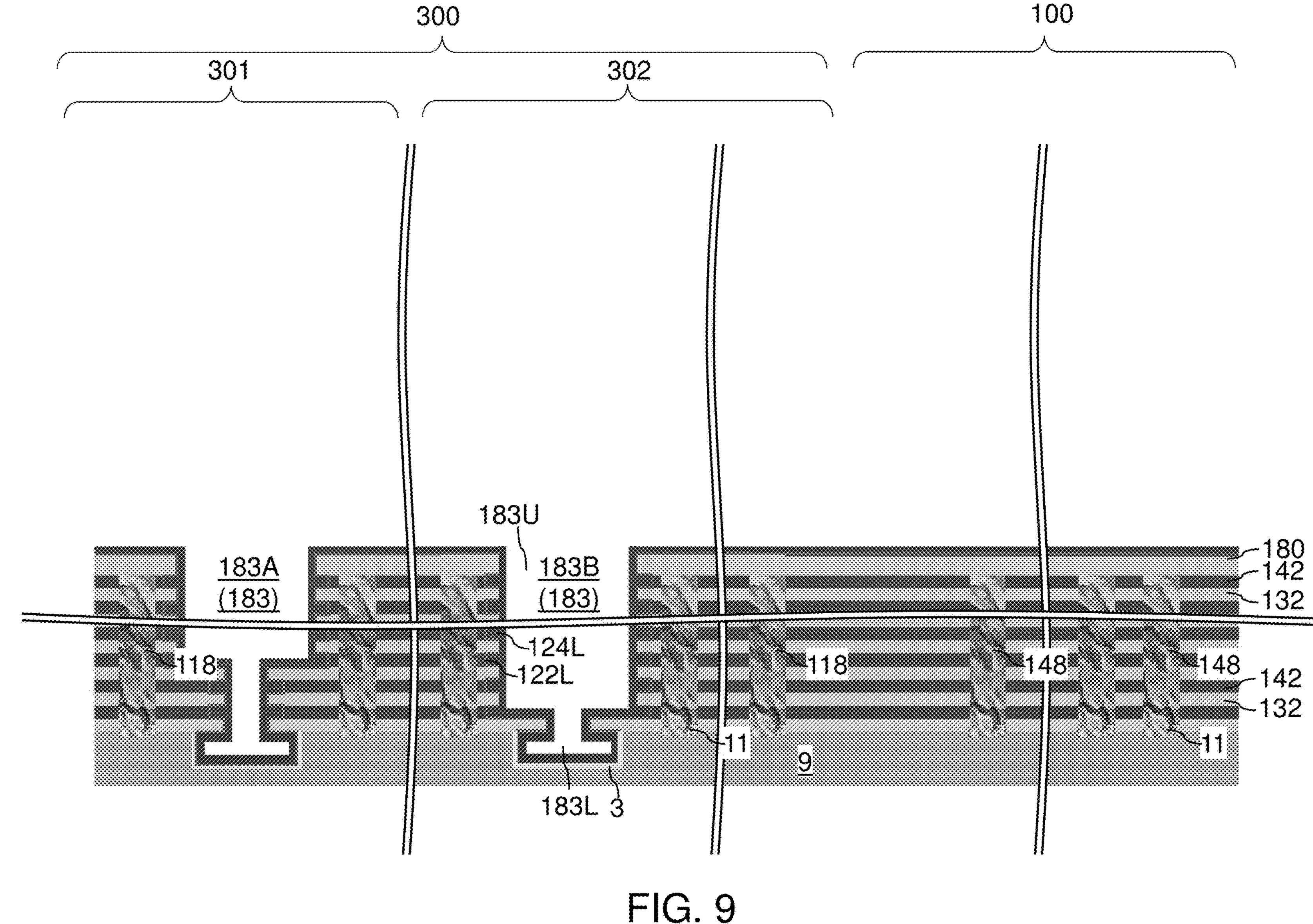
FIG. 9 is a vertical cross-sectional view of the exemplary structure after formation of a first continuous dielectric material layer according to an embodiment of the present disclosure.

Referring to FIG. 9, a first continuous dielectric material layer 124L can be conformally deposited to fill remaining volumes of the lateral recesses 142R in the first sacrificial material layers 142 around the first through-tier cavities 183. The first continuous dielectric material layer 124L comprises a dielectric material, such as silicon nitride or silicon carbonitride, which is different from the material of the first continuous dielectric liner layer 122L. The thickness of the first continuous dielectric material layer 124L may be in a range from 30 nm to 300 nm, although lesser and greater thicknesses may also be employed. Each remaining volume of the first through-tier cavities 183 includes a narrower lower portion 183L below the bottommost first insulating layer 132 and a wider upper portion 183U above the bottommost first insulating layer 132.

Figure 10:
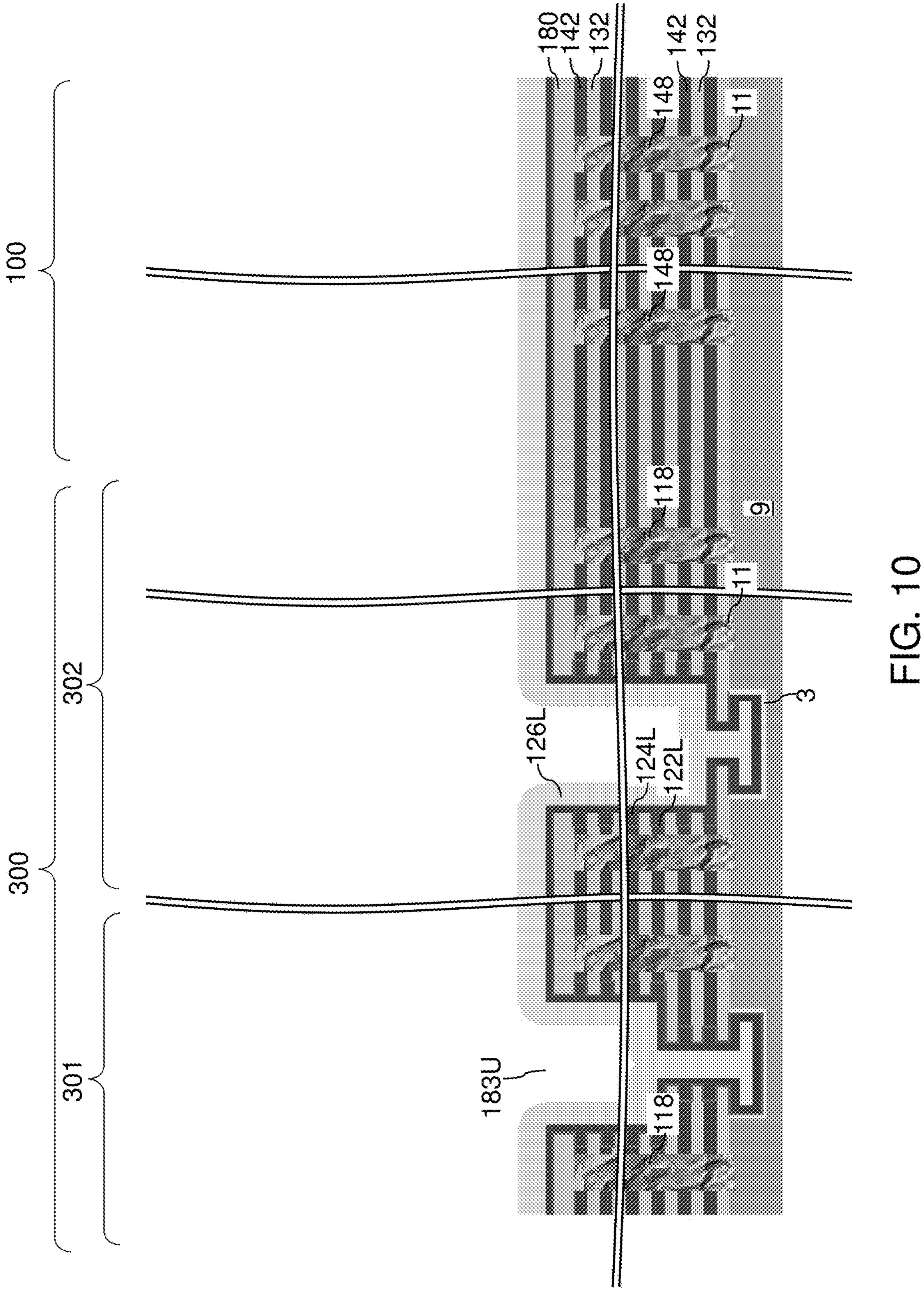
FIG. 10 is a vertical cross-sectional view of the exemplary structure after formation of a first dielectric fill material layer according to an embodiment of the present disclosure.

Referring to FIG. 10, a first dielectric fill material layer 126L can be deposited to fill a narrower lower portion 183L of each of the first through-tier cavities 183 without completely filling a wider upper portion 183U of each of the first through-tier cavities 183. The first dielectric fill material layer 126L comprises a dielectric fill material such as silicon oxide.

Figure 11:
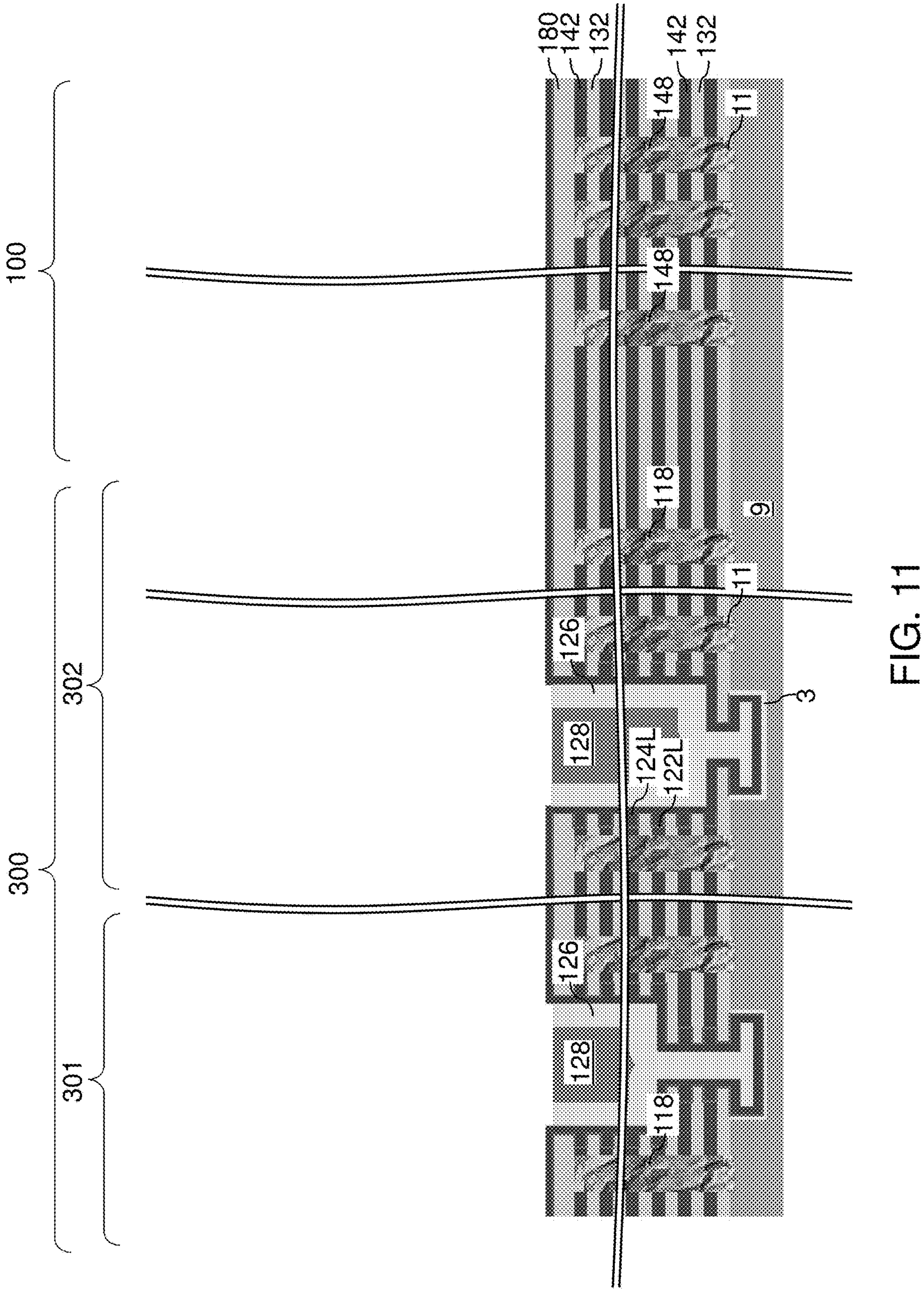
FIG. 11 is a vertical cross-sectional view of the exemplary structure after deposition and vertical recessing of a first sacrificial via fill material according to an embodiment of the present disclosure.

Referring to FIG. 11, a first sacrificial via fill material can be deposited in remaining unfilled volumes (e.g., the upper portions 183U) of the first through-tier cavities 183. The first sacrificial via fill material comprise a different fill material than the material of the first dielectric fill material layer 126L. In one embodiment, the first sacrificial via fill material may comprise a semiconductor material, such as polysilicon or amorphous silicon, or may comprise a carbon-based material, such as amorphous carbon or diamond-like carbon. The first sacrificial via fill material may be vertically recessed by CMP such that remaining portions of the first a sacrificial via fill material have top surfaces roughly at a horizontal plane including a topmost surface of the first continuous dielectric material layer 124L. Each remaining portion of the first sacrificial via fill material is herein referred to as a first sacrificial via fill material portion 128.

Horizontally-extending portions of the first dielectric fill material layer 126L can be removed from above the horizontal plane including the topmost a surface of the first continuous dielectric material layer 124L, for example, by performing a recess etch back process. The continuous dielectric material layer 124L may act as an etch stop during the recess etch back process. Each remaining portion of the first dielectric fill material layer 126L located within a respective one of the first through-tier cavities 183 is herein referred to as a first dielectric fill material portion 126.

Figure 12:
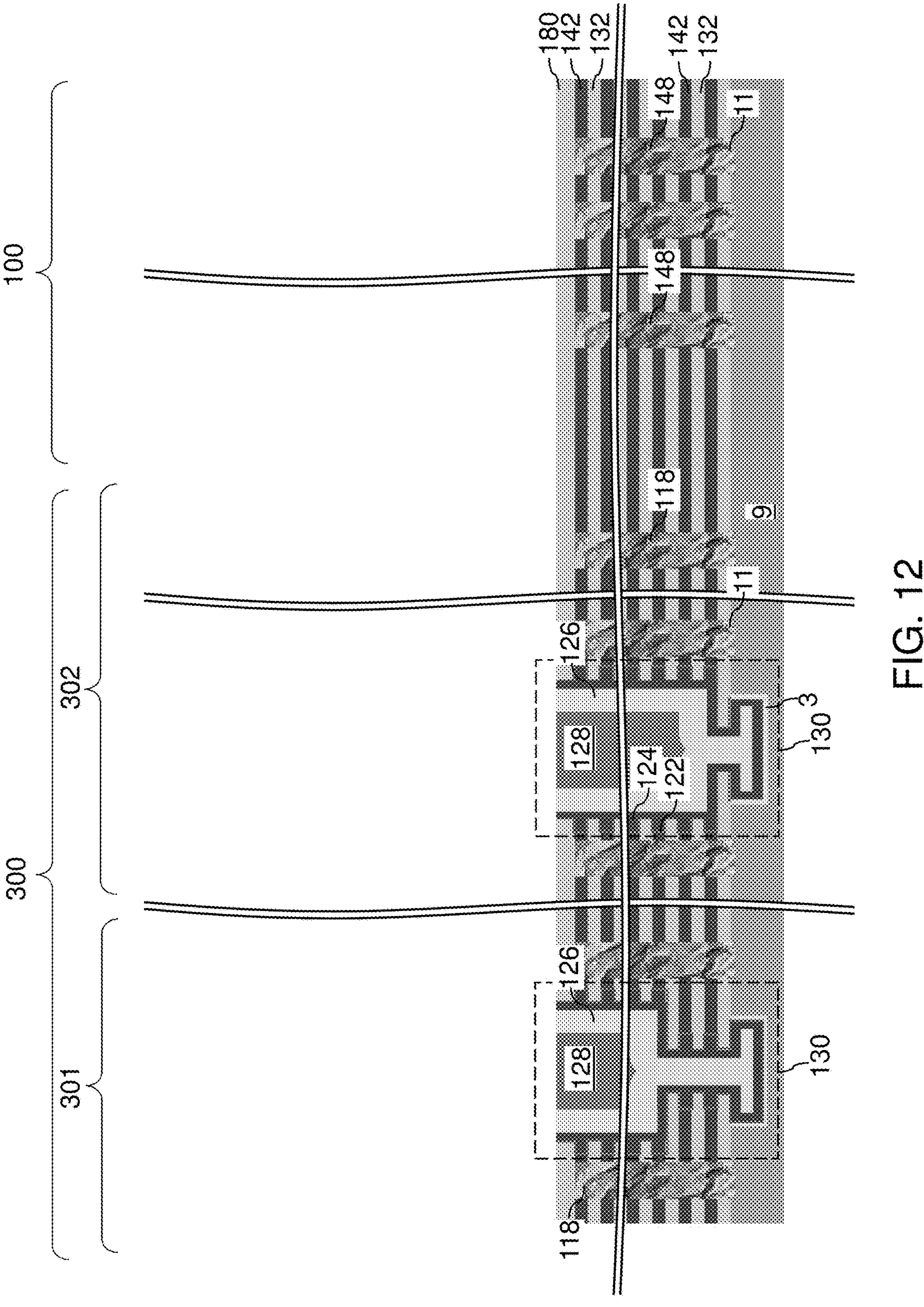
FIG. 12 is a vertical cross-sectional view of the exemplary structure after formation of in-process first-via-cavity fill structures according to an embodiment of the present disclosure.

Referring to FIG. 12, horizontally-extending portions of the first continuous dielectric material layer 124L and the first continuous dielectric liner layer 122L located above the horizontal plane including the top surface of the inter-tier insulating layer 180 can be removed, for example, by performing a series etch back processes. Optionally, segments of the first dielectric fill material portion 126 and the first sacrificial via fill material portion 128 that protrude the above the horizontal plane including the top surface of the inter-tier insulating layer 180 can be removed, for example, by performing a touch-up planarization process, such as a chemical mechanical polishing (CMP) process. Each remaining portion of the first continuous dielectric liner layer 122L constitutes a first dielectric liner 122. Each remaining portion of the first continuous dielectric material layer 124L constitutes a first dielectric material layer 124.

The set of all material portions that fills a first through-tier cavity 183 constitutes an in-process first-via-cavity fill structure 130, i.e., an in-process of fill structure that fills a respective via cavity. Each in-process first-via-cavity fill structure 130 comprises a substrate dielectric liner 3, a first dielectric liner 122, a first dielectric material layer 124, a first dielectric fill material portion 126, and a first sacrificial via fill material portion 128. In one embodiment, top surfaces of the first dielectric liners 122, the first dielectric material layers 124, the first dielectric fill material portions 126, and the first sacrificial via fill material portions 128 may be formed within the horizontal plane including the top surface of the inter-tier insulating layer 180. Each contiguous set of a first dielectric liner 122, a first dielectric material layer 124, and a first dielectric fill material portion 126 is herein referred to as a first dielectric layer stack (122, 124, 126).

Figure 13:
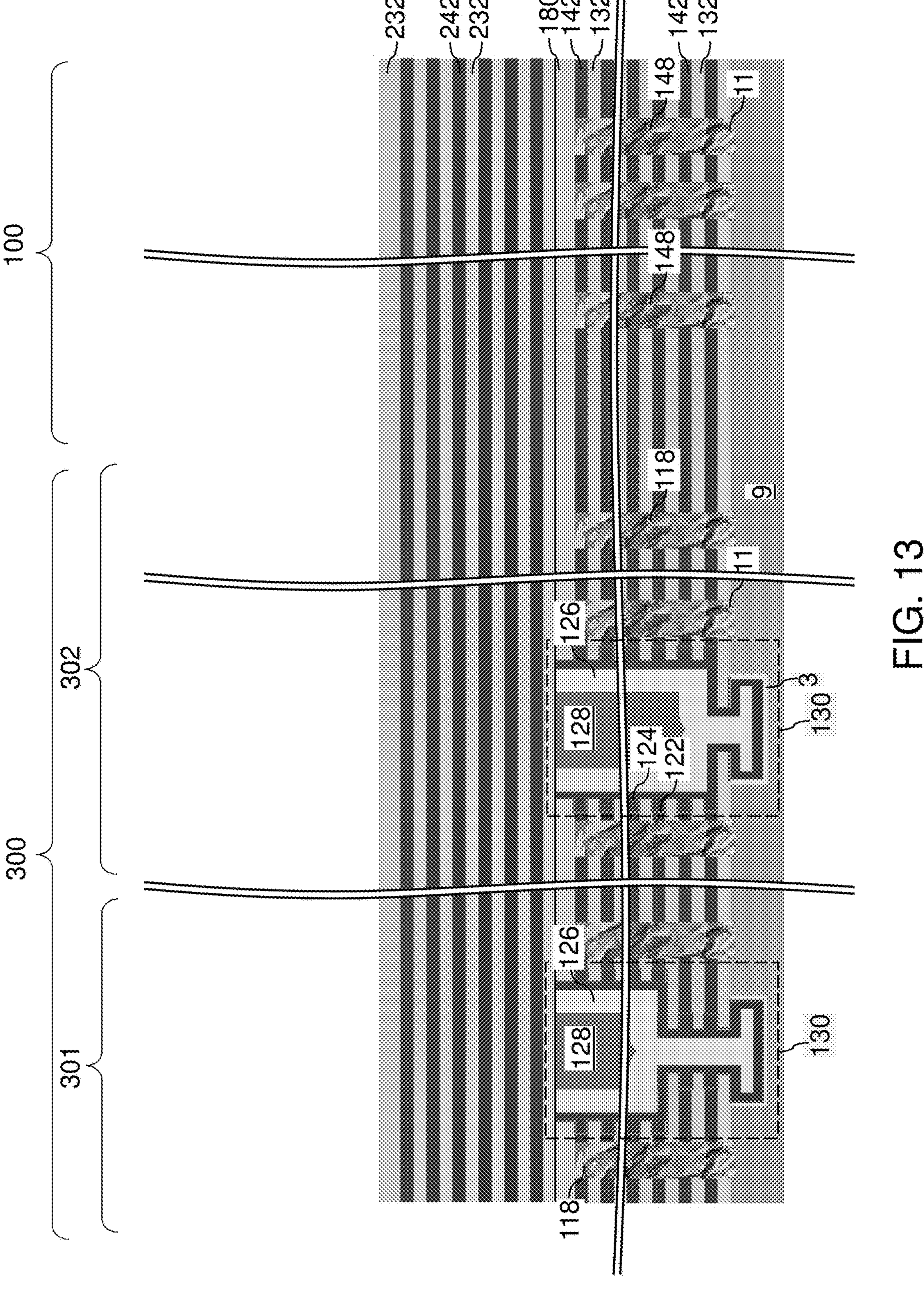
FIG. 13 is a vertical cross-sectional view of the exemplary structure after formation of a second-tier alternating stack of second insulating layers and second sacrificial material layers according to an embodiment of the present disclosure.

Referring to FIG. 13, a second-tier alternating stack of second insulating layers 232 and second sacrificial material layers 242 can be formed over the substrate 9. The second insulating layers 232 comprise an insulating material such as undoped silicate glass or a doped silicate glass, and the second sacrificial material layers 242 comprise a sacrificial material such as silicon nitride or a silicon-germanium alloy. The second-tier alternating stack (232, 242) may comprise multiple repetitions of a unit layer stack including a second insulating layer 232 and a second sacrificial material layer 242. The total number of repetitions of the unit layer stack within the second-tier alternating stack (232, 242) may be, for example, in a range from 8 to 1,024, such as from 32 to 256, although lesser and greater number of repetitions may also be employed. Each of the second insulating layers 232 may have a thickness in a range from 20 nm to 200 nm, such as from 30 nm to 60 nm, although lesser and greater thicknesses may also be employed. Each of the second sacrificial material layers 242 may have a thickness in a range from 20 nm to 200 nm, such as from 30 nm to 60 nm, although lesser and greater thicknesses may also be employed.

Figure 14:
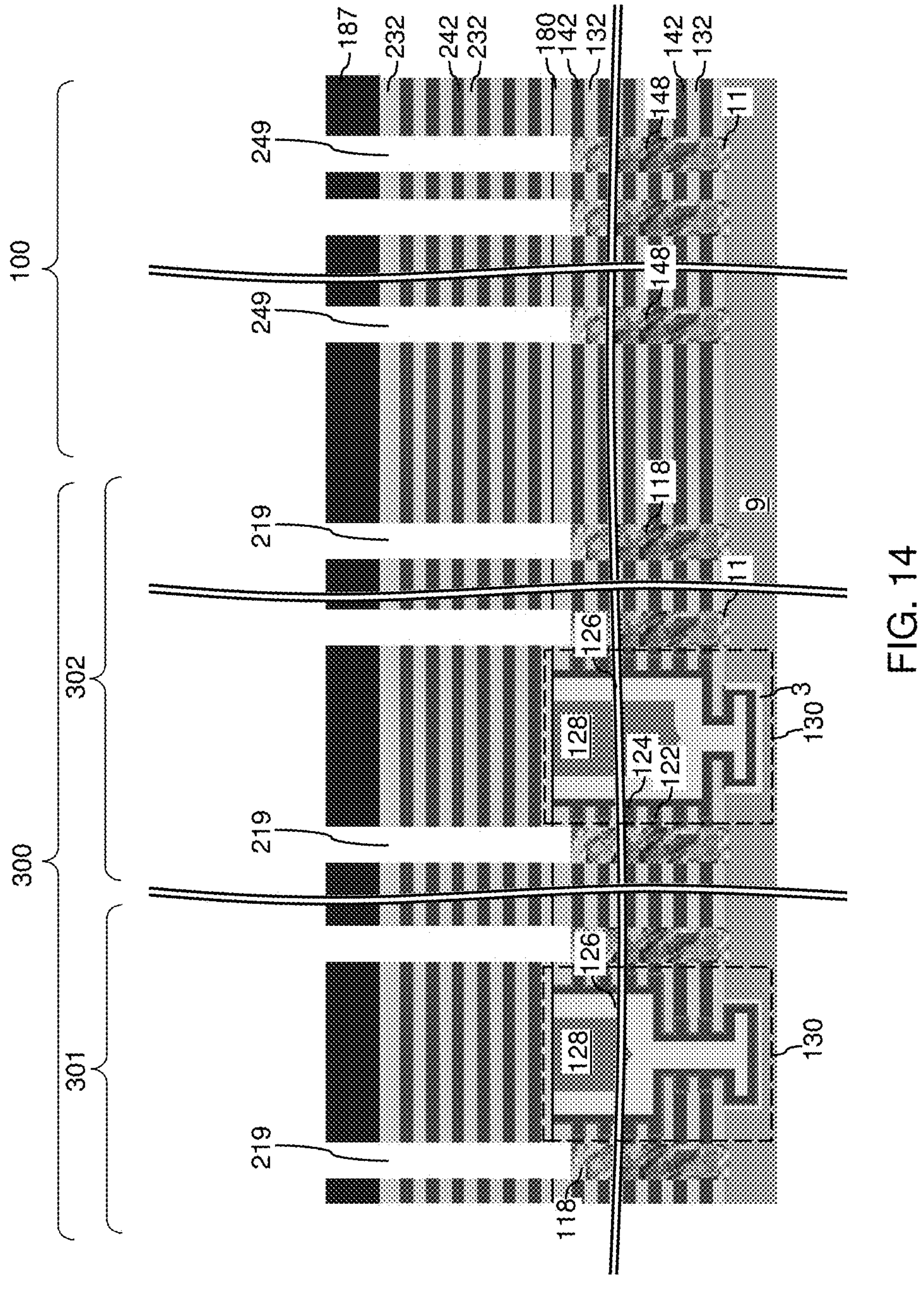
FIG. 14 is a vertical cross-sectional view of the exemplary structure after formation of second-tier memory openings and second-tier support openings according to an embodiment of the present disclosure.

Referring to FIG. 14, an etch mask layer 187, such as a photoresist layer, can be formed over the second-tier alternating stack (232, 242), and can be lithographically patterned to form various openings therein. An anisotropic etch process can be performed to transfer the pattern of the openings in the etch mask layer 187 through the second-tier alternating stack (232, 242). Second-tier openings (249, 219) can be formed through the second-tier alternating stack (232, 242). The second-tier openings (249, 219) may comprise second-tier memory openings 249 that vertically extend through each layer within the second-tier alternating stack (232, 242) in the memory array region 200, and may further comprise second-tier support openings 219 that are formed through the second-tier alternating stack (232, 242) in the contact region 300 and are subsequently employed to form support pillar structures therein. Each of the second-tier memory openings 249 can be formed on top of a respective one of the first-tier sacrificial memory opening fill structures 148. Each of the second-tier support openings 219 can be formed on top of a respective one of the first-tier sacrificial support opening fill structures 118.

Figure 15:
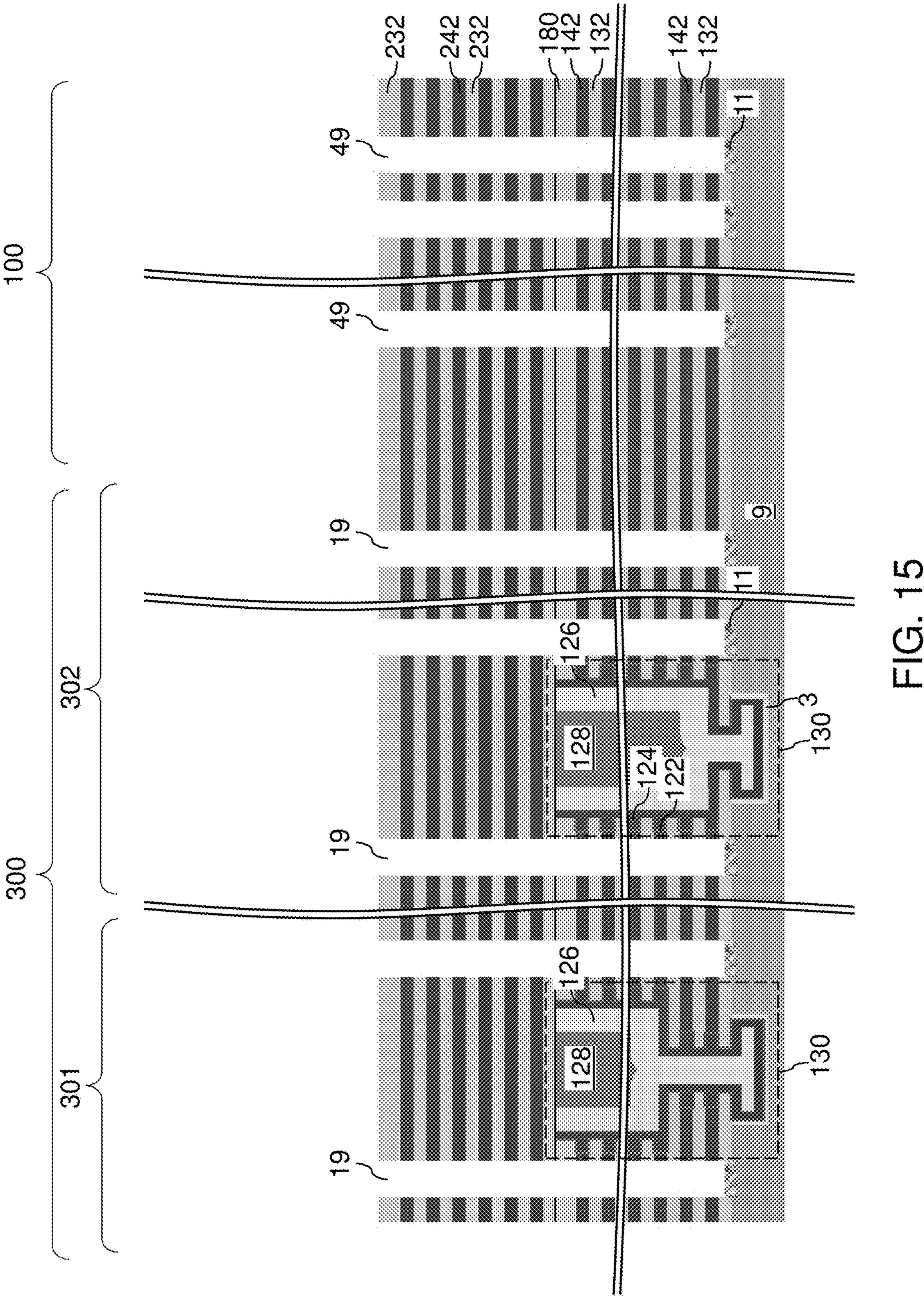
FIG. 15 is a vertical cross-sectional view of the exemplary structure after formation of inter-tier memory openings and inter-tier support openings according to an embodiment of the present disclosure.

Referring to FIG. 15, the first-tier sacrificial opening fill structures (148, 118) can be subsequently removed from underneath the second-tier sacrificial openings (249, 219) selective to the materials of the pedestal channel portions 11, the first-tier alternating stack (132, 142), and the second-tier alternating stack (232, 242). For example, if the first-tier sacrificial opening fill structures (148, 118) comprise a carbon-based material, an ashing process may be performed to remove the first-tier sacrificial opening fill structures (148, 248). If the etch mask layer 187 comprises a photoresist layer, then it is removed together with the first-tier sacrificial opening fill structures (148, 118) during the ashing process. Each volume adjoining a volume of a first-tier memory opening 149 and the second-tier memory opening 249 is herein referred to as an inter-tier memory opening 49, which is also referred to as a memory opening. Each volume adjoining a volume of a first-tier support opening 119 and a second-tier support opening 219 is herein referred to as an inter-tier support opening 19, which is also referred to as a support opening. A pedestal channel portion 11 can be provided at the bottom of each of the inter-tier memory openings 49 and the inter-tier support openings 19.

Figure 16A:
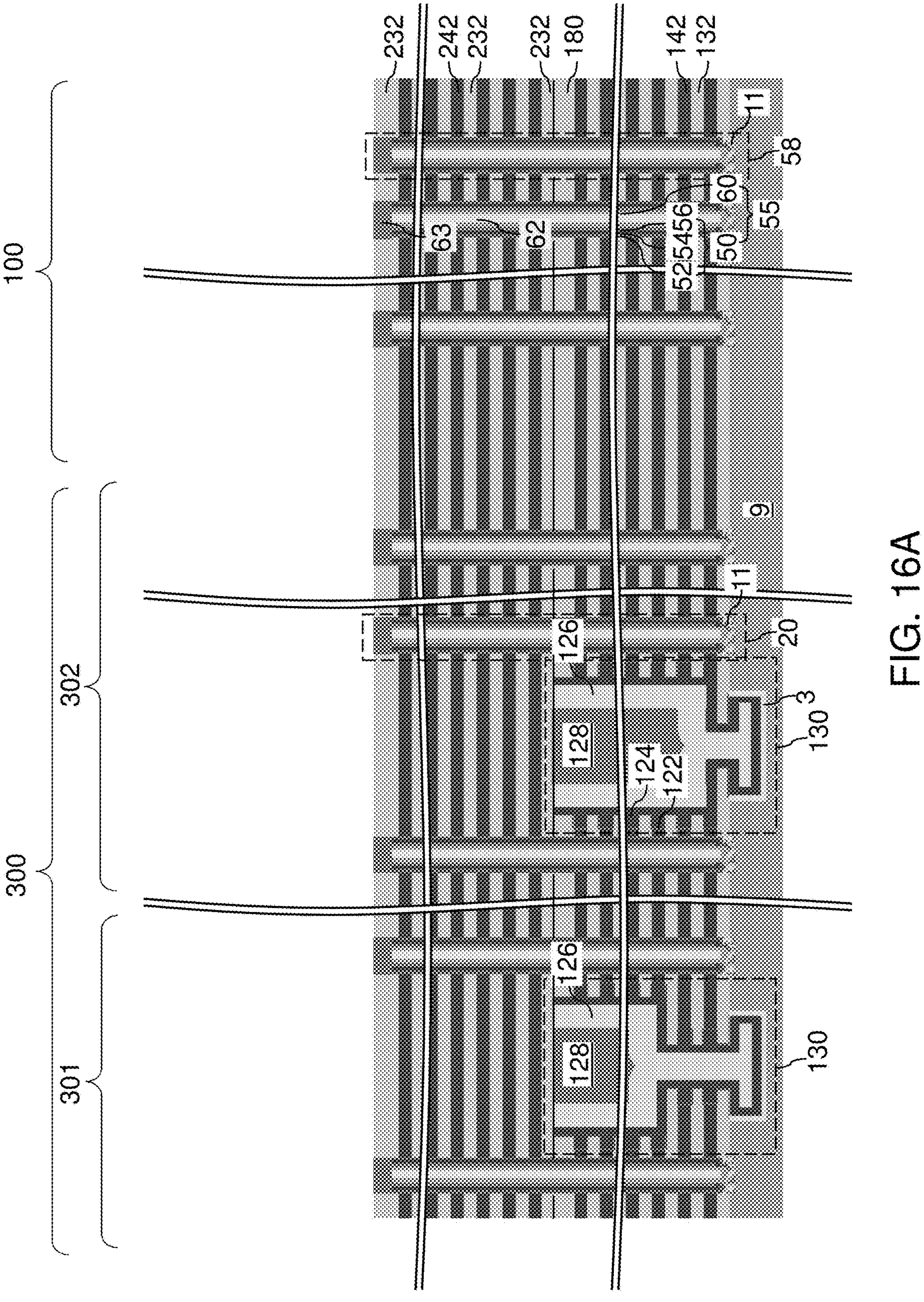
FIG. 16A is a vertical cross-sectional view of the exemplary structure after formation of memory opening fill structures and support pillar structures according to an embodiment of the present disclosure.
Figure 16B:
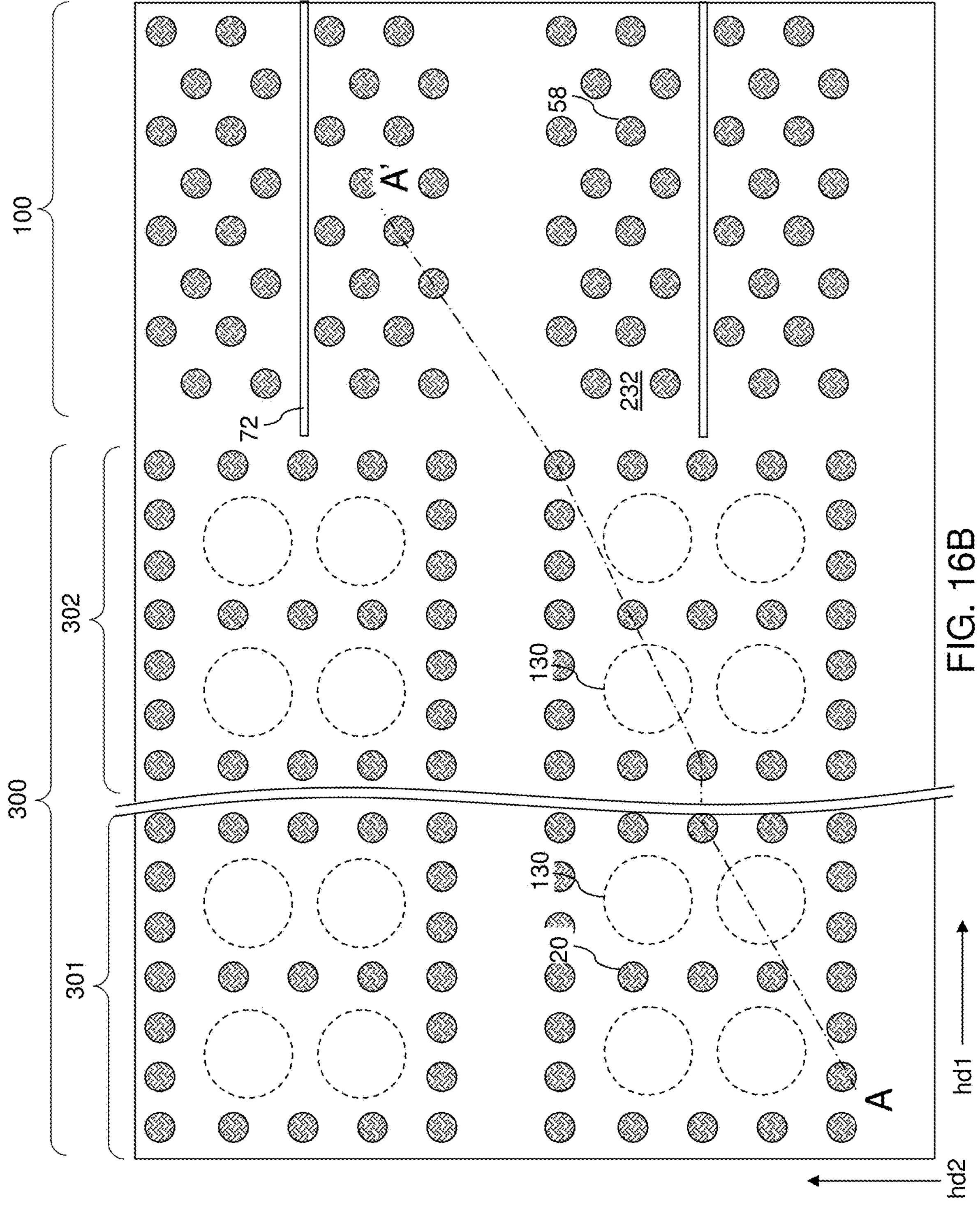
FIG. 16B is a partial see-through top-down view of the exemplary structure of FIG. 16A. The hinged vertical plane A-A' is the plane of the vertical cross-sectional view of FIG. 16A.

Referring to FIGS. 16A and 16B, a sequence of processing steps can be performed to form a memory opening fill structure 58 within each inter-tier memory opening 49 and within each inter-tier support opening 19. For example, a memory film 50 can be formed within each of the memory openings 49 and the support openings 19. The memory films 50 may include any memory material that can store information by charge trapping, a change in electrical resistivity, a change in the direction of ferroelectric polarization (e.g., in a ferroelectric material), or any other material that can store information therein. For example, each memory film 50 may comprise a layer stack including a blocking dielectric layer 52, a charge storage material layer 54, and a tunneling dielectric layer 56. In one embodiment, the memory films 50 can be formed by depositing material layers and/or material portions and by removing excess portions of the material layers and/or the material portions from outside and the bottoms of the memory openings 49 and the support openings 19, for example, by performing an anisotropic etch process (e.g., a sidewall spacer etch process). In one embodiment, the blocking dielectric layer 52 may comprise a silicon oxide or an aluminum oxide layer. The charge storage material layer 54 may comprise a silicon nitride layer. The tunneling dielectric layer 56 may comprise a silicon oxide layer or an "ONO" stack of silicon oxide/silicon nitride/silicon oxide layers.

A vertical semiconductor channel 60 can be formed in each of the memory openings 49 and the support openings 19 by conformal deposition of a semiconductor channel material (e.g., amorphous silicon or polysilicon) having a doping of a first conductivity type. The semiconductor channel material may have a doping of a same conductivity type as the horizontal semiconductor channels (not expressly shown) located in the substrate 9. A dielectric fill material can be deposited in the remaining volumes of the memory openings 49 and the support openings 19, and can be vertically recessed to form a dielectric core 62. A semiconductor material (e.g., amorphous silicon or polysilicon) having a doping of a second conductivity type can be deposited over each dielectric core 62 at a top end of each vertical semiconductor channel 60 to form a drain region 63 within each of the memory openings 49 and the support openings 19. The second conductivity type is opposite of the first conductivity type. Each contiguous combination of a memory film 50 and a vertical semiconductor channel 60 constitutes a memory stack structure 55. Each memory stack structure 55 comprises a respective vertical stack of memory elements. For example, each vertical stack of memory elements may comprise portions of the charge storage layer 54 located at the levels of the sacrificial material layers (142, 242) which are subsequently replaced with electrically conductive layers.

Generally, the memory opening fill structures 58 are formed in the memory openings 49, and support pillar structures 20 are formed in the support openings 19. Each of the memory opening fill structures 58 comprises a respective vertical semiconductor channel 60, a respective vertical stack of memory elements (e.g., portions of a memory film 50), a drain region 63 and an optional dielectric core 62. Drain-select-level dielectric isolation structures (not shown) can be formed through an uppermost set of second sacrificial material layers 242.

Figure 17A:
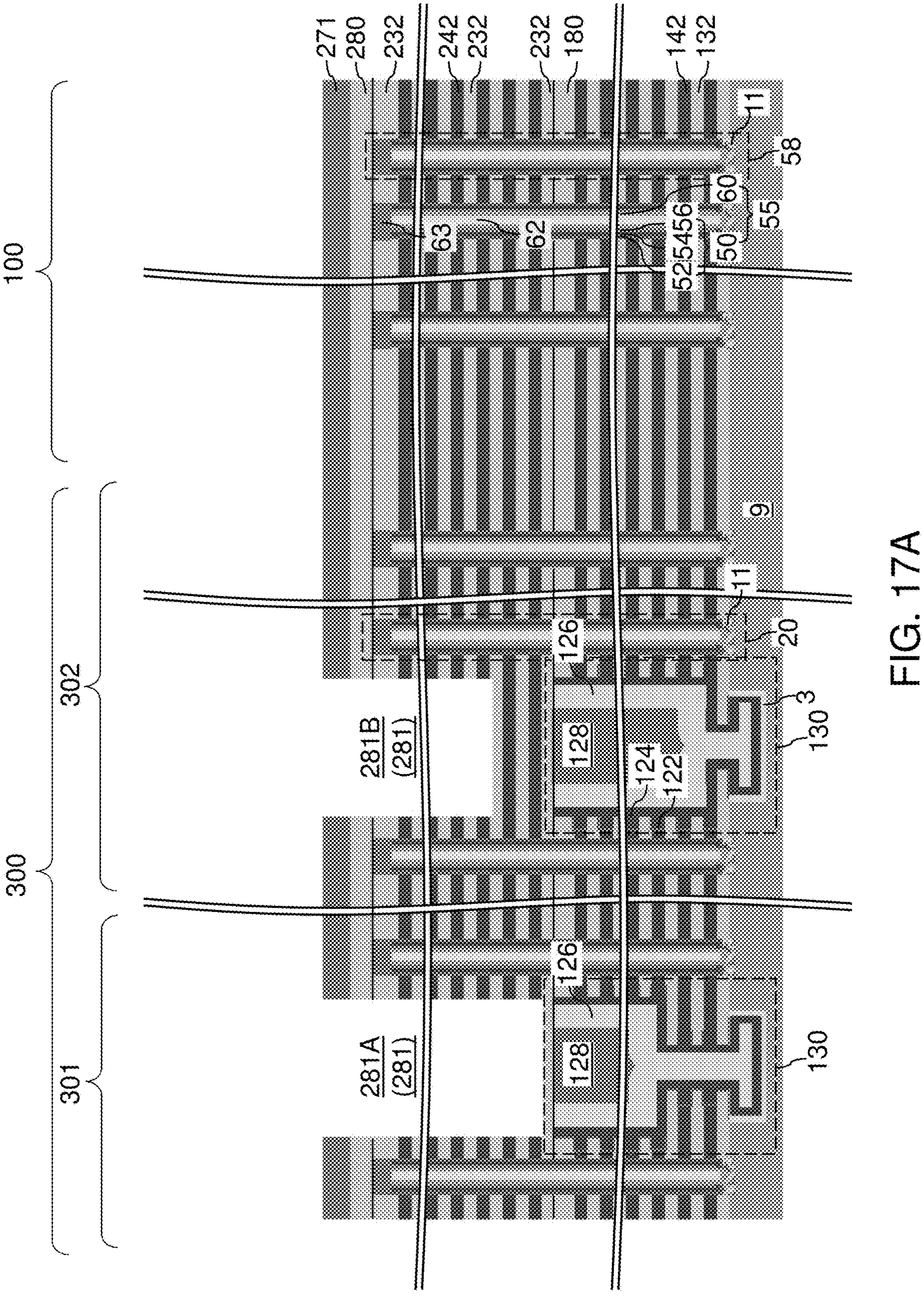
FIG. 17A is a vertical cross-sectional view of the exemplary structure after formation a first contact-level dielectric layer, a second patterned hard mask layer, and second-tier contact via cavities according to an embodiment of the present disclosure.
Figure 17B:
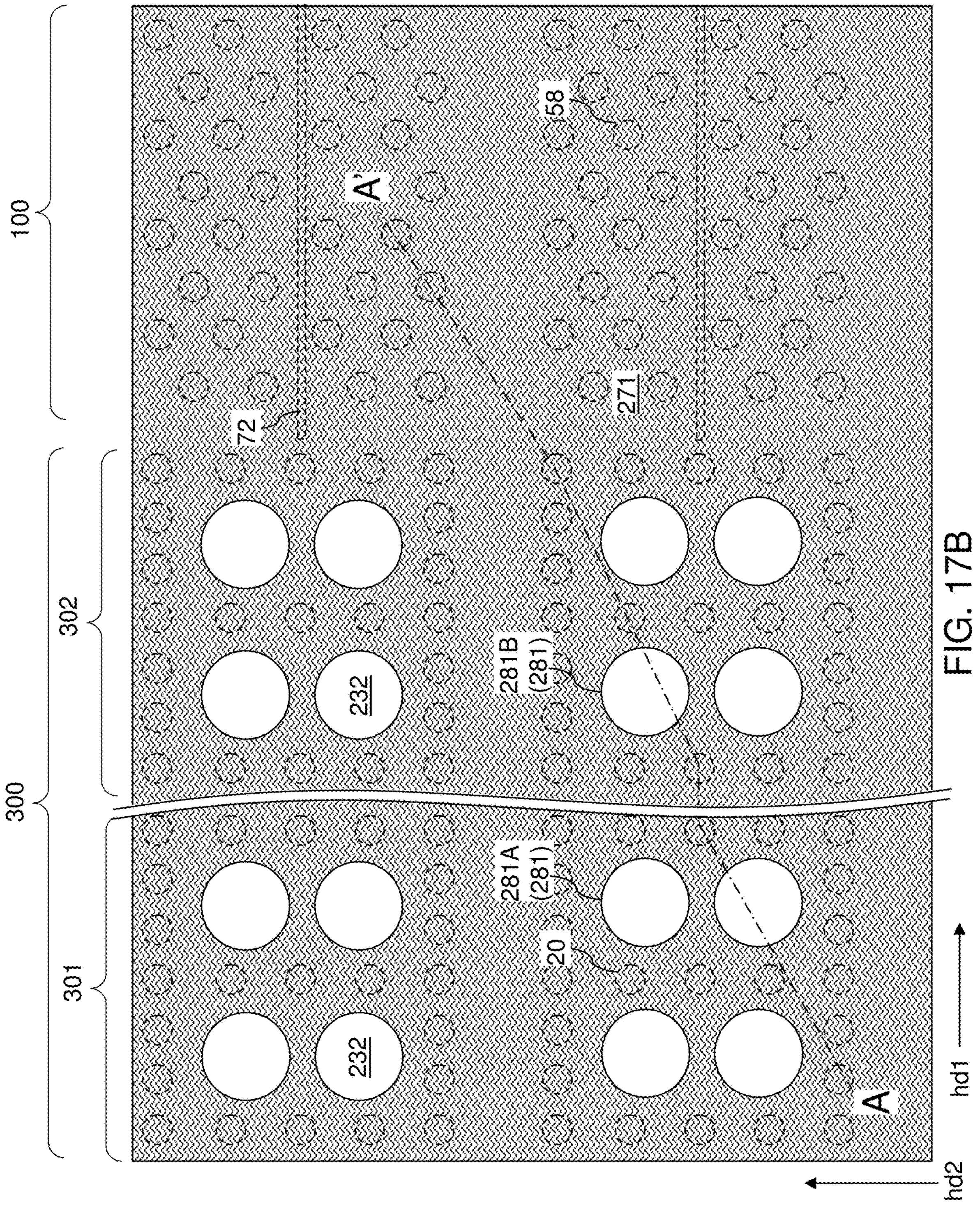
FIG. 17B is a partial see-through top-down view of the exemplary structure of FIG. 17A. The hinged vertical plane A-A' is the plane of the vertical cross-sectional view of FIG. 17A.

Referring to FIGS. 17A and 17B, an insulating layer may be optionally formed over the second-tier alternating stack (232, 242). The insulating layer, if formed, is herein referred to as a first contact-level dielectric layer 280. A second patterned hard mask layer 271 may be formed above the first contact-level dielectric layer 280 by depositing and patterning a hard mask material. The second patterned hard mask layer 271 comprises a material that can function as an etch mask material during subsequent anisotropic etch processes. In one embodiment, the second patterned hard mask layer 271 may comprise a semiconductor material, such as amorphous silicon, and may have a thickness in a range from 50 nm to 500 nm, although lesser and grater thicknesses may be employed. The hard mask layer 271 may be patterned by applying and lithographically patterning a photoresist material over the hard mask layer 271, and by transferring the pattern in the photoresist material through the hard mask layer 271. In one embodiment, the pattern of the openings in the second patterned hard mask layer 271 may be the same as the pattern of the in-process first-via-cavity fill structures 130, which is the same as the pattern of the first-tier via cavities 181.

Second-tier via cavities 281 are formed through a respective subset of layers within the second-tier alternating stack (232, 242). Each of the second-tier via cavities 281 can vertically extend through the contact-level dielectric layer 280 and through a respective subset of the second sacrificial material layers 242 and the second insulating layers 232 such that a top surface of a selected second insulating layer 232 is physically exposed at the bottom of each second-tier via cavity 281. In one embodiment, the second-tier via cavities 281 may have different depths from each other, and each second insulating layer 232 can be physically exposed to a respective overlying second-tier via cavity 281.

The second-tier via cavities 281 having different depths may be formed employing a plurality of masked anisotropic etch processes. In an illustrative example, the openings in the second patterned hard mask layer 271 may have the pattern of all of the second-tier via cavities 281 to be subsequently formed. An anisotropic etch process may be performed to transfer the pattern of the openings in the second patterned hard mask layer 271 through the first contact-level dielectric layer 280

Subsequently, multiple iterations of a combination of a respective masking process and a respective anisotropic etch process may be performed to etch through a respective subset of second sacrificial material layers 242 and a respective subset of the second insulating layers 232. Each masking process forms a respective patterned photoresist layer (not shown) that masks a respective subset of the openings in the second patterned hard mask layer 271 without masking a respective complementary subset of the openings. Each anisotropic etch process etches a respective number of second sacrificial material layers 242 and a respective number of insulating layers 32 underneath each opening in the second pattered hard mask layer 271 that is not masked by a respective patterned photoresist layer. In one embodiment, the number of etched second sacrificial material layers 242 and etched second insulating layers 232 underneath unmasked openings in the second patterned hard mask layer 271 may be a non-negative integer power of 2, i.e., 1, 2, 4, 8, 26, 32, 64, etc. By employing a combination of various masking patterns for the patterned photoresist layers, the total depths of the second-tier via cavities 281 can be varied to enable physical exposure of the top surfaces of second insulating layers 232 at each level. The second patterned hard mask layer 271 can be subsequently removed.

The second-tier via cavities 281 may comprise first-type second-tier via cavities 281A that are formed in the first contact region 301 and second-type second-tier via cavities 281B that are formed in the second contact region 302. In one embodiment, the second-type second-tier via cavities 281B have various depths such that each of the second insulating layers 232 has a top surface segment that is physically exposed to a respective overlying second-type second-tier via cavity 281A. In one embodiment, each of the first-type second-tier via cavities 281A may extend through each layer within the second-tier alternating stack (232, 242) except the bottommost second insulating layer 232. In this case, each of the first-type second-tier via cavities 281A may vertically extend through each second sacrificial material layer 242 in the second-tier alternating stack (232, 242). The lateral dimensions (such as diameters) of the second-tier via cavities 281 may be in a range from 200 nm to 3,000 nm, although lesser and greater lateral dimensions may also be employed.

Figure 18:
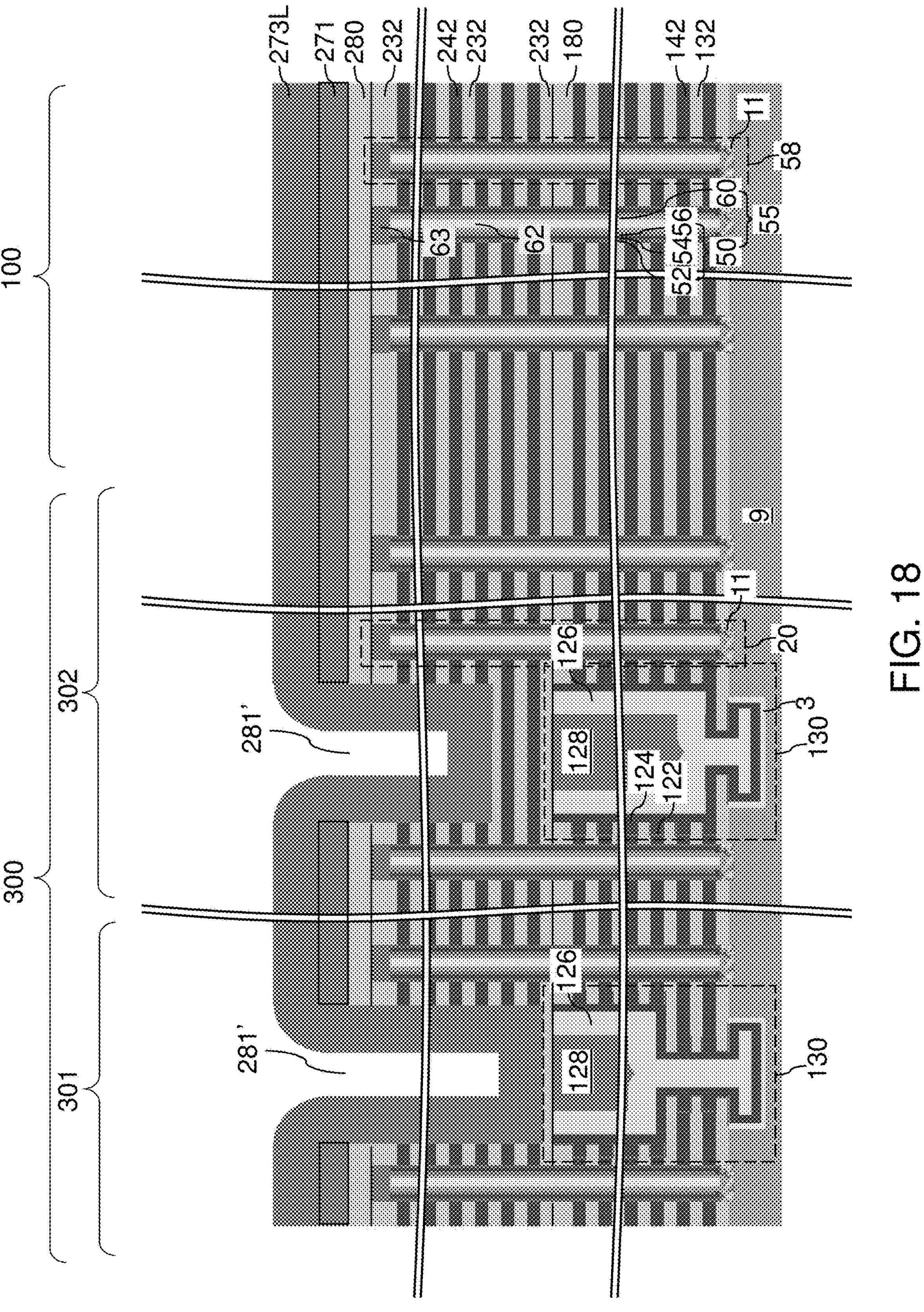
FIG. 18 is a vertical cross-sectional view of the exemplary structure after formation of a second sacrificial spacer material layer according to an embodiment of the present disclosure.

Referring to FIG. 18, a second sacrificial spacer material layer 273L can be deposited over the second patterned hard mask layer 271 and in peripheral portions of the second-tier via cavities 281. The second sacrificial spacer material layer 273L comprises a material that may be subsequently employed as an etch mask material for the materials of the second-tier alternating stack (232, 242). In one embodiment, the second sacrificial spacer material layer 273L comprises a semiconductor material, such as polysilicon or amorphous silicon. The thickness of the second sacrificial spacer material layers 273L may be in a range from 50 nm to 1,000 nm, although lesser and greater thicknesses may also be employed. A void 281' can be formed within each volume of the second-tier via cavities 281 that is not filled with the second sacrificial spacer material layer 273L.

Figure 19:
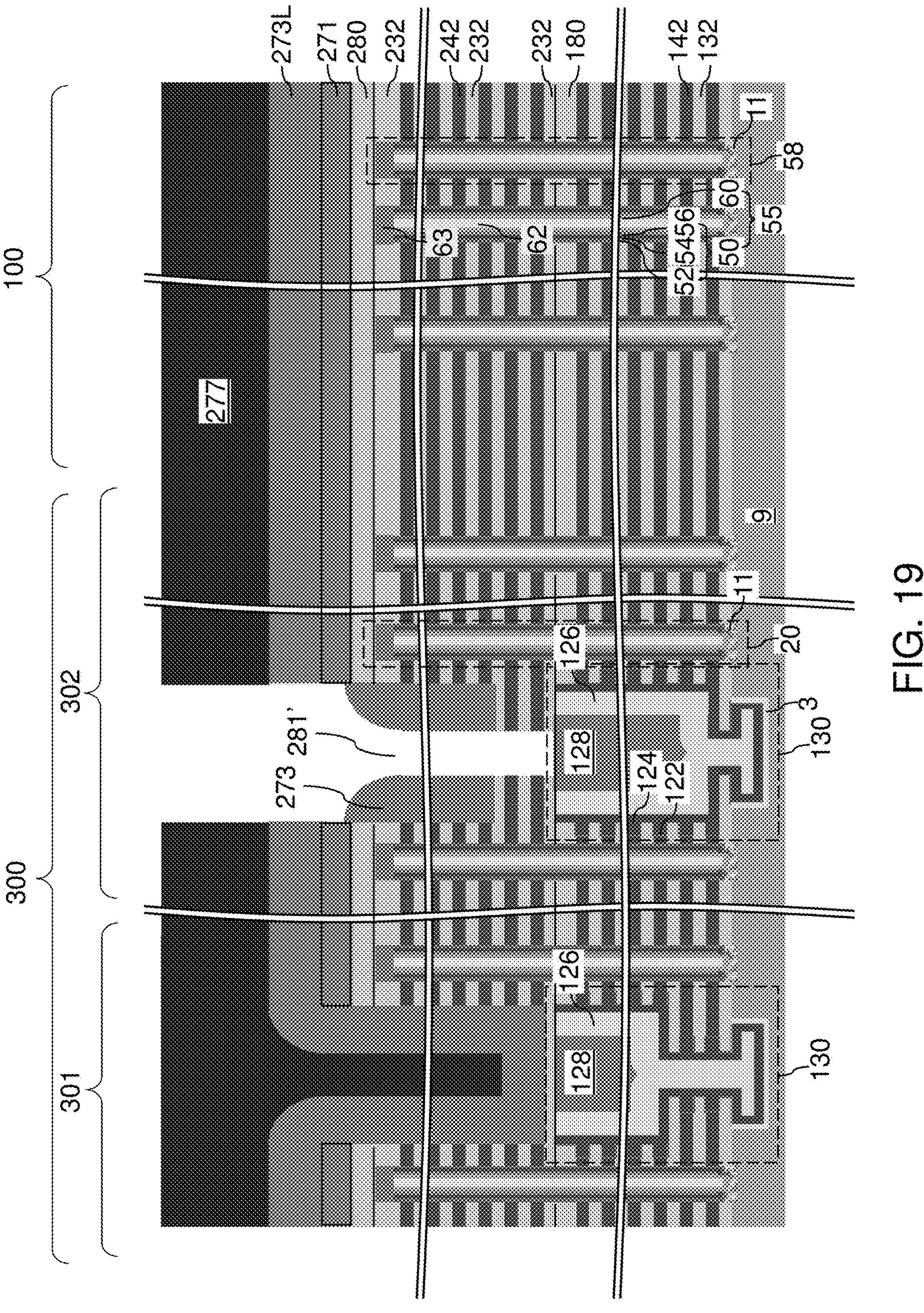
FIG. 19 is a vertical cross-sectional view of the exemplary structure after formation of a second patterned photoresist layer and after performing a second anisotropic etch process that vertically extends center portions of a first subset of the second-tier contact via cavities according to an embodiment of the present disclosure.

Referring to FIG. 19, a second patterned photoresist layer 277 can be formed over the second sacrificial spacer material layer 273L. Generally, the second patterned photoresist layer 277 may have openings in the areas of the second-type second-tier via cavities 281B. For example, the openings in the second patterned photoresist layer 277 may be located at or within a periphery of a respective one of the second-type second-tier cavities 281B located in the second contact region 302 in a plan view, such as a top-down view.

A second anisotropic etch process can be performed to vertically extend center portions of the second-type second-tier contact via cavities 281B that are laterally surrounded by vertically-extending portions of the second sacrificial spacer material layer 273L. The second anisotropic etch process may include a first anisotropic etch step that etches the material of the second sacrificial spacer material layer 273L. Portions of the second sacrificial spacer material layer 273L that are not masked by the second patterned photoresist layer 277 are vertically recessed uniformly. Each portion of the second sacrificial spacer material layer 273L that underlies a respective void 281' is etched through, and a top surface segment of a respective underlying second insulating layer 232 (or the first contact-level dielectric layer 280) is physically exposed underneath the respective void 281'. A tubular portion of the second sacrificial spacer material layer 273L remains in the peripheral region of each second-type second-tier via cavity 281 while a center portion of the second sacrificial spacer material layer 273L in each second-type second-tier via cavity 281 is etched through during the second anisotropic etch step of the second anisotropic etch process. Each tubular portion of the second sacrificial spacer material layer 273L that remains in a respective second-type and second-tier cavity 281 constitutes a second sacrificial spacer 273.

The second anisotropic etch process may include a second anisotropic etch step that etches the materials of the second insulating layers 232 and the second sacrificial material layers 242 selective to the materials of the second sacrificial spacers 273 and the first sacrificial via fill material portions 128. The second anisotropic etch step of the second anisotropic etch process etches portions of the second-tier alternating stack (232, 242) that underlie the second-type second-tier via cavities 281B and are not covered by the tubular portions of the second sacrificial spacer material layer 273L, i.e., the second sacrificial spacers 273. Each center region of the second-type second-tier via cavities 281 can be vertically extended into an upper portion of a respective underlying first sacrificial via fill material portion 128 while the peripheral region of the second-type second-tier via cavities 281B occupied by the second sacrificial spacers 273 are not vertically extended.

Figure 20:
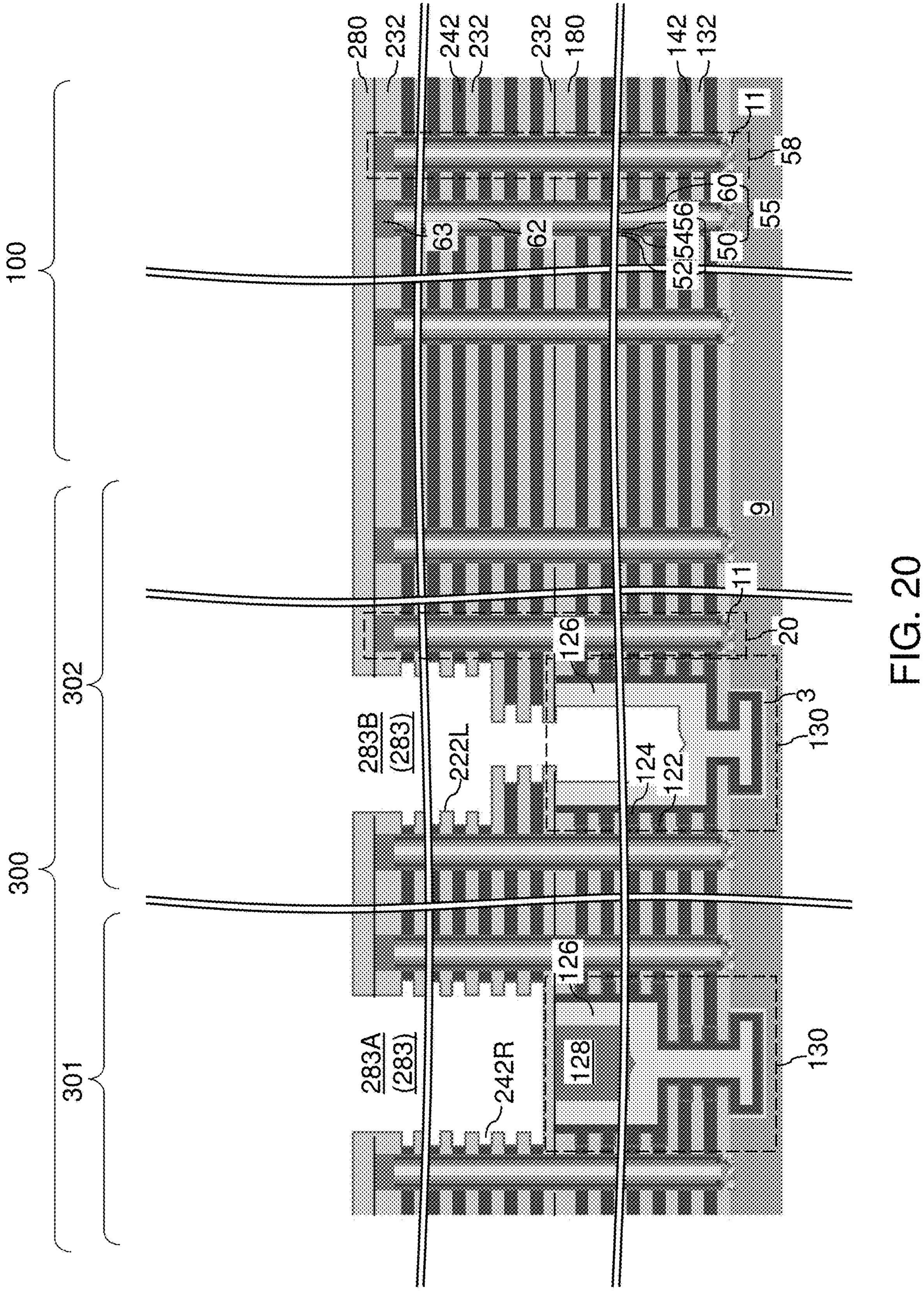
FIG. 20 is a vertical cross-sectional view of the exemplary structure after removal of remaining portions of the second sacrificial spacer material layer and the second patterned hard mask layer, removal of a first subset of first sacrificial via fill material portions, and formation of a second continuous dielectric liner according to an embodiment of the present disclosure.

Referring to FIG. 20, the second patterned photoresist layer 277, the second sacrificial spacer material layer 273L, the second sacrificial spacers 273, and the second patterned hard mask layer 271, and a subset of the first sacrificial via fill material portions 128 in the second region 302 can be subsequently removed. For example, the second patterned photoresist layer 277 can be removed by performing an ashing process. In case the second sacrificial spacer material layer 273L, the second sacrificial spacers 273, the second patterned hard mask layer 271 and the first subset of the first sacrificial via fill material portions 128 in the second contact region 302 comprise semiconductor materials, such as polysilicon or amorphous silicon, a wet etch process employing TMAH or TMY may be performed to remove the second sacrificial spacer material layer 273L, the second sacrificial spacers 273, and the second patterned hard mask layer 271, and a first subset of the first sacrificial via fill material portions 128 that are not covered by the bottommost second insulating layer 232 and located in the second contact region 302.

Subsequently, a selective isotropic etch process can be performed to laterally recess the second sacrificial material layers 242 selective to the materials of the second insulating layers 232 and the first dielectric fill material portions 126. For example, if the second sacrificial material layers 242 comprise silicon nitride, a wet etch process employing hot phosphoric acid can be performed to laterally recess the second sacrificial material layers 242. Generally, sidewalls of the second sacrificial material layers 242 may be laterally recessed relative to sidewalls of the second insulating layers 232 around the second-tier via cavities 281, which are now referred to as second through-tier cavities 283. Each of the second through-tier cavities 283 includes the entire volume of a respective one of the second-tier via cavities 281 as formed at the processing steps of FIGS. 17A and 17B. The second through-tier cavities 283 further comprise voids that are formed by the second anisotropic etch process and by removal of the second sacrificial spacers 273 and the first subset of the first sacrificial via fill material portions 128. Finally, the second through-tier cavities 283 further comprise the lateral recesses 242R formed at the levels of the sacrificial material layers 242. The second through-tier cavities 283 can include first-type through-tier cavities 283A that are formed in the first contact region 301 and second-type through-tier cavities 283B that are formed in the second contact region 302. Each of the second through-tier cavities 283 may comprise a respective set of lateral protrusions which correspond to the lateral recesses 242R located at each level of the second sacrificial material layers 242. A second continuous dielectric liner layer 222L can be deposited in the second through-tier cavities 283 by a conformal deposition process. The second continuous dielectric liner layer 222L comprises a dielectric material, such as silicon oxide, and may have a thickness in a range from 3 nm to 20 nm, although lesser and greater thicknesses may also be employed. Alternatively, the silicon oxide second continuous dielectric liner layer 222L can be formed by radical oxidation (e.g., in-situ steam generation (ISSG)) of exposed silicon nitride second sacrificial material layers 242.

Figure 21:
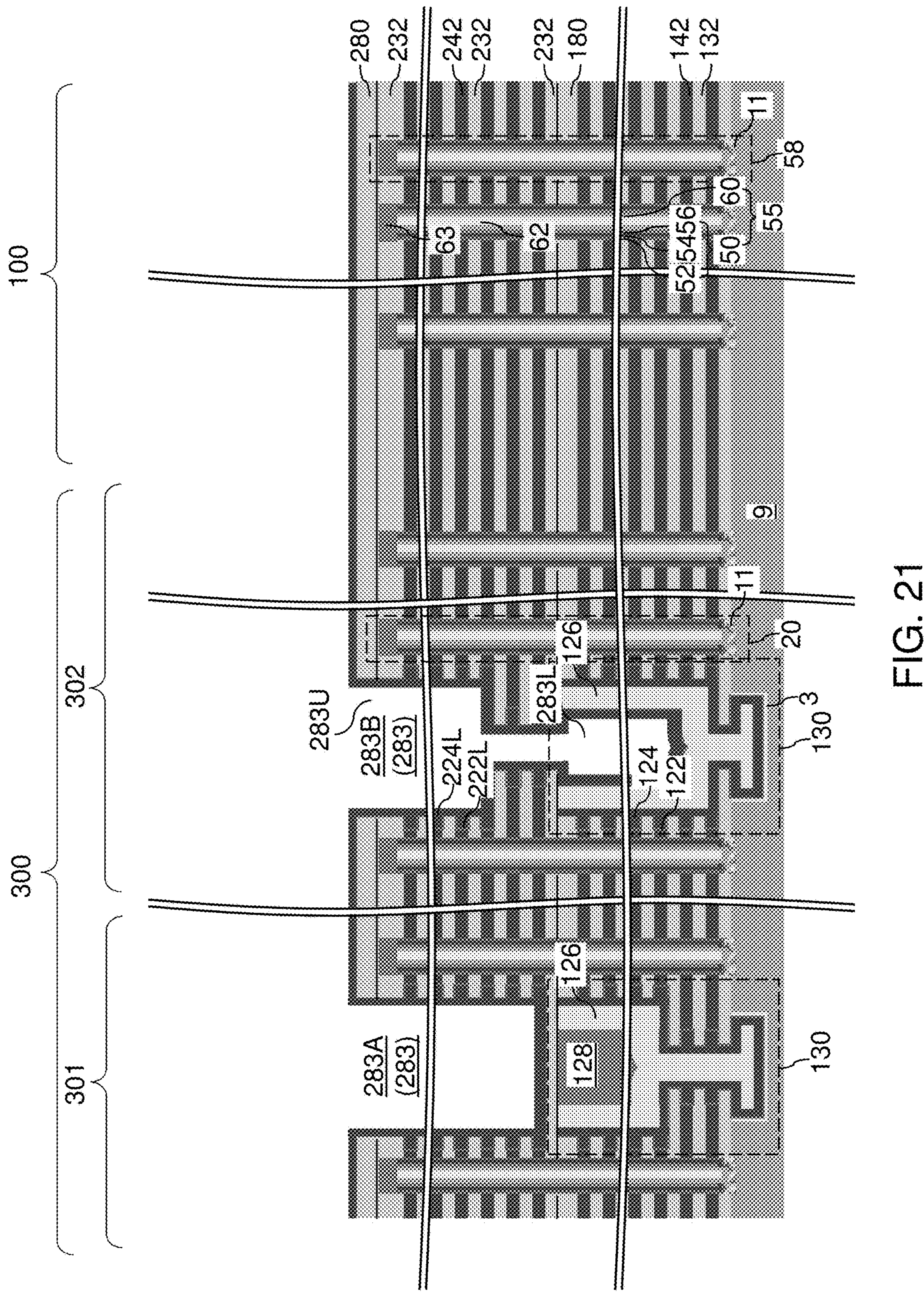
FIG. 21 is a vertical cross-sectional view of the exemplary structure after formation of a second continuous dielectric material layer according to an embodiment of the present disclosure.

Referring to FIG. 21, a second continuous dielectric material layer 224L can be conformally deposited to fill remaining volumes of the lateral recesses in the second sacrificial material layers 242 around the second through-tier cavities 283. The second continuous dielectric material layer 224L comprises a dielectric material, such as silicon nitride or silicon carbonitride. The thickness of the second continuous dielectric material layer 224L may be in a range from 30 nm to 300 nm, although lesser and greater thicknesses may also be employed. The second through-tier cavities 283 include a narrower lower portion 283L located in the first alternating stack (132, 142) and a wider upper portion 283U in the second alternating stack (232, 242).

Figure 22:
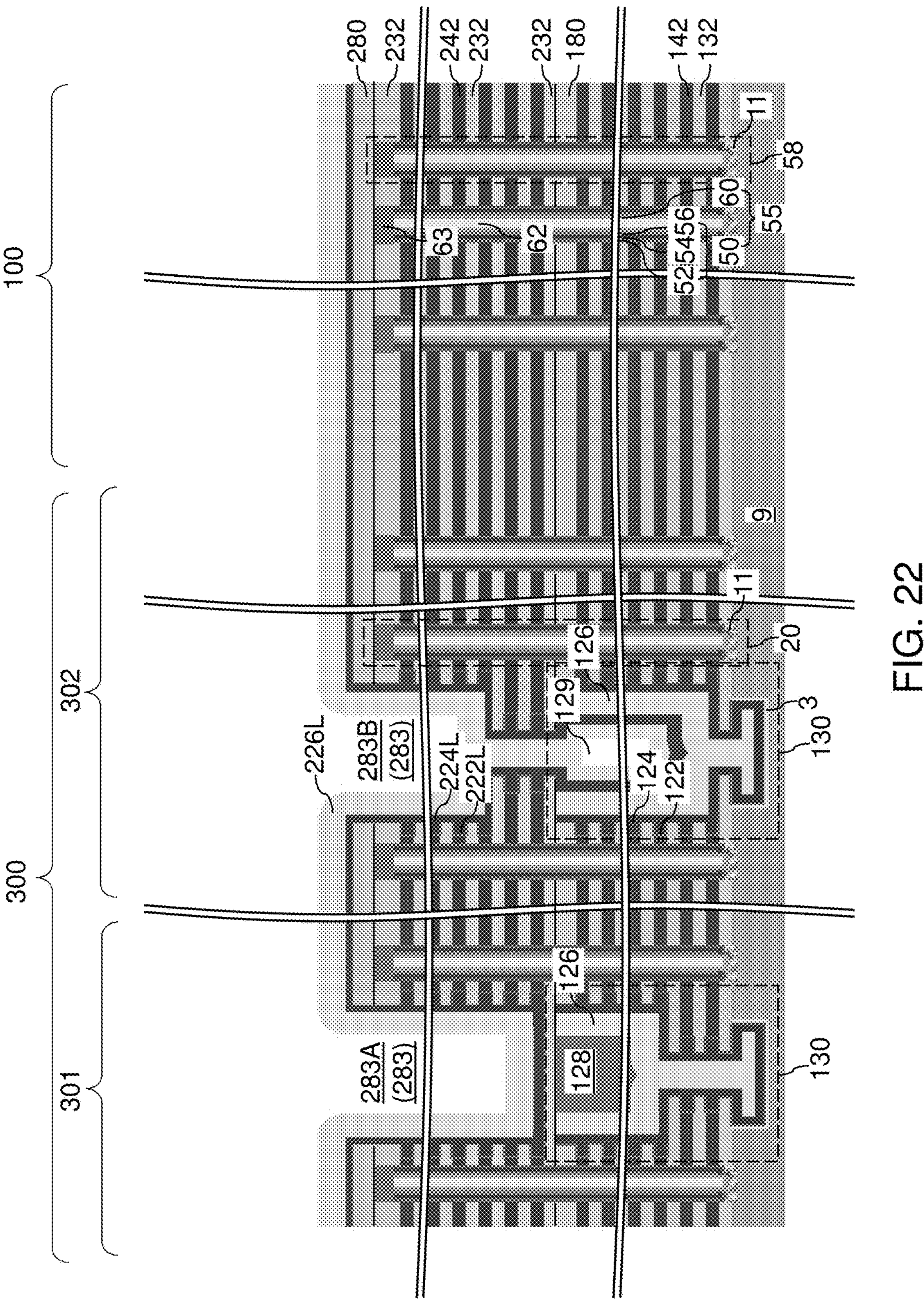
FIG. 22 is a vertical cross-sectional view of the exemplary structure after formation of a second dielectric fill material layer according to an embodiment of the present disclosure.

Referring to FIG. 22, a second dielectric fill material layer 226L can be deposited to fill a narrower lower portion 283L of each of the second through-tier cavities 283 without completely filling a wider upper portion 283U of each of the second through-tier cavities 283. The second dielectric fill material layer 226L comprises a dielectric fill material such as silicon oxide.

Figure 23:
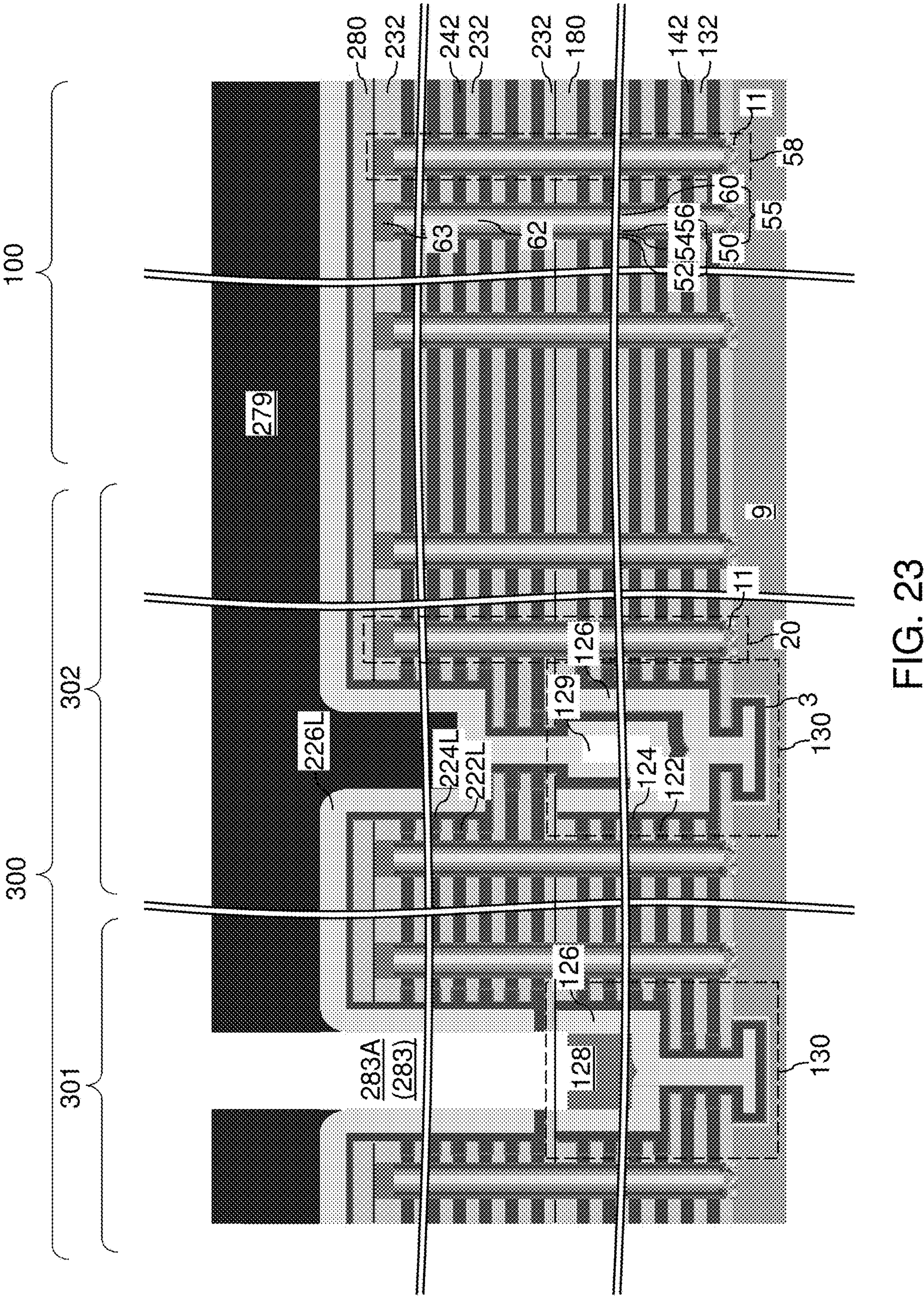
FIG. 23 is a vertical cross-sectional view of the exemplary structure after formation of a third patterned photoresist layer and after performing a third anisotropic etch process that vertically extends center portions of a second subset of the third-tier contact via cavities according to an embodiment of the present disclosure.

Referring to FIG. 23, a third patterned photoresist layer 279 can be formed over the second dielectric fill material layer 226L. Generally, the third patterned photoresist layer 279 may have openings in the areas of the first-type second through-tier cavities 283A. For example, the openings in the third patterned photoresist layer 279 may be located at or within vertically-extending inner sidewalls of the second dielectric fill material layer 226L located within a respective one of the first-type second through-tier cavities 283A located in the first contact region 301 in a plan view such as a top-down view.

A third anisotropic etch process can be performed to vertically extend the voids located at center portions of the first-type second-tier contact via cavities 281A, which are now center portions of the first-type second through-tier cavities 283A. The third anisotropic etch process etches through horizontally-extending unmasked portions of the second dielectric fill material layer 226 and underlying portions of the bottommost second insulating layer 232 and the inter-tier insulating layer 180. A top surface of each first sacrificial via fill material portion 128 underlying the first-type second through-tier cavities 283A can be physically exposed. The third patterned photoresist layer 279 can be subsequently removed, for example, by ashing.

Figure 24:
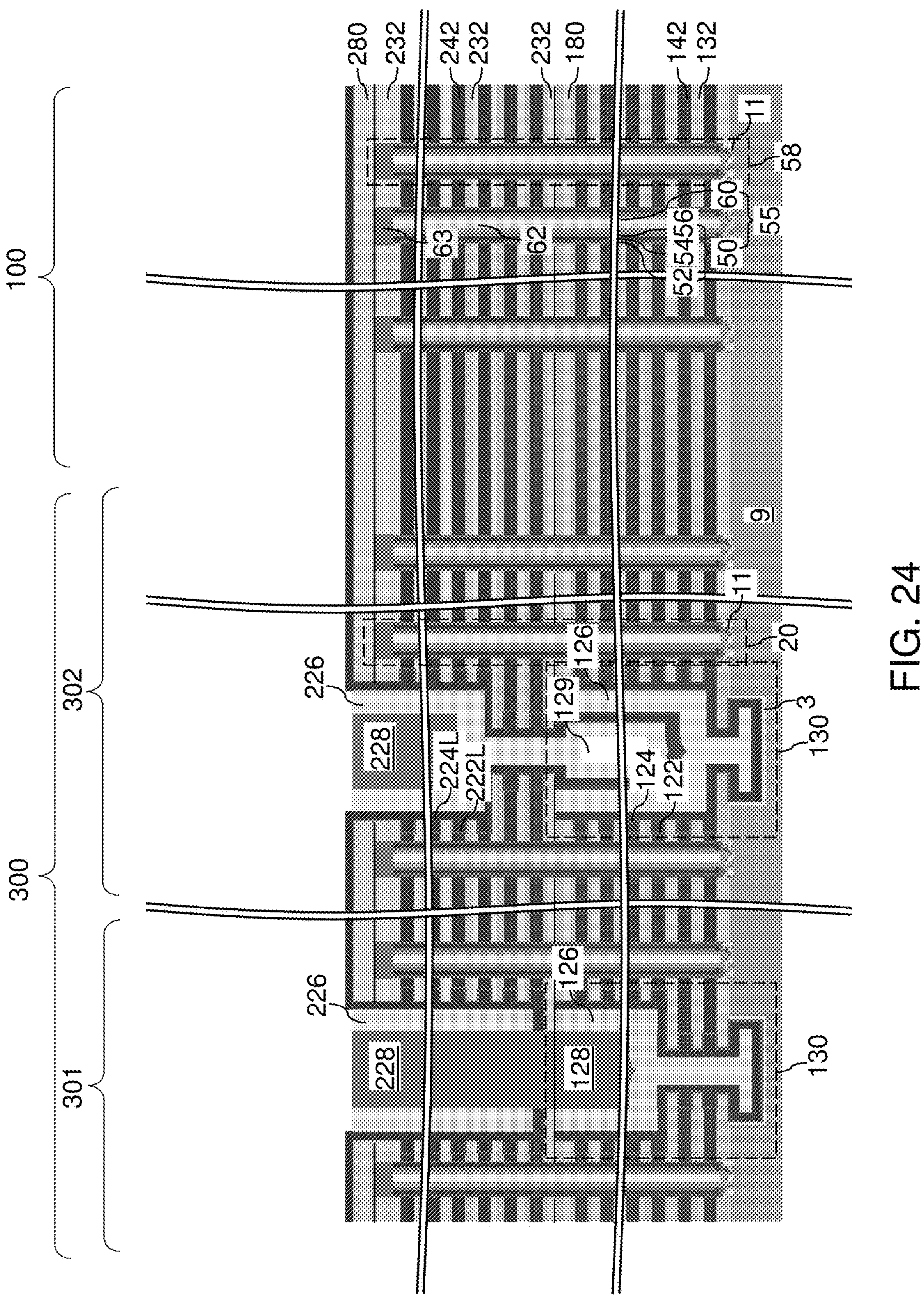
FIG. 24 is a vertical cross-sectional view of the exemplary structure after deposition and vertical recessing of a second sacrificial via fill material according to an embodiment of the present disclosure.

Referring to FIG. 24, a second sacrificial via fill material can be deposited in remaining unfilled volumes of the second through-tier cavities 283. The second sacrificial via fill material comprise a different fill material than the material of the second dielectric fill material layer 226L. In one embodiment, the second sacrificial via fill material may comprise a semiconductor material, such as polysilicon or amorphous silicon, or may comprise a carbon-based material, such as amorphous carbon or diamond-like carbon. The second sacrificial via fill material may be vertically recessed (e.g., by CMP) such that remaining portions of the second a sacrificial via fill material have top surfaces in or near a horizontal plane including a topmost surface of the second continuous dielectric material layer 224L. Each remaining portion of the second sacrificial via fill material is herein referred to as a second sacrificial via fill material portion 228.

Horizontally-extending portions of the second dielectric fill material layer 226L can be removed from above the horizontal plane including the topmost a surface of the second continuous dielectric material layer 224L, for example, by performing a recess etch process. Each remaining portion of the second dielectric fill material layer 226L located within a respective one of the second through-tier cavities 283 is herein referred to as a second dielectric fill material portion 226. An optional air gap 129 that is free of any solid phase material may be formed within the narrower lower portion 283L of each of the second through-tier cavities 283. The top of the air gap 129 is encapsulated by a bottom portion of a respective one of the second dielectric fill material portions 226. The bottom and sides of the air gap 129 are encapsulated by a respective one of the first dielectric fill material portions 126. However, no air gap 129 is present in the first contact region 301.

Figure 25:
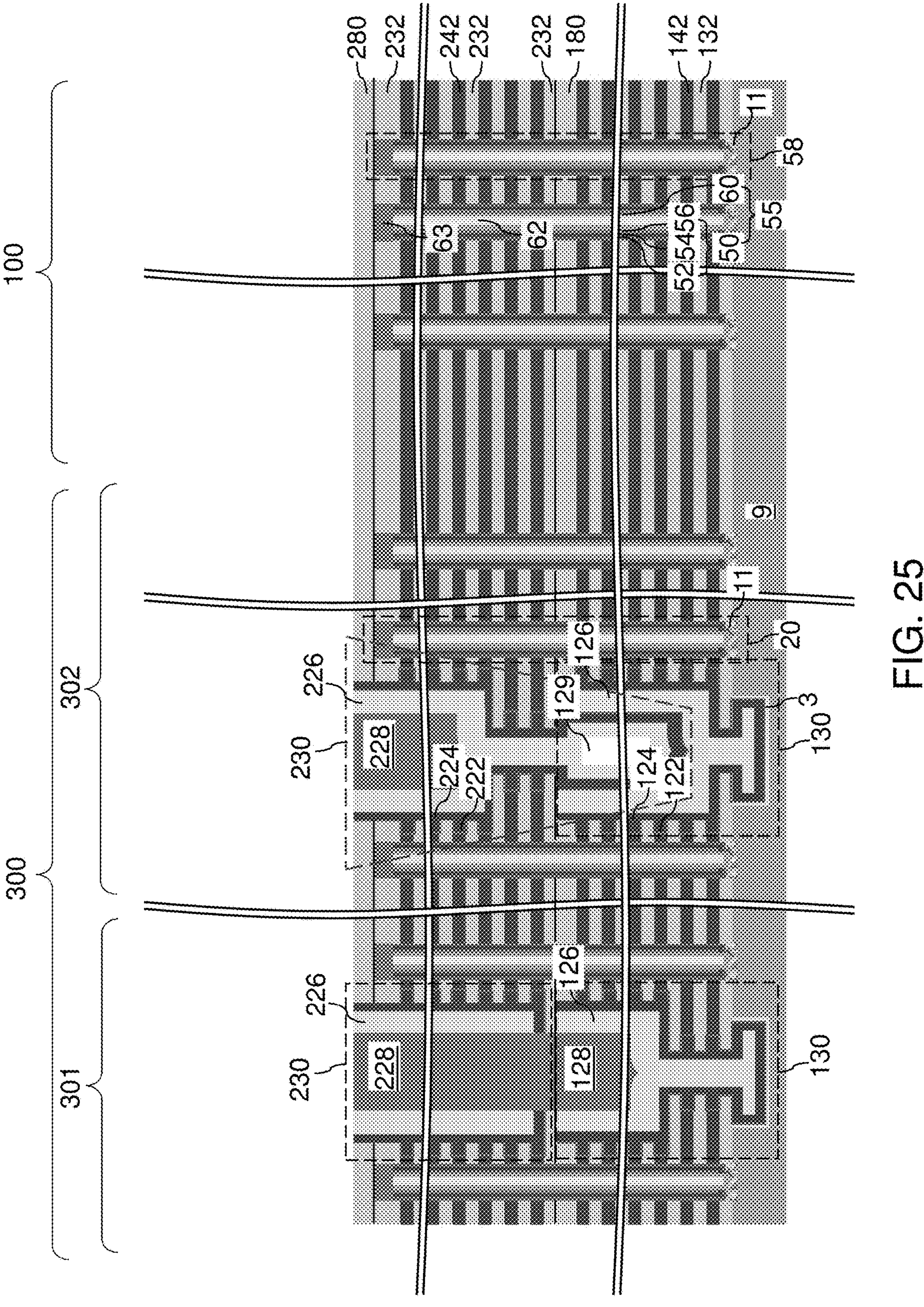
FIG. 25 is a vertical cross-sectional view of the exemplary structure after formation of in-process second-via-cavity fill structures according to an embodiment of the present disclosure.

Referring to FIG. 25 horizontally-extending portions of the second continuous dielectric material layer 224L and the second continuous dielectric liner layer 222L located above the horizontal plane including the top surface of the first contact-level dielectric layer 280 can be removed, for example, by performing at least one etch process. Optionally, segments of the second dielectric fill material portion 226 and the second sacrificial via fill material portion 228 that protrude the above the horizontal plane including the top surface of the first contact-level dielectric layer 280 can be removed, for example, by performing a touch-up planarization process, such as a chemical mechanical polishing process. Each remaining portion of the second continuous dielectric liner layer 222L constitutes a second dielectric liner 222. Each remaining portion of the second continuous dielectric material layer 224L constitutes a second dielectric material layer 224.

The set of all material portions that fills a second through-tier cavity 283 constitutes an in-process second-via-cavity fill structure 230, i.e., an in-process of fill structure that fills a respective via cavity. Each in-process second-via-cavity fill structure 230 comprises a second dielectric liner 222, a second dielectric material layer 224, a second dielectric fill material portion 226, and a second sacrificial via fill material portion 228. In one embodiment, top surfaces of the second dielectric liners 222, the second dielectric material layers 224, the second dielectric fill material portions 226, and the second sacrificial via fill material portions 228 may be formed it within the horizontal plane including the top surface of the first contact-level dielectric layer 280. Each contiguous set of a second dielectric liner 222, a second dielectric material layer 224, and a second dielectric fill material portion 226 is herein referred to as a second dielectric layer stack (222, 224, 226).

Figure 26A:
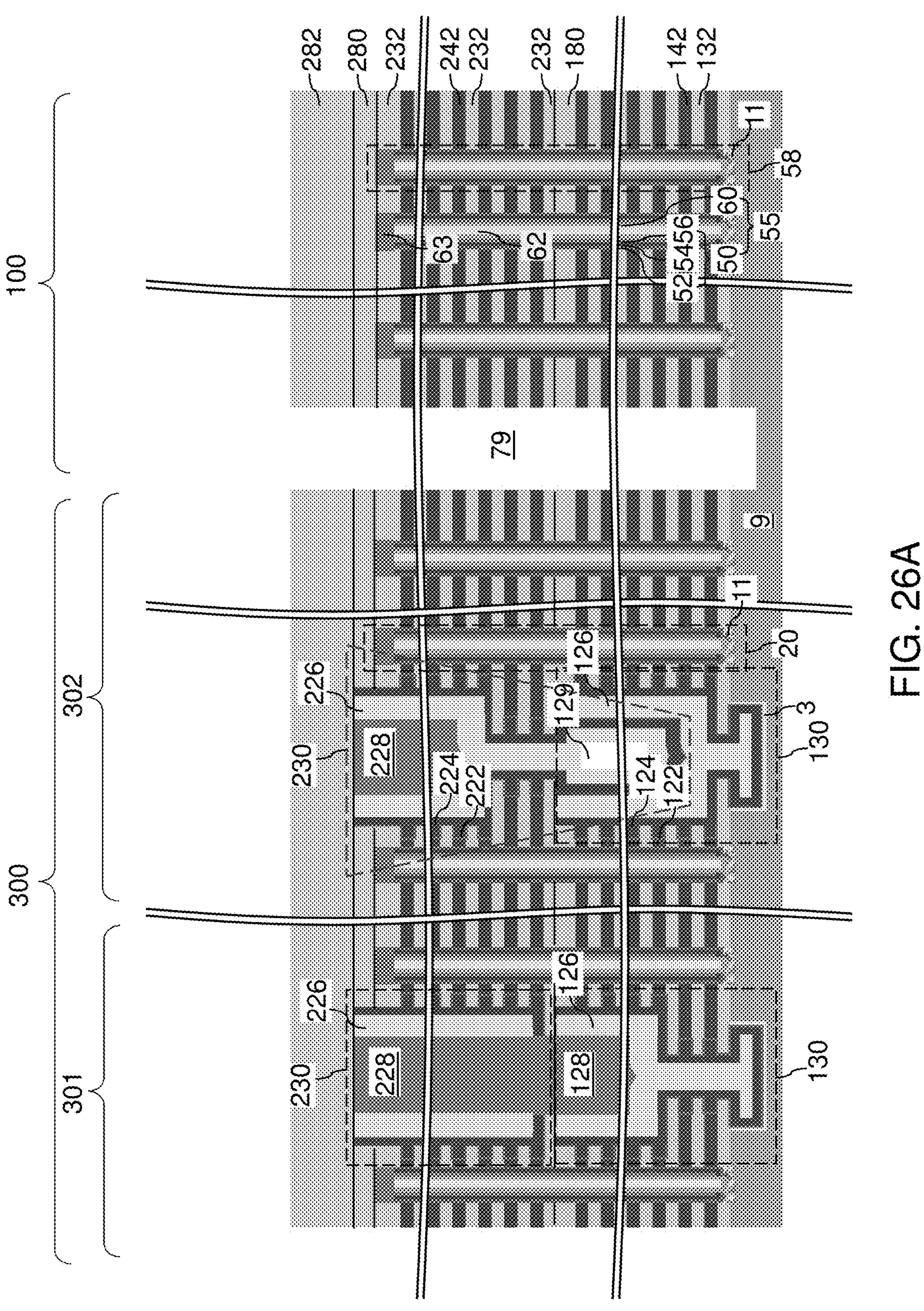
FIG. 26A is a vertical cross-sectional view of the exemplary structure after formation of a second contact-level dielectric layer and backside trenches according to an embodiment of the present disclosure.
Figure 26B:
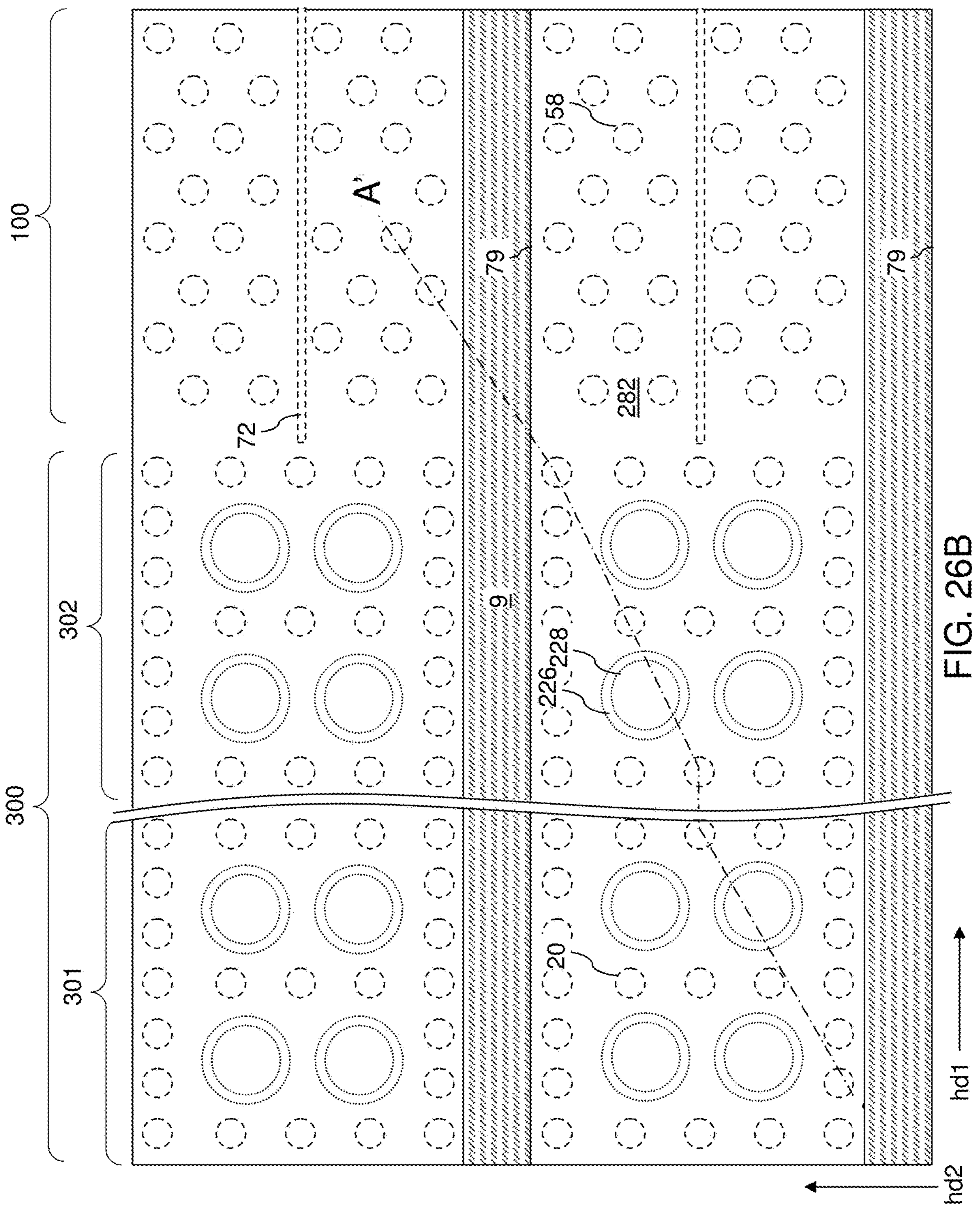
FIG. 26B is a partial see-through top-down view of the exemplary structure of FIG. 26A. The hinged vertical plane A-A' is the plane of the vertical cross-sectional view of FIG. 26A.

Referring to FIGS. 26A and 26B, a second contact-level dielectric layer 282 can be deposited over the first contact-level dielectric layer 280. The second contact-level dielectric layer 280 may comprise a dielectric material, such as undoped silicate glass or a doped silicate glass, and may have a thickness in a range from 100 nm to 1,000 nm, although lesser and greater thicknesses may also be employed.

A photoresist layer (not shown) can be applied over the second contact-level dielectric layer 282 and can be lithographically patterned to form openings within areas extending across the memory array region 100 and the contact region 300. The openings in the photoresist layer can laterally extend along the first horizontal direction hd1 between each neighboring cluster of memory opening fill structures 58. Backside trenches 79 can be formed by transferring the pattern in the photoresist layer through the contact-level dielectric layers (280, 282), the second-tier alternating stack (232, 242), and the first-tier alternating stack (132, 142), and into the substrate 9. Portions of the contact-level dielectric layers (280, 282), the second-tier alternating stack (232, 242), and the first-tier alternating stack (132, 142) that underlie the openings in the photoresist layer can be removed to form the backside trenches 79. In one embodiment, the backside trenches 79 can be formed between clusters of memory opening fill structures 58. The clusters of the memory opening fill structures 58 can be laterally spaced apart along the second horizontal direction hd2 by the backside trenches 79.

Figure 27:
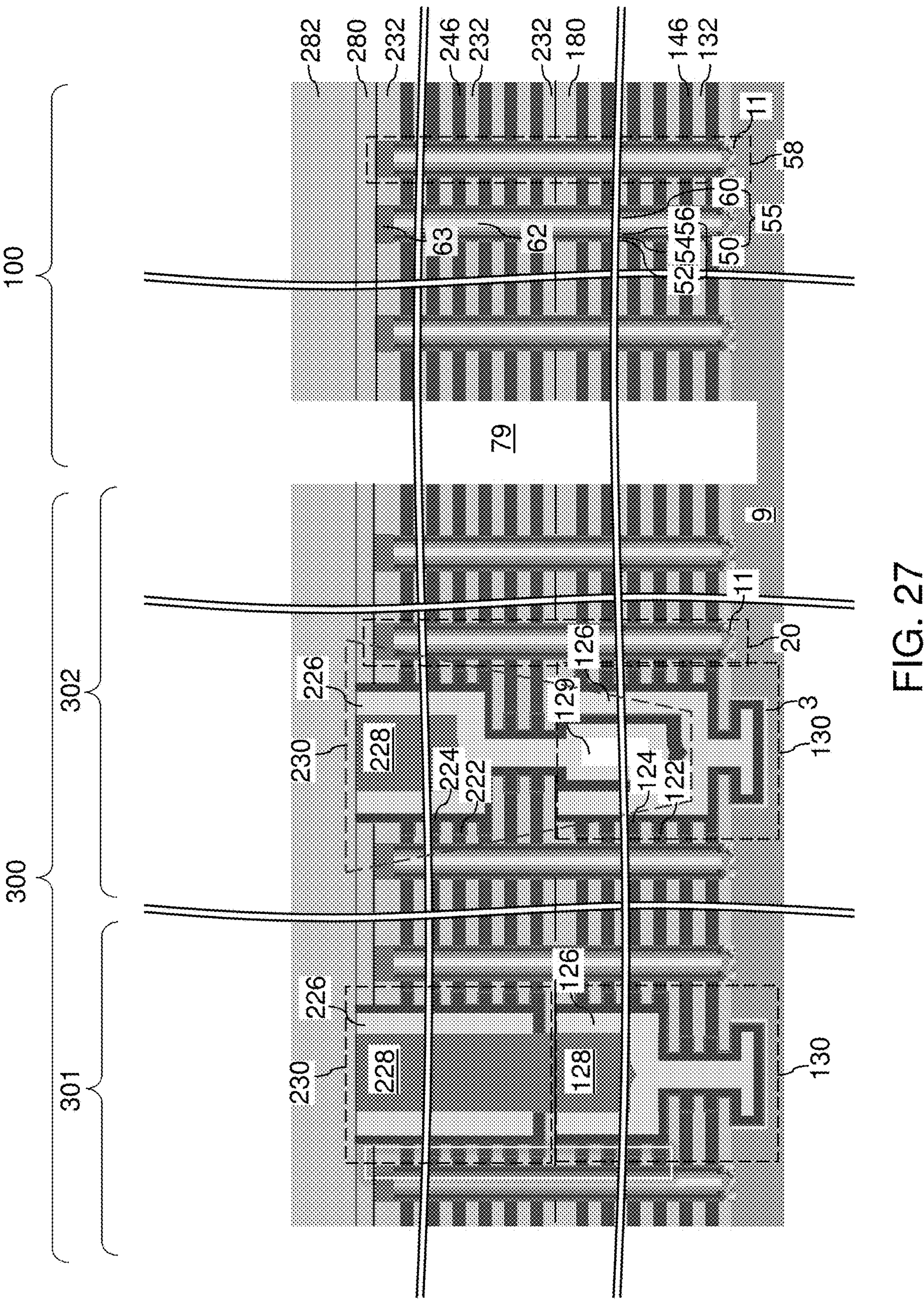
FIG. 27 is a vertical cross-sectional view of the exemplary structure after replacement of sacrificial material layers with electrically conductive layers according to an embodiment of the present disclosure.

Referring to FIG. 27 an etchant that selectively etches the materials of the first and second sacrificial material layers (142, 242) with respect to the materials of the first and second insulating layers (132, 232), and the material of the outermost layer of the memory films 50 can be introduced into the backside trenches 79, for example, employing an isotropic etch process. First backside recesses are formed in volumes from which the first sacrificial material layers 142 are removed. Second backside recesses are formed in volumes from which the second sacrificial material layers 242 are removed.

The isotropic etch process can be a wet etch process employing a wet etch solution, or can be a gas phase (dry) etch process in which the etchant is introduced in a vapor phase into the backside trenches 79. For example, if the first and second sacrificial material layers (142, 242) include silicon nitride, the etch process can be a wet etch process in which the exemplary structure is immersed within a wet etch tank including phosphoric acid, which etches silicon nitride selective to silicon oxide and silicon.

Each of the first and second backside recesses can be a laterally extending cavity having a lateral dimension that is greater than the vertical extent of the cavity. In other words, the lateral dimension of each of the first and second backside recesses can be greater than the height of the respective backside recess. A plurality of first backside recesses can be formed in the volumes from which the material of the first sacrificial material layers 142 is removed. A plurality of second backside recesses can be formed in the volumes from which the material of the second sacrificial material layers 242 is removed. Each of the first and second backside recesses can extend substantially parallel to the top surface of the substrate 9. A backside recess can be vertically bounded by a top surface of an underlying insulating layer (132 or 232) and a bottom surface of an overlying insulating layer (132 or 232). In one embodiment, each of the first and second backside recesses can have a uniform height throughout.

A backside blocking dielectric layer (not shown) can be optionally deposited in the backside recesses and the backside trenches 79 and over the contact-level dielectric layer 280. The backside blocking dielectric may comprise a dielectric metal oxide material, such as aluminum oxide. At least one conductive material can be conformally deposited in the plurality of backside recesses, on the sidewalls of the backside trench 79, and over the contact-level dielectric layer 280. The at least one conductive material can include at least one metallic material, i.e., an electrically conductive material that includes at least one metal element.

A plurality of electrically conductive layers 146 can be formed in the plurality of first backside recesses, a plurality of second electrically conductive layers 246 can be formed in the plurality of second backside recesses, and a continuous metallic material layer (not shown) can be formed on the sidewalls of each backside trench 79 and over the contact-level dielectric layer 280. Thus, the first and second sacrificial material layers (142, 242) can be replaced with the first and second conductive material layers (146, 246), respectively. Specifically, each first sacrificial material layer 142 can be replaced with an optional portion of the backside blocking dielectric layer and an electrically conductive layer 146, and each second sacrificial material layer 242 can be replaced with an optional portion of the backside blocking dielectric layer and a second electrically conductive layer 246. A backside cavity is present in the portion of each backside trench 79 that is not filled with the continuous metallic material layer.

The metallic material can be deposited by a conformal deposition method, which can be, for example, chemical vapor deposition (CVD), atomic layer deposition (ALD), electroless plating, electroplating, or a combination thereof. The metallic material can be an elemental metal, an intermetallic alloy of at least two elemental metals, a conductive nitride of at least one elemental metal, a conductive metal oxide, a conductive doped semiconductor material, a conductive metal-semiconductor alloy such as a metal silicide, alloys thereof, and combinations or stacks thereof. Non-limiting exemplary metallic materials that can be deposited in the backside recesses include tungsten, tungsten nitride, titanium, titanium nitride, tantalum, tantalum nitride, cobalt, and/or ruthenium. In one embodiment, the metallic material can comprise a metal such as tungsten and/or metal nitride. In one embodiment, the metallic material for filling the backside recesses can be a combination of titanium nitride layer and a tungsten fill material. In one embodiment, the metallic material can be deposited by chemical vapor deposition or atomic layer deposition.

The deposited metallic material of the continuous metallic material layer can be etched back from the sidewalls of each backside trench 79 and from above the contact-level dielectric layers (280, 282), for example, by an anisotropic or isotropic etch. Each remaining portion of the deposited metallic material in the first backside recesses constitutes an electrically conductive layer 146. Each remaining portion of the deposited metallic material in the second backside recesses constitutes a second electrically conductive layer 246. Each electrically conductive layer (146, 246) can be a conductive line structure (e.g., word line or select gate electrode).

Each of the memory opening fill structures 58 (which contains a respective memory stack structures 55) comprises a vertical stack of memory elements located at each level of the electrically conductive layers (146, 246). A subset of the middle electrically conductive layers (146, 246) can comprise the word lines for the memory elements. At least one uppermost electrically conductive layer 246 may comprise a drain side select gate electrode. At least one bottommost electrically conductive layer 146 may comprise a source side select gate electrode.

Figure 28:
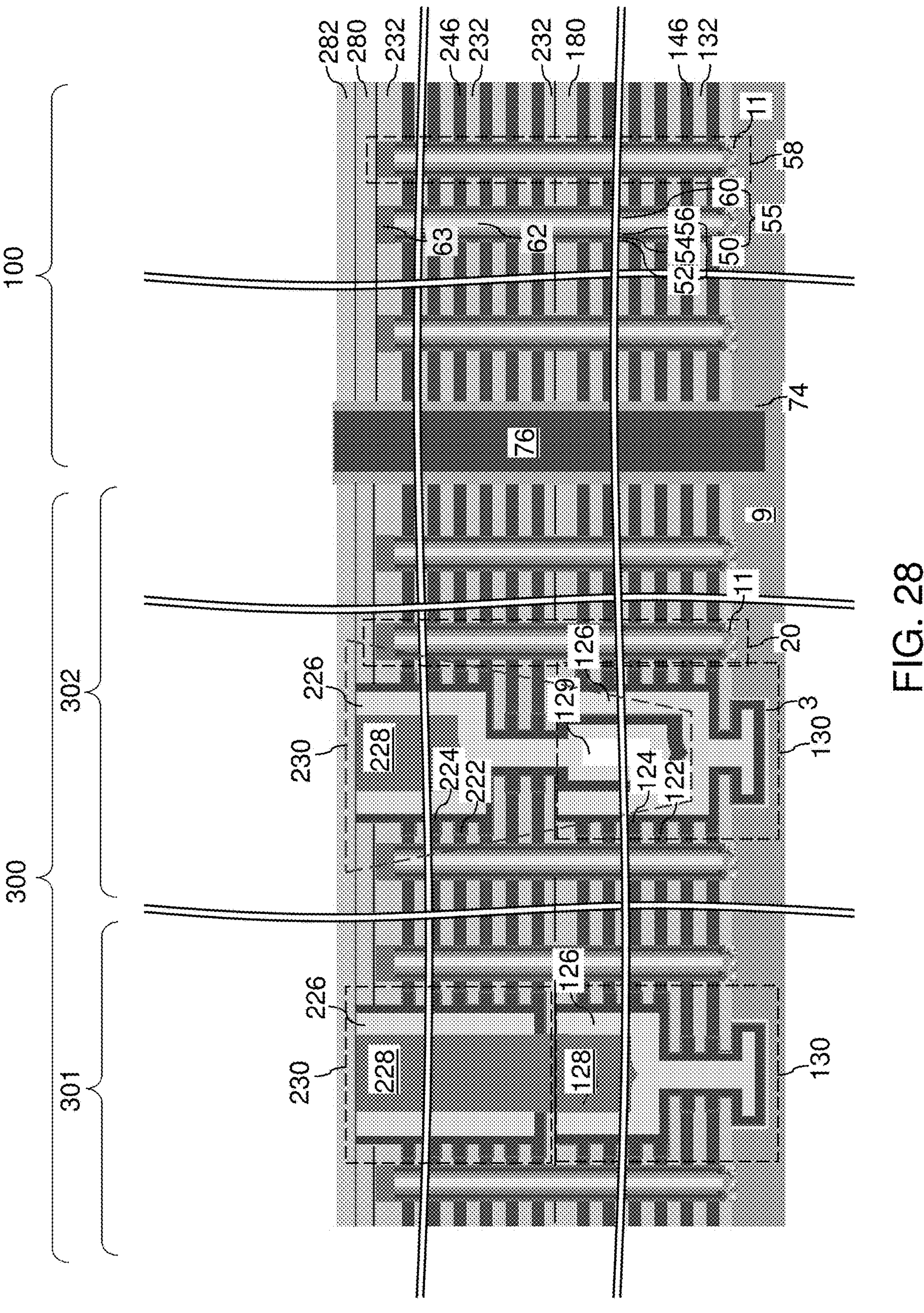
FIG. 28 is a vertical cross-sectional view of the exemplary structure after formation of backside trench fill structures according to an embodiment of the present disclosure.

Referring to FIG. 28, an insulating spacer material layer can be conformally deposited in the backside trenches 79 and over the contact-level dielectric layers (280, 282). An anisotropic etch process can be performed to remove horizontally-extending portions of the insulating spacer material layer. Each remaining vertically-extending portion of the insulating spacer material layer constitutes an insulating spacer 74.

At least one conductive material such as at least one metallic material may be deposited in the unfilled volumes of the backside trenches 79. A planarization process such as a chemical mechanical polishing process and/or a recess etch process can be performed to remove excess portions of the at least one conductive material can be removed from above the horizontal plane including the top surface of the second contact-level dielectric layer 282. In some embodiment, an upper portion of the second contact-level dielectric layer 282 may be collaterally removed during the planarization process. Each remaining portion of the at least one conductive material that is laterally surrounded by a respective insulating spacer 74 constitutes a backside contact via structure 76.

Figure 29A:
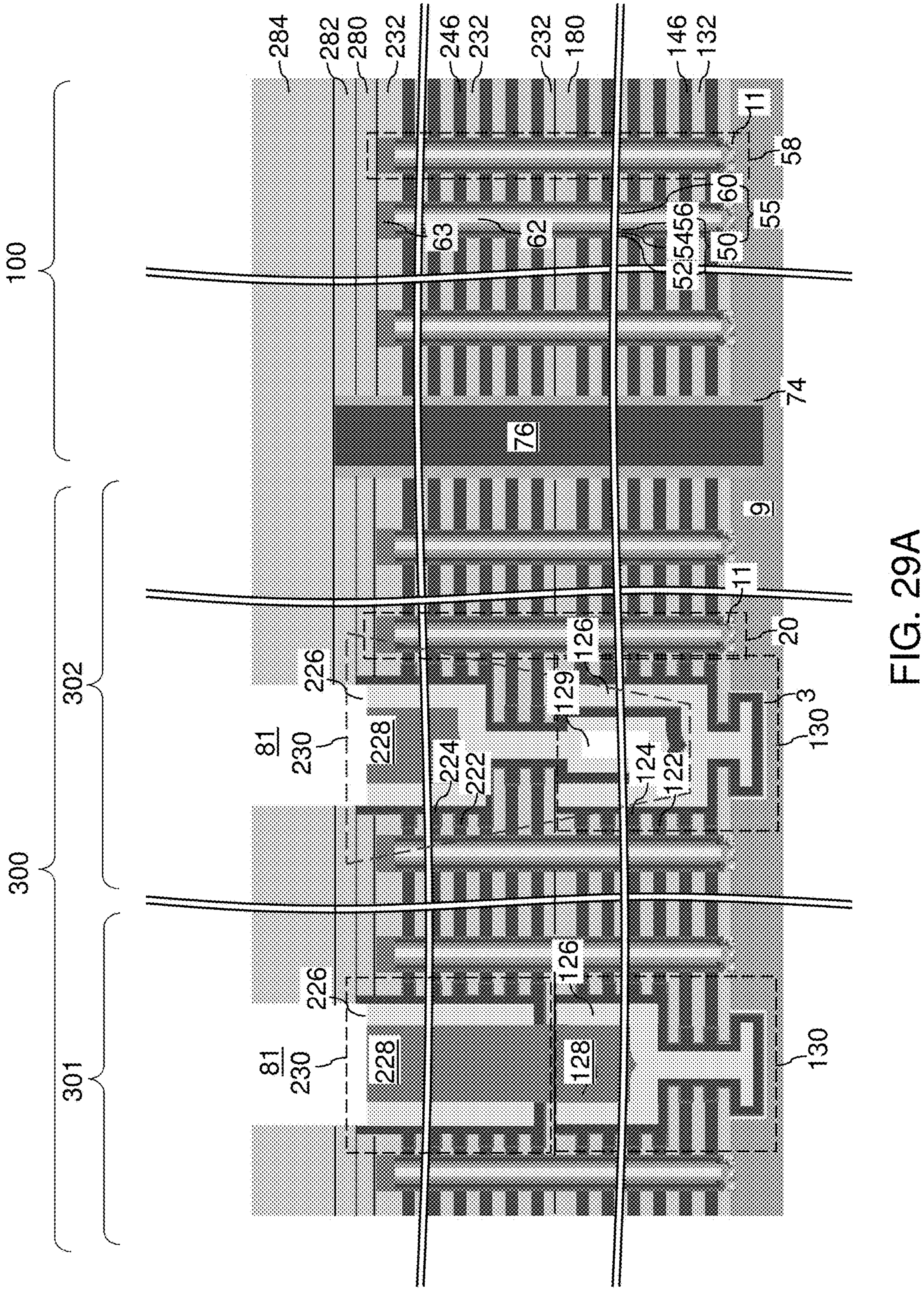
FIG. 29A is a vertical cross-sectional view of the exemplary structure after formation of a third contact-level dielectric layer and connection via cavities according to an embodiment of the present disclosure.
Figure 29B:
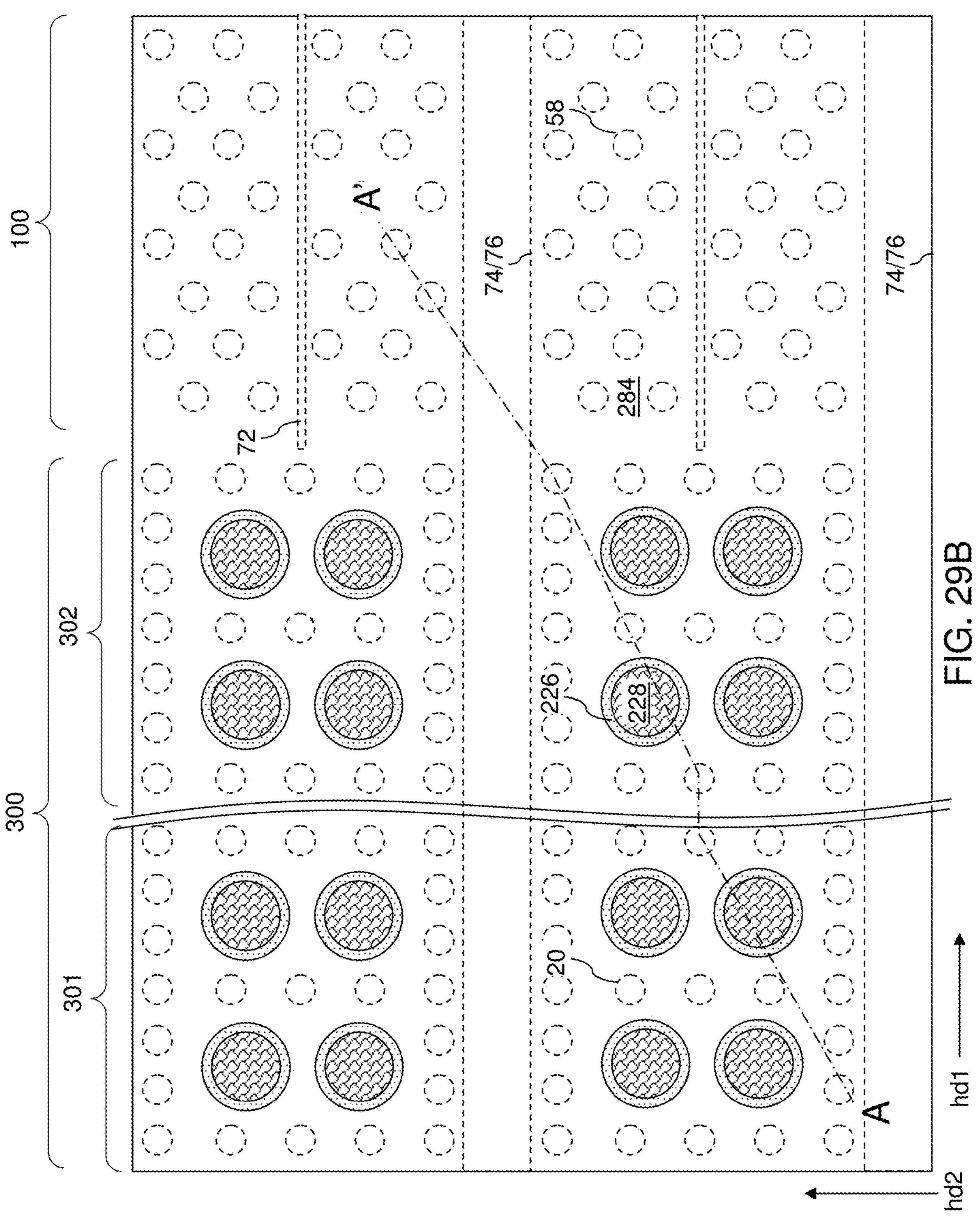
FIG. 29B is a partial see-through top-down view of the exemplary structure of FIG. 29A. The hinged vertical plane A-A' is the plane of the vertical cross-sectional view of FIG. 29A.

Referring to FIGS. 29A and 29B, a third contact-level dielectric layer 284 can be formed over the second contact-level dielectric layer 282. A photoresist layer (not shown) can be applied over the contact-level dielectric layers (280, 282, 284), and openings can be formed over the areas of the in-process second-via-cavity fill structures 230. An anisotropic etch process can be performed to etch through unmasked portions of the contact-level dielectric layers (280, 282, 284) to form connection via cavities 81 through the contact-level dielectric layers (280, 282, 284). Top surfaces of the in-process second-via-cavity fill structures 230 can be physically exposed at the bottom of the connection via cavities 81. The photoresist layer can be subsequently removed, for example, by ashing.

Figure 30:
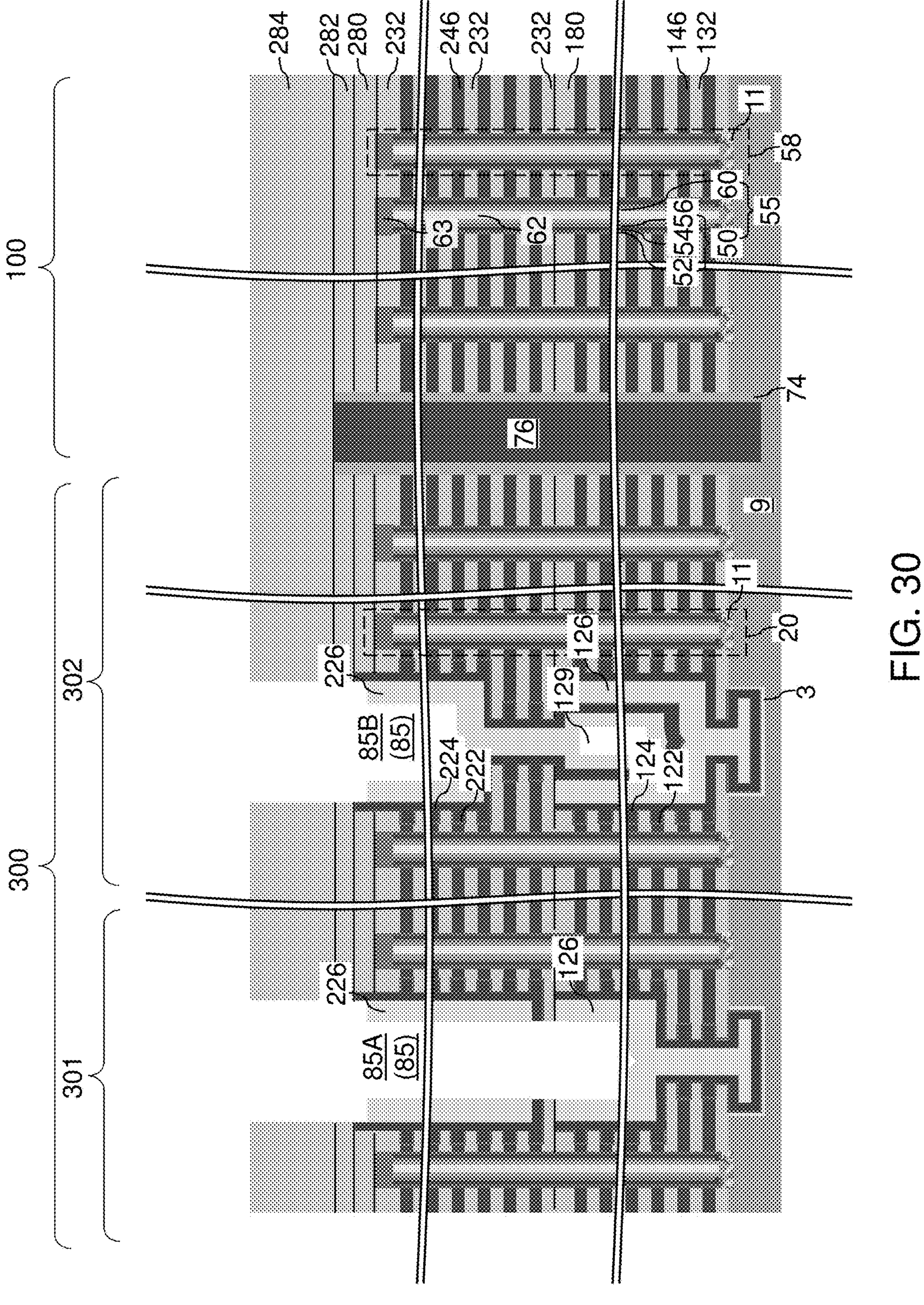
FIG. 30 is a vertical cross-sectional view of the exemplary structure after removal of second sacrificial via fill material portions and a second subset of the first sacrificial via fill material portions according to an embodiment of the present disclosure.

Referring to FIG. 30, the second sacrificial via fill material portions 228 and a second subset of the first sacrificial via fill material portions 128 that are present within the first contact region 301 of the exemplary structure illustrated in FIGS. 29A and 29B can be subsequently removed selective to materials of the contact-level dielectric layers (280, 282, 284) and the second dielectric fill material portions 226. For example, if the second sacrificial via fill material portions 228 and a second subset of the first sacrificial via fill material portions 128 comprise a semiconductor material, such as amorphous silicon, then a wet etch process employing TMY or TMAH may be employed to remove the second sacrificial via fill material portions 228 and a second subset of the first sacrificial via fill material portions 128.

Contact via cavities 85 are formed in volumes from which the second sacrificial via fill material portions 228 and the second subset of the first sacrificial via fill material portions 128 are removed. A first subset of the contact via cavities 85 located in the first contact region 301 is referred to as first contact via cavities 85A. A second subset of the contact via cavities 85 located in the second contact region 302 is referred to as second contact via cavities 85B. Each of the first contact via cavities 85A can be laterally surrounded by a respective first dielectric fill material portion 126 and a respective second dielectric fill material portion 226. Each of the second contact via cavities 85B can be laterally surrounded by a respective second dielectric fill material portion 226.

Figure 31:
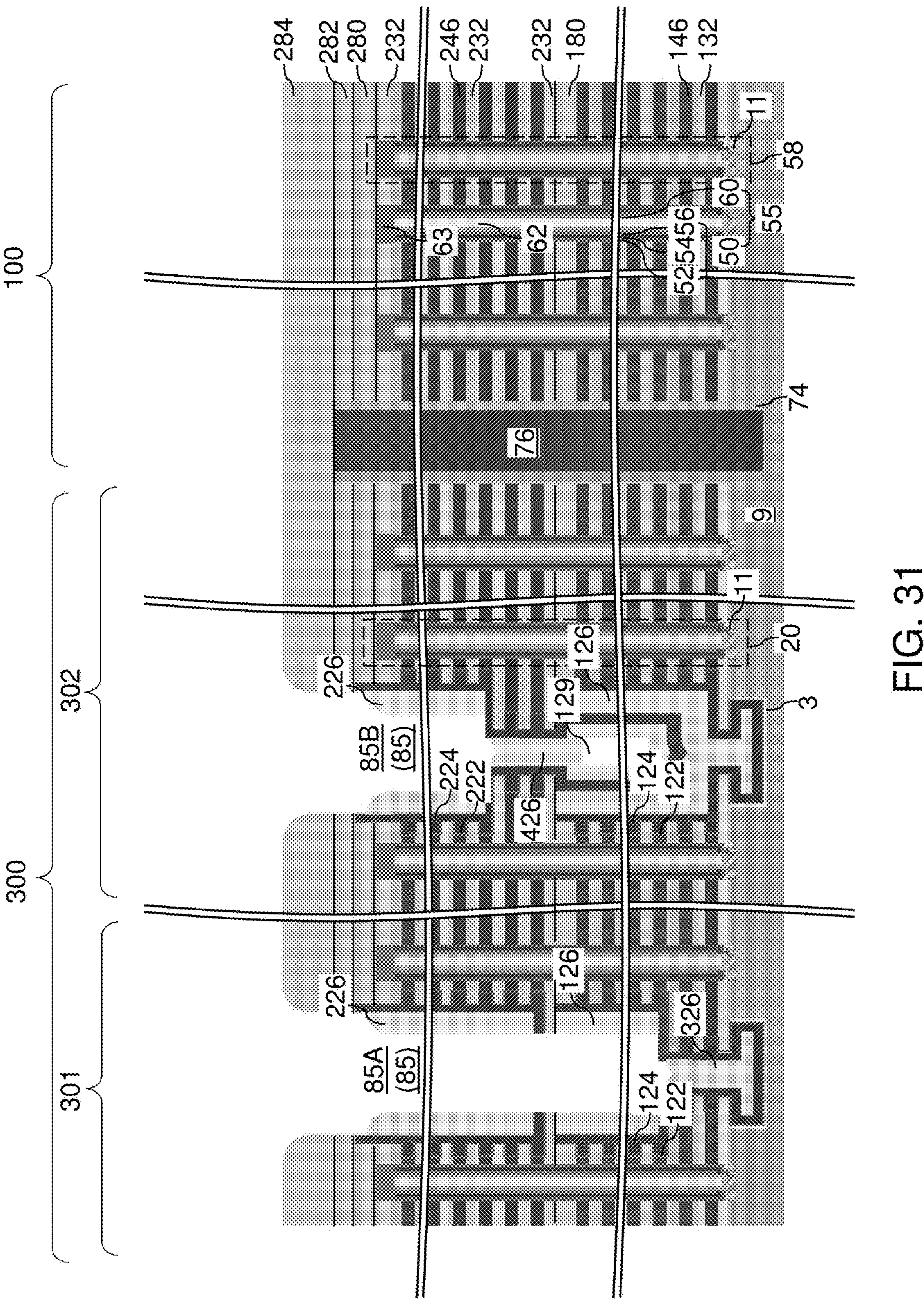
FIG. 31 is a vertical cross-sectional view of the exemplary structure after performing a first anisotropic etch process that removes horizontally-extending portions of the second dielectric fill material layer and first dielectric fill material layer according to an embodiment of the present disclosure.

Referring to FIG. 31, a first anisotropic etch process can be performed to vertically recess physically exposed horizontal surfaces of the first dielectric fill material portions 126 and the second dielectric fill material portions 226. The third contact-level dielectric layer 284 can be collaterally vertically recessed during the anisotropic etch process. An annular top surface of a first dielectric material layer 124 can be physically exposed underneath each first contact via cavity 85A. An annular top surface of a second dielectric material layer 224 can be physically exposed underneath each second contact via cavity 85B. Each remaining portion of the first dielectric fill material portions 126 that underlies a respective first contact via cavity 85A is herein referred to as a pillar fill dielectric material portion 326. Each remaining portion of the second dielectric fill material portions 226 that underlies all a respective second contact via cavity 85B is herein referred to as an inner dielectric fill material portion 426. Each inner dielectric fill material portion 426 can vertically extended through a subset of the first electrically conductive layers 146 and the at least one second electrically conductive layer 246 including the bottommost second electrically conductive layer 246.

Figure 32:
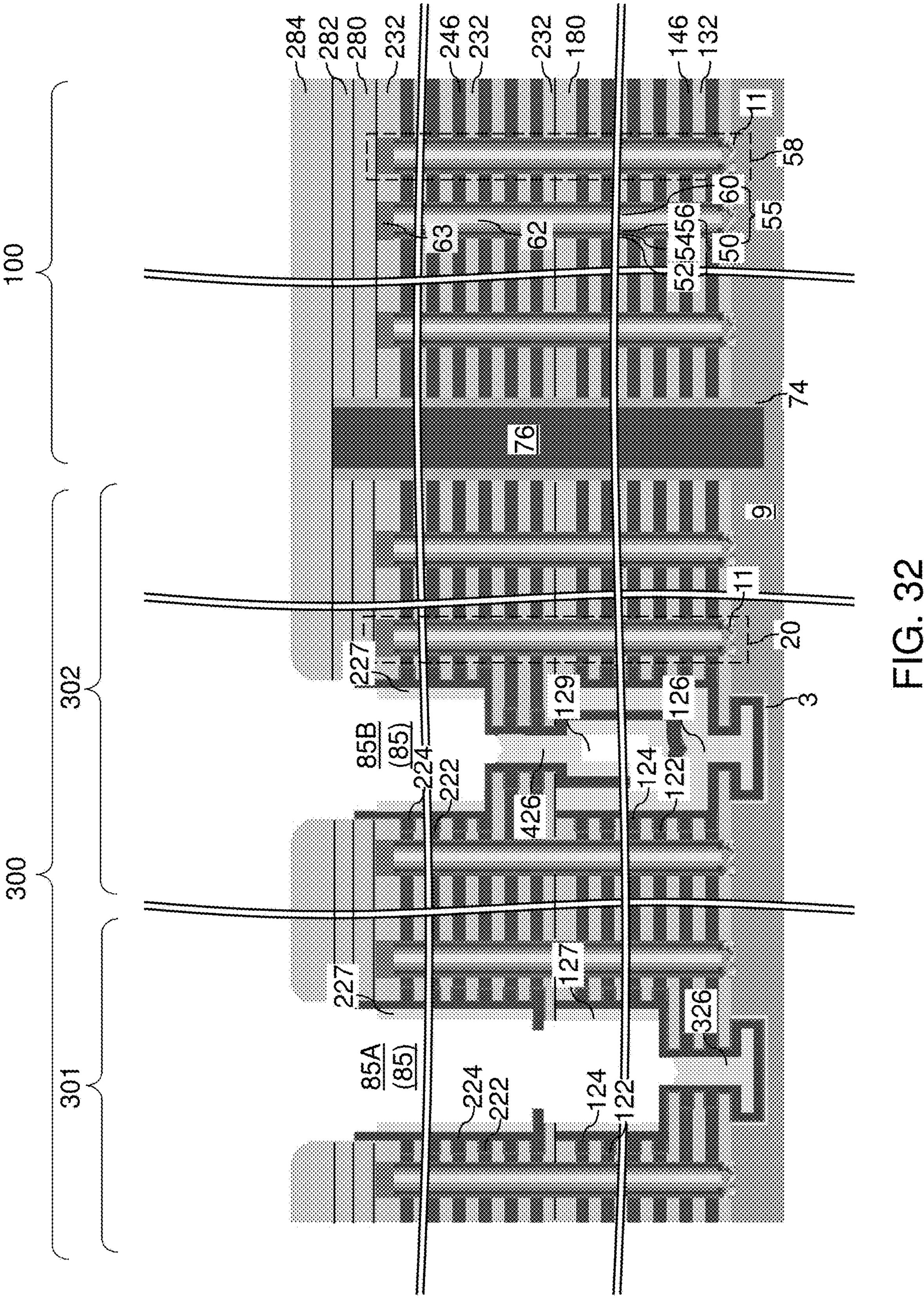
FIG. 32 is a vertical cross-sectional view of the exemplary structure after performing an isotropic etch process that isotropically recesses remaining portions of the second dielectric fill material layer and first dielectric fill material layer according to an embodiment of the present disclosure.

Referring to FIG. 32, an isotropic etch process can be performed to isotropically recess physically exposed surfaces of the first dielectric fill material portions 126 and the second dielectric fill material portions 226. Physically exposed as surfaces of the contact-level dielectric material layers (280, 282, 284) may be collaterally recessed during the isotropic etch process. In one embodiment, the first dielectric fill material portions 126 and the second dielectric fill material portions 226 may comprise a silicate glass material having a high etch rate (such as a doped silicate glass or organosilicate glass) and the contact-level dielectric material layers (280, 282, 284) may comprise a silicate glass material having a low etch rate (such as undoped silicate glass). In this case, the etch rate of the contact-level dielectric material layers (280, 282, 284) can be lower than the etch rate of the first dielectric fill material portions 126 and the second dielectric fill material portions 226. The duration of the isotropic etch process is selected such that a tubular portion of each of the first dielectric fill material portions 126 and the second dielectric fill material portions 226 remains around the respective contact via cavity 85 after the isotropic etch process. Each remaining tubular portion of the first dielectric fill material portions 126 around a bottom portion of a respective first contact via cavity 85A is herein referred to as a first tubular dielectric material portion 127. Each remaining tubular portion of the second dielectric fill material portions 226 around the respective contact via cavity 85 is herein referred to as a second tubular dielectric material portion 227.

Each of the second dielectric material layers 224 laterally surrounding a respective one of the first contact via cavities 85A may have an annular bottom portion having a physically exposed annular top surface, a physically exposed annular bottom surface, and a physically exposed a cylindrical sidewall. Each second tubular dielectric material portion 227 may be in contact with an inner cylindrical sidewall of a respective second dielectric material layer 224. Each first tubular dielectric material portion 227 located a around a respective one of the first contact via cavity 85A may be in contact with an inner cylindrical sidewall of a respective first dielectric material layer 124.

Figure 33:
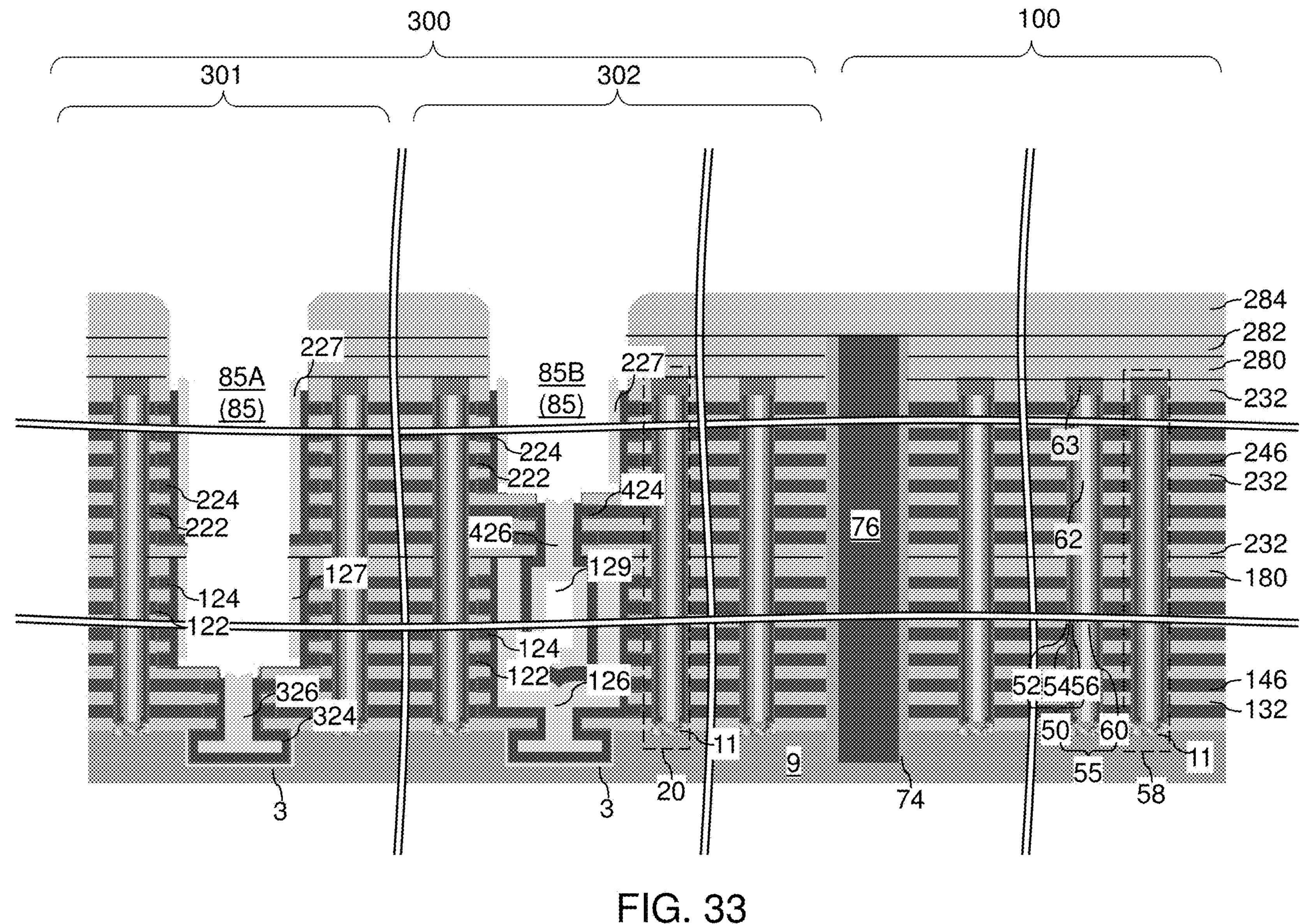
FIG. 33 is a vertical cross-sectional view of the exemplary structure after performing a second anisotropic etch process that removes horizontally-extending portions of the second dielectric material layers and the first dielectric material layers according to an embodiment of the present disclosure.

Referring to FIG. 33, a second anisotropic etch process can be performed to remove unmasked horizontally-extending portions of the second dielectric material layers 224 and the first dielectric material layers 124. Alternatively, an isotropic etch process may be used instead. Each remaining portion of the first dielectric material layers 124 located underneath a respective first contact via cavity 85A is herein referred to as a pillar dielectric material layer 324. Each remaining portion of the second dielectric material layers 224 located underneath a respective second contact via cavity 85B is herein referred to as an inner dielectric material layer 424. Each inner dielectric material layer 424 can be laterally surrounded by a respective first dielectric fill material portion 126 that underlies a second contact via cavity 85B, and may laterally surround a respective inner dielectric material portion 426.

In one embodiment, bottom portions of the first dielectric material layers 124 and the second dielectric material layers 224 may be laterally recessed outward relative to the inner sidewalls of a respective overlying first dielectric fill material portion 126 or relative to the inner sidewalls of a respective overlying second dielectric fill material portion 226. In this case, an annular recess may be formed underneath the first dielectric fill material portions 126 and underneath the second dielectric fill material portions 226, which can be subsequently filled with a laterally-protruding annular portion of a respective contact via structure.

Figure 34:
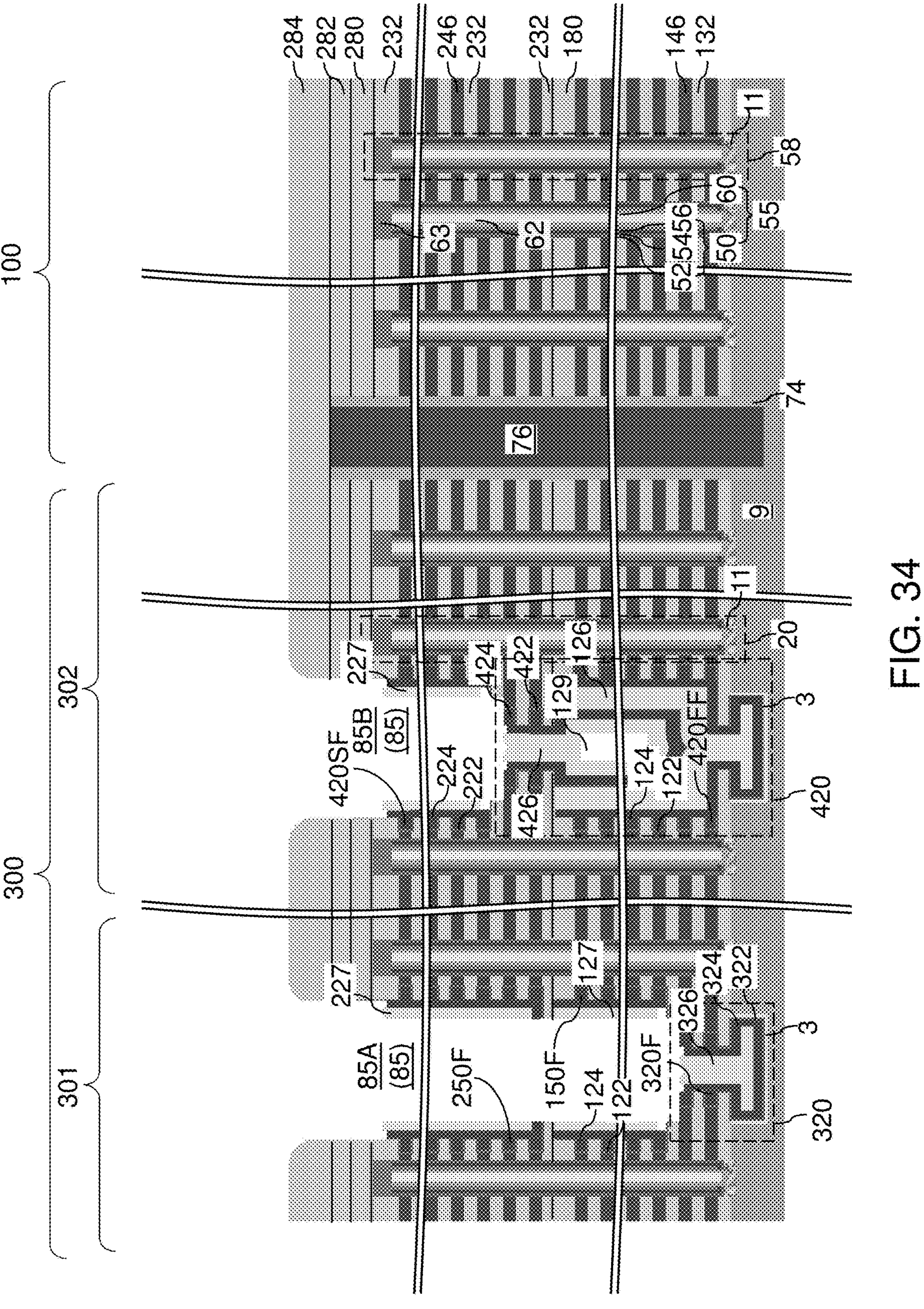
FIG. 34 is a vertical cross-sectional view of the exemplary structure after performing an etch process that removes horizontally-extending portions of the second dielectric liners and the first dielectric liners according to an embodiment of the present disclosure.

Referring to FIG. 34, an etch process can be performed to remove physically exposed portions of the first dielectric liners 122, the second dielectric liners 222 and the optional backside blocking dielectric layer (if present). An anisotropic etch process and/or an isotropic etch process may be performed. Each of the first electrically conductive layers 146 may have a respective annular top surface that is a physically exposed to a respective first contact via cavity 85A. Each of the second electrically conductive layers 246 may have a respective annular top surface that is physically exposed to a respective second contact via cavity 85B.

In one embodiment, each first dielectric liner 122 around the first contact via cavities 85A can be divided into two discrete portions by the etch process. In this case, each remaining portion of a first dielectric liner 122 that underlies a respective first contact via cavity 85A is herein referred to as a pillar dielectric liner 322. In one embodiment, each second dielectric liner 222 around the second contact via cavities 85B can be divided into two discrete portions by the etch process. In this case, each remaining portion of a second dielectric liner 222 that underlies a respective second contact via cavity 85B is herein referred to as an inner dielectric liner 422.

Each contiguous combination of a substrate dielectric liner 3 (which can be optional), a pillar dielectric liner 322, a pillar dielectric material layer 324, and a pillar fill dielectric material portion 326 that underlies a respective first contact via cavity 85A constitutes a first dielectric pillar structure 320. Each contiguous combination of a substrate dielectric liner 3 (which can be optional), a first dielectric liner 122, a first dielectric material layer 124, a first dielectric fill material portion 126, an inner dielectric liner 422, an inner dielectric material layer 424, an inner dielectric fill material portion 426, and an optional air gap 129 that underlies a respective second contact via cavity 85B constitutes a second dielectric pillar structure 420.

Each contiguous combination of a first dielectric liner 122, a first dielectric material layer 124, and a first tubular dielectric material portion 127 around a first contact via cavity 85A constitutes a first-tier dielectric spacer (122, 124, 127). Each contiguous combination of a second dielectric liner 222, a second dielectric material layer 224, and a second tubular dielectric material portion 227 around a contact via cavity 85 constitutes a second-tier dielectric spacer (222, 224, 227).

At least one of the first dielectric pillar structures 320 may comprise at least one first laterally-protruding fin portion 320F that protrudes outward at each level of a respective first subset of the first electrically conductive layers 146. In one embodiment, the first-tier dielectric spacer (122, 124, 127) comprises at least one first laterally-protruding fin portion 150F that protrudes outward at each level of a second subset of the first electrically conductive layers 146. The second-tier dielectric spacer (222, 224, 227) comprises at least one first laterally-protruding fin portion 250F that protrudes outward at each level of the second electrically conductive layers 246. At least one of the second dielectric pillar structures 420 may comprise first laterally-protruding fin portions 420FF that protrude outward at each level of the first electrically conductive layers 146 and in at least one second laterally-protruding fin portion 420SF that protrudes outward at each level of a respective first subset of the second electrically conductive layers 246.

In one embodiment, each first-tier dielectric spacer (122, 124, 127) is not in direct contact with a respective underlying first dielectric pillar structure 320, and may vertically extend through each first electrically conductive layer 146 within a respective second subset of the first electrically conductive layers 146. In one embodiment, each second-tier dielectric spacer (222, 224, 227) around a respective first contact via cavity 85A is not in direct contact with a respective underlying first-tier dielectric spacer (122, 124, 127), and may vertically extend through each second electrically conductive layer 246. In one embodiment, each second-tier dielectric spacer (222, 224, 227) around a respective second contact via cavity 85B is not in direct contact with a respective underlying second dielectric pillar structure 420, and may vertically extend through each second electrically conductive layer 246 within a respective second subset of the second electrically conductive layers 246.

Figure 35A:
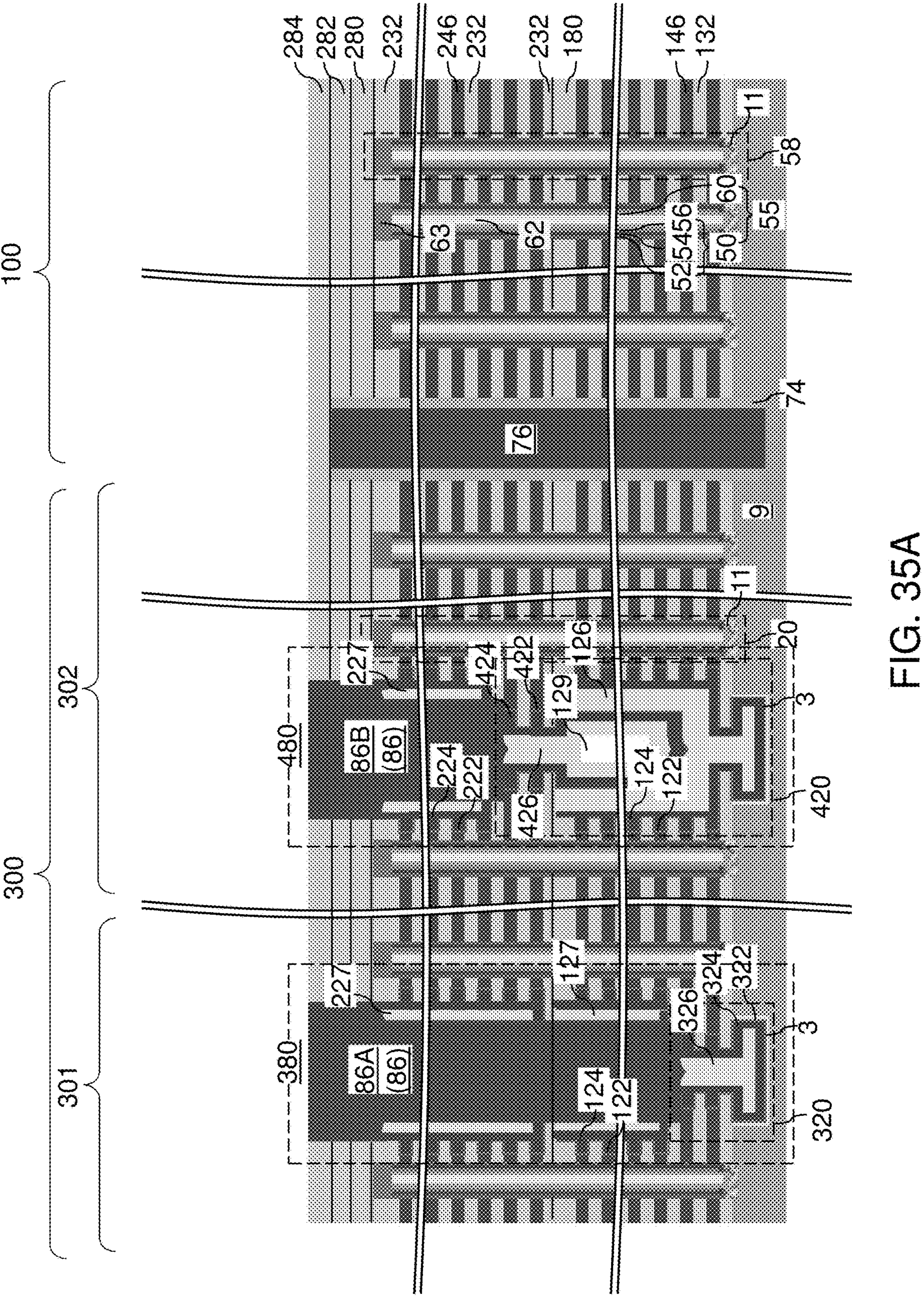
FIG. 35A is a vertical cross-sectional view of the exemplary structure after formation of contact via structures on physically exposed annular surfaces of the electrically conductive layers according to an embodiment of the present disclosure.
Figure 35B:
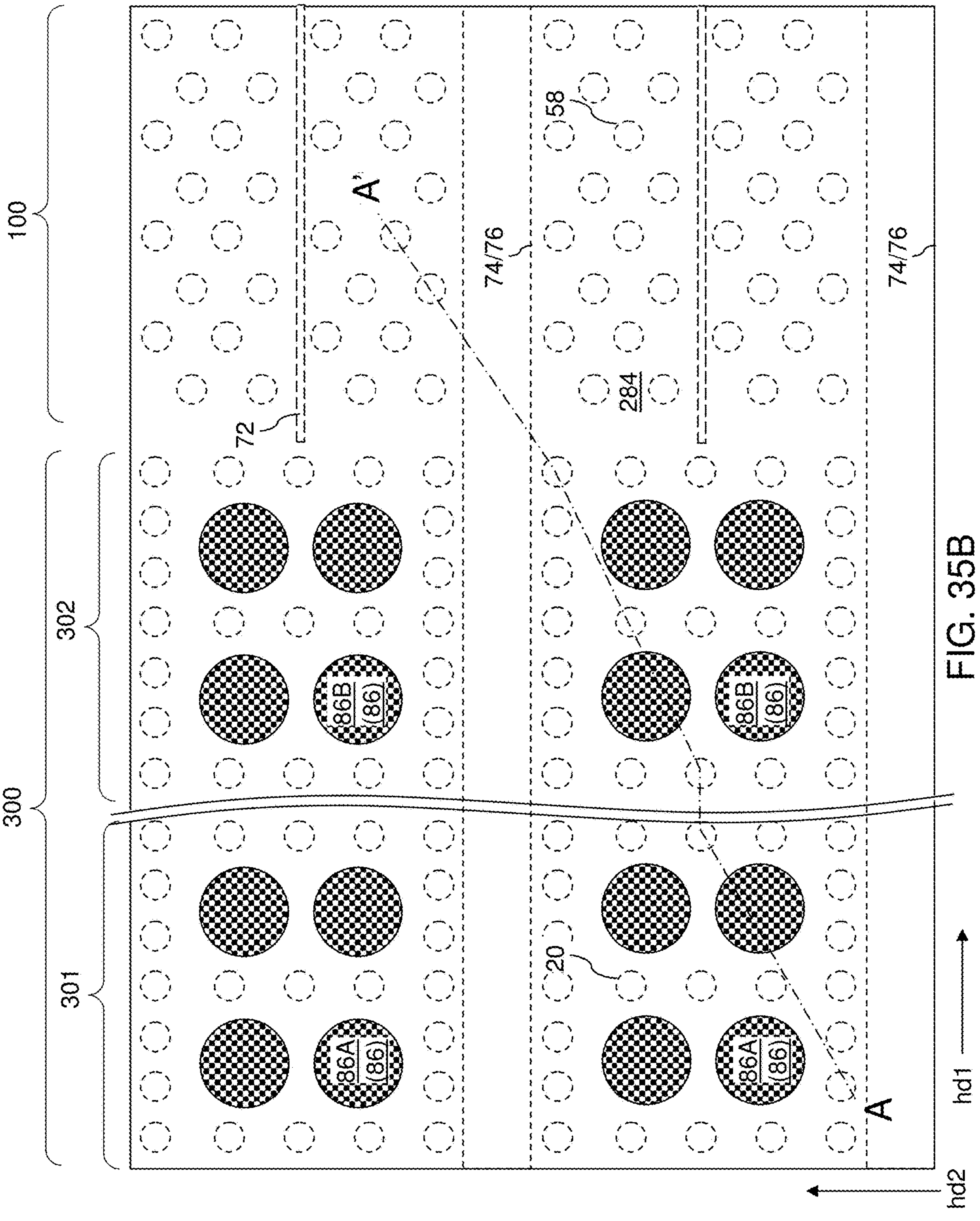
FIG. 35B is a partial see-through top-down view of the exemplary structure of FIG. 35A. The hinged vertical plane A-A' is the plane of the vertical cross-sectional view of FIG. 35A.

Referring to FIGS. 35A and 35B, at least one conductive material can be deposited in each of the first contact via cavities 85A and the second contact via cavities 85B. The at least one conductive material may comprise a metallic barrier liner and a metallic fill material. The metallic barrier liner may comprise a conductive metallic barrier material such as TiN, TaN, WN, MoN, TiC, TaC, and/or WC. The metallic fill material may comprise a metal or an intermetallic alloy such as Ti, Ta, W, Mo, Co, Ru, W, Cu, etc. Excess portions of the at least one conductive material can be removed from above the horizontal plane including the top surface of the third contact-level dielectric layer 284 by performing a planarization process. The planarization process may employ a chemical mechanical polishing process or recess etch process. Each remaining portion of the at least one conductive material that fills a respective first contact via cavity 85A constitutes a first contact via structure 86A. Each remaining portion of the at least one conductive material that fills a respective second contact via cavity 85B constitutes a second contact via structure 86B. The first contact via structures 86A and the second contact via structures 86B are herein collectively referred to as contact via structures 86.

Each contiguous combination of a first dielectric pillar structure 320, a first-tier dielectric spacer (122, 124, 127), a second-tier dielectric spacer (222, 224, 227), and a first contact via structure 86A constitutes a first support and contact assembly 380 located in the first contact region 301. Each contiguous combination of a second dielectric pillar structure 420, a second-tier dielectric spacer (222, 224, 227) (which may be referred to as a dielectric spacer or as an additional dielectric spacer), and a second contact via structure 86B constitutes a second support and contact assembly 480 in the second contact region 302. Each of the support and contact assemblies (380, 480) provides an electrical contact to a respective electrically conductive layer (146, 246).

Figure 36:
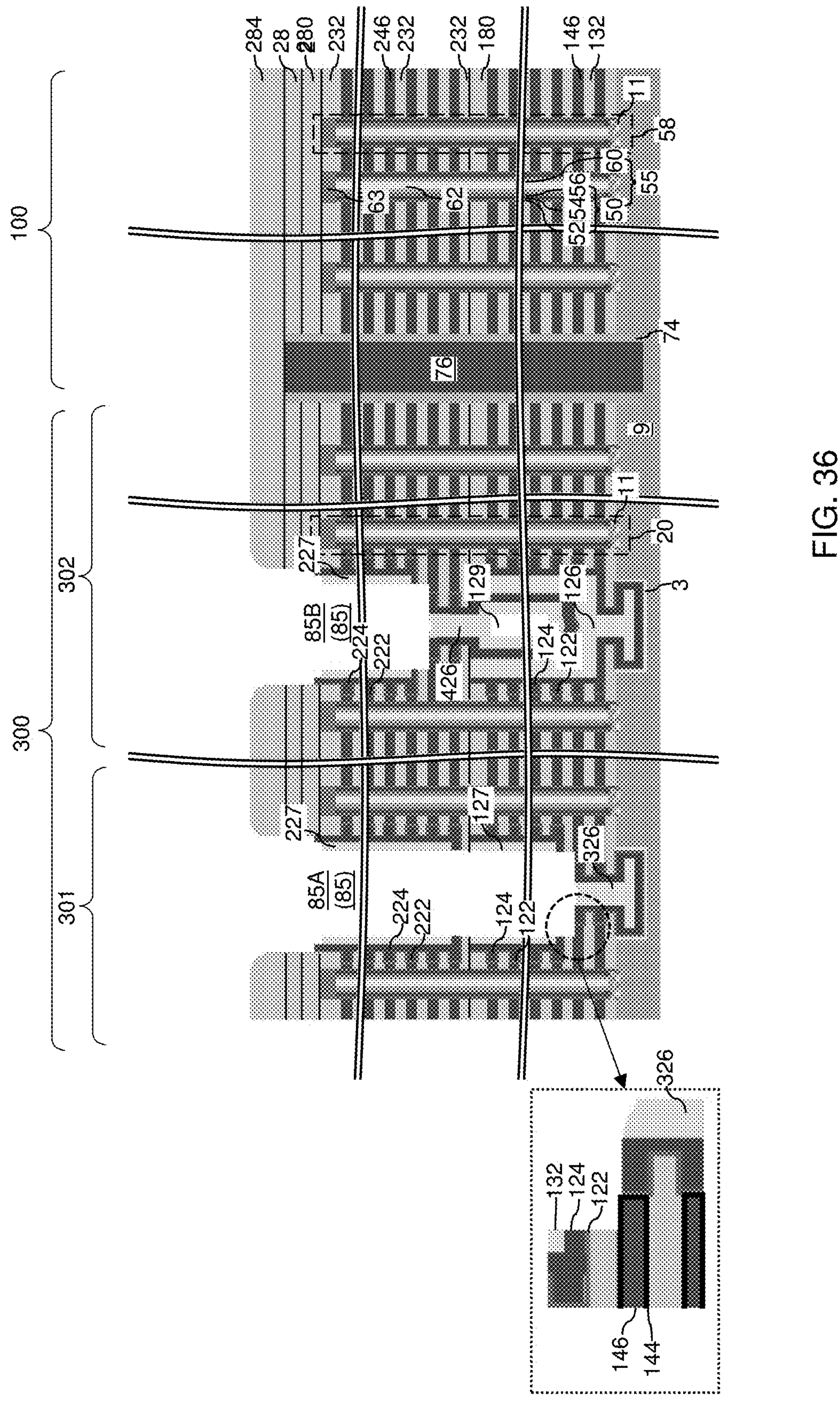
FIGS. 36, 37 and 38 are vertical cross-sectional views of the exemplary structure according to an alternative embodiment of the present disclosure.

FIG. 36 illustrates an alternative exemplary structure according to an alternative embodiment of the present disclosure. In the alternative embodiment, the etch steps shown in FIGS. 33 and 34, etch through the first dielectric liner 122, the first dielectric material layer 124, and the exposed first insulating material layer 132 to expose the first backside blocking dielectric layer 144 located over the respective first electrically conductive layer 146, as shown in the inset in FIG. 36. The etch steps also etch through the second dielectric liner 222, the second dielectric material layer 224, and the exposed second insulating material layer 232 to expose the second backside blocking dielectric layer (not shown for clarity) located over the respective second electrically conductive layer 246.

Figure 37:
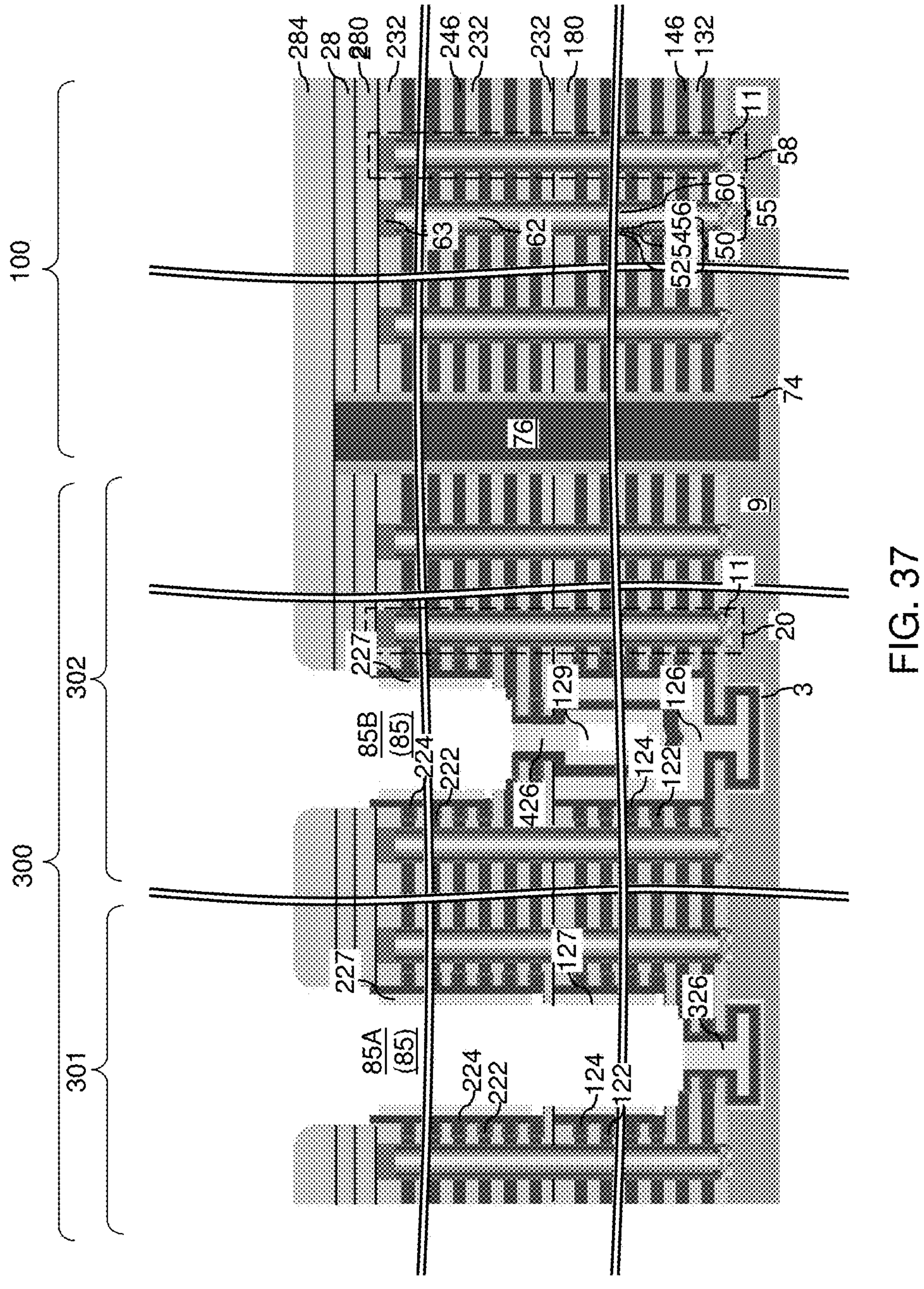

Referring to FIG. 37, the portions of the first and backside blocking dielectric layers exposed in the contact via cavities 85 may be removed by an etching process to expose a surface of an underlying electrically conductive layer (146, 246). If the backside blocking dielectric layers comprise aluminum oxide, then the etching process may comprise a hot phosphoric acid etch process.

Figure 38:
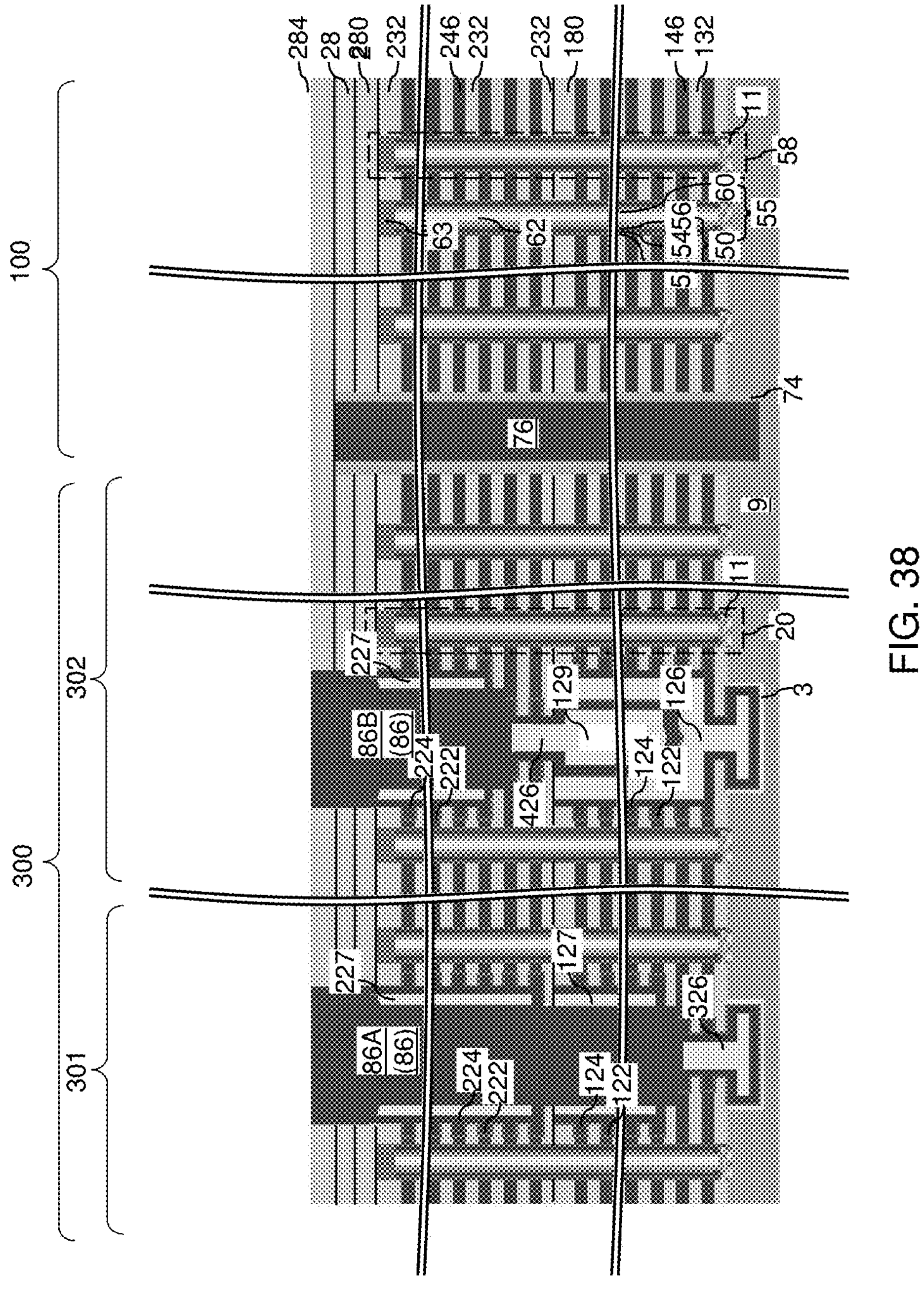

Referring to FIG. 38, the contact via structures 86 are formed in the contact via cavities 85 as described above with respect to FIGS. 35A and 35B. The process of the alternative embodiment of FIGS. 36-38 is advantageous if the etching process of FIG. 33 does not provide sufficient space between the electrically conductive layers (146, 246) and the contact via structures 86.

Referring collectively to all drawings and according to various embodiments of the present disclosure, a memory device comprises: a first-tier alternating stack (132, 146) of first insulating layers 132 and first electrically conductive layers 146 located over a substrate 9; a second-tier alternating stack (232, 246) of second insulating layers 232 and second electrically conductive layers 246 overlying the first-tier alternating stack (132, 146); memory openings 49 vertically extending through the first-tier alternating stack (132, 146) and the second-tier alternating stack (232, 246); memory opening fill structures 58 located in the memory openings 49, wherein each of the memory opening fill structures 58 comprises a vertical semiconductor channel 60 and respective vertical stack of memory elements (e.g., portions of the memory film 50); and a first support and contact assembly 380 vertically extending through the first-tier alternating stack (132, 146) and the second-tier alternating stack (232, 246). The first support and contact assembly 380 comprises a first contact via structure 86A contacting an annular top surface of a first reference electrically conductive layer 146 that is one of the first electrically conductive layers 146 of the first-tier alternating stack (132, 146) and having a top surface located above a horizontal plane including a topmost surface of the second-tier alternating stack (232, 246); a first dielectric pillar structure 320 having at least one first laterally-protruding fin portion 320F that protrudes outward at each level of a first subset of the first electrically conductive layers 146 that underlies the first reference electrically conductive layer 146; and a first-tier dielectric spacer (122, 124, 127) that laterally surrounds the first contact via structure 86A, is not in direct contact with the first dielectric pillar structure 320, and vertically extending through each first electrically conductive layer 146 within a second subset of the first electrically conductive layers 146 that overlies the first reference electrically conductive layer 146.

As used herein, a "reference" layer refers to a layer that is selected as a reference among multiple layers having similar characteristics. Thus, for each first contact via structure 86A in the exemplary structure, there exists one first electrically conductive layer 146 that is in direct contact with the first contact via structure 86A. The first electrically conductive layer 146 that is in direct contact with the first contact via structure 86A becomes a reference first electrically conductive layer 146 for that first contact via structure 86A. Likewise, the second electrically conductive layer 246 that is in direct contact with a second contact via structure 86B becomes a reference second electrically conductive layer 246 for that second contact via structure 86B.

In one embodiment, the memory device further comprises a second-tier dielectric spacer (222, 224, 227) that laterally surrounds the first contact via structure 86A, and is in contact with each of the second electrically conductive layers 246. In one embodiment, the second-tier dielectric spacer (222, 224, 227) is not in direct contact with the first-tier dielectric spacer (122, 124, 127).

In one embodiment, the first-tier dielectric spacer (122, 124, 127) comprises at least one first laterally-protruding fin portion 150F that protrudes outward at each level of a second subset of the first electrically conductive layers 146. The second-tier dielectric spacer (222, 224, 227) comprises at least one first laterally-protruding fin portion 250F that protrudes outward at each level of the second electrically conductive layers 246.

In one embodiment, the second-tier dielectric spacer (222, 224, 227) comprises an annular bottom surface in contact with a top surface of a bottommost second insulating layer 232 of the second insulating layers 232. In one embodiment, a topmost surface of the first-tier dielectric spacer (122, 124, 127) contacts a bottom surface of a bottommost second insulating layer 232 of the second insulating layers 232.

In one embodiment, the first dielectric pillar structure 320 comprises: a pillar dielectric liner 322 vertically extending through each first electrically conductive layer 146 within the first subset of the first electrically conductive layers 146; and a pillar dielectric material layer 324 laterally surrounded by the pillar dielectric liner 322 and comprising a vertically-extending portion that vertically extends from the first contact via structure 86A into a portion of the substrate 9 that underlies the first-tier alternating stack (132, 146). In one embodiment, the first dielectric pillar structure 320 further comprises a pillar dielectric fill material portion 326 that is laterally surrounded by the pillar dielectric material layer 324.

In one embodiment, the first-tier dielectric spacer (122, 124, 127) comprises: a first dielectric liner 122 in contact with each first electrically conductive layer 146 within the second subset of the first electrically conductive layers 146; and a first dielectric material layer 124 laterally surrounded by the first dielectric liner 122 and comprising a vertically-extending portion that extends through each first electrically conductive layer 146 within the second subset of the first electrically conductive layers 146.

In one embodiment, the first-tier dielectric spacer (122, 124, 127) further comprises a first tubular dielectric material portion 127 laterally surrounding the first dielectric material layer 124 and contacting a segment of a cylindrical sidewall of the first contact via structure 86A. In one embodiment, the first tubular dielectric material portion 127 is in contact within an annular top surface of a laterally-protruding annular portion of the first contact via structure 86A (which fills an annular recess underlying the first tubular dielectric material portion 127).

In one embodiment, the memory device further comprises a second support and contact assembly 480 vertically extending through the first-tier alternating stack (132, 146) and the second-tier alternating stack (232, 246). The second support and contact assembly 480 comprises: a second contact via structure 86B contacting an annular top surface of a second reference electrically conductive layer 246 that is one of the second electrically conductive layers 246 of the second-tier alternating stack (232, 246) and having a top surface located within the horizontal plane including the topmost surface of the second-tier alternating stack (232, 246); and a second dielectric pillar structure 420 underlying and contacting the second contact via structure 86B, and extending into the substrate 9.

In one embodiment, the second dielectric pillar structure 420 comprises second laterally-protruding fin portions 420FF that protrude outward at each level of the first electrically conductive layers 146. In one embodiment, the second dielectric pillar structure 420 further comprises at least one additional laterally-protruding fin portion 420SF that protrudes outward at each level of a first subset of the second electrically conductive layers 246 that underlies the second reference electrically conductive layer 246.

In one embodiment, the second dielectric pillar structure 420 comprises: a first dielectric liner 122 vertically extending through each layer within the first-tier alternating stack (132, 146); a first dielectric material layer 124 laterally surrounded by the first dielectric liner 122 and comprising a vertically-extending portion that vertically extends through each layer within the first-tier alternating stack (132, 146) and laterally-extending annular portions that comprise portions of the fin portions 420FF and laterally protrude outward from the vertically-extending portion at each level of the first electrically conductive layers 146; a first dielectric fill material portion 126 that is laterally surrounded by the first dielectric liner 122; an additional dielectric liner 422 (i.e., an inner dielectric liner 422) vertically extending from a bottom surface of the second contact via structure 86B into a volume located inside the first dielectric fill material portion 126 and having a bottom surface below a horizontal plane including a topmost surface of the first-tier alternating stack (132, 146).

In one embodiment, the first support and contact assembly 380 lacks an air gap 129 in the first dielectric pillar structure 320, while the second support and contact assembly 480 contains an air gap 129 in the second dielectric pillar structure 420.

The various embodiments of the present disclosure can be employed to provide a three-dimensional memory device including support and contact assemblies (380, 480). Each of the support and contact assemblies (380, 480) comprises a respective contact via structure 86 and a respective dielectric pillar structure (320 or 420) which provide structural support throughout the manufacturing process and after formation of the contact via structures 86. The dielectric pillar structures (320, 420) are formed below the respective contact via structures 86. Thus, the sides of the respective contact via structures 86 do not contact the sidewalls dielectric pillar structures (320, 420) which are vertically spaced from the contact via structures 86, or the sidewalls of the support pillar structure 20 which are laterally spaced from the contact via structures 86. This lacks of sidewall contact prevents or reduces undesirable, asymmetrically shaped contact via structures 86, which in turn reduces defects and open circuits. Furthermore, the combined dielectric pillar structures (320, 420) and the support pillar structure 20 have a high density, which prevents or reduces pattern collapse during replacement of the sacrificial material layers with the electrically conductive layers.

Although the foregoing refers to particular preferred embodiments, it will be understood that the disclosure is not so limited. It will occur to those of ordinary skill in the art that various modifications may be made to the disclosed embodiments and that such modifications are intended to be within the scope of the disclosure. Compatibility is presumed among all embodiments that are not alternatives of one another. The word "comprise" or "include" contemplates all embodiments in which the word "consist essentially of" or the word "consists of" replaces the word "comprise" or "include," unless explicitly stated otherwise. Where an embodiment employing a particular structure and/or configuration is illustrated in the present disclosure, it is understood that the present disclosure may be practiced with any other compatible structures and/or configurations that are functionally equivalent provided that such substitutions are not explicitly forbidden or otherwise known to be impossible to one of ordinary skill in the art. All of the publications, patent applications and patents cited herein are incorporated herein by reference in their entirety.

What is claimed is:

1. A memory device, comprising:

a first-tier alternating stack of first insulating layers and first electrically conductive layers located over a substrate;

a second-tier alternating stack of second insulating layers and second electrically conductive layers overlying the first-tier alternating stack;

memory openings vertically extending through the first-tier alternating stack and the second-tier alternating stack;

memory opening fill structures located in the memory openings, wherein each of the memory opening fill structures comprises a respective vertical semiconductor channel and a vertical stack of memory elements; and a first support and contact assembly vertically extending through the first-tier alternating stack and the second-tier alternating stack and comprising:

a first contact via structure contacting an annular top surface of a first reference electrically conductive layer that is one of the first electrically conductive layers of the first-tier alternating stack and having a top surface located above a horizontal plane including a topmost surface of the second-tier alternating stack;

a first dielectric pillar structure having at least one first laterally-protruding fin portion that protrudes outward at each level of a first subset of the first electrically conductive layers that underlies the first reference electrically conductive layer; and a first-tier dielectric spacer that laterally surrounds the first contact via structure, is not in direct contact with the first dielectric pillar structure, and vertically extending through each first electrically conductive layer within a second subset of the first electrically conductive layers that overlies the first reference electrically conductive layer; and further comprising a second-tier dielectric spacer that laterally surrounds the first contact via structure, and is in contact with each of the second electrically conductive layers.

2. The memory device of claim 1, wherein:

the second-tier dielectric spacer is not in direct contact with the first-tier dielectric spacer; and the second-tier dielectric spacer comprises an annular bottom surface in contact with a top surface of a bottommost second insulating layer of the second insulating layers.

3. The memory device of claim 1, wherein:

the first-tier dielectric spacer comprises at least one first laterally-protruding fin portion that protrudes outward at each level of a second subset of the first electrically conductive layers; and the second-tier dielectric spacer comprises at least one first laterally-protruding fin portion that protrudes outward at each level of the second electrically conductive layers.

4. A memory device, comprising:

a first-tier alternating stack of first insulating layers and first electrically conductive layers located over a substrate;

a second-tier alternating stack of second insulating layers and second electrically conductive layers overlying the first-tier alternating stack;

memory openings vertically extending through the first-tier alternating stack and the second-tier alternating stack;

memory opening fill structures located in the memory openings, wherein each of the memory opening fill structures comprises a respective vertical semiconductor channel and a vertical stack of memory elements; and a first support and contact assembly vertically extending through the first-tier alternating stack and the second-tier alternating stack and comprising:

a first contact via structure contacting an annular top surface of a first reference electrically conductive layer that is one of the first electrically conductive layers of the first-tier alternating stack and having a top surface located above a horizontal plane including a topmost surface of the second-tier alternating stack;

a first dielectric pillar structure having at least one first laterally-protruding fin portion that protrudes outward at each level of a first subset of the first electrically conductive layers that underlies the first reference electrically conductive layer; and a first-tier dielectric spacer that laterally surrounds the first contact via structure, is not in direct contact with the first dielectric pillar structure, and vertically extending through each first electrically conductive layer within a second subset of the first electrically conductive layers that overlies the first reference electrically conductive layer;

wherein a topmost surface of the first-tier dielectric spacer contacts a bottom surface of a bottommost second insulating layer of the second insulating layers.

5. A memory device, comprising:

a first-tier alternating stack of first insulating layers and first electrically conductive layers located over a substrate;

a second-tier alternating stack of second insulating layers and second electrically conductive layers overlying the first-tier alternating stack;

memory openings vertically extending through the first-tier alternating stack and the second-tier alternating stack;

memory opening fill structures located in the memory openings, wherein each of the memory opening fill structures comprises a respective vertical semiconductor channel and a vertical stack of memory elements; and a first support and contact assembly vertically extending through the first-tier alternating stack and the second-tier alternating stack and comprising:

a first contact via structure contacting an annular top surface of a first reference electrically conductive layer that is one of the first electrically conductive layers of the first-tier alternating stack and having a top surface located above a horizontal plane including a topmost surface of the second-tier alternating stack;

a first dielectric pillar structure having at least one first laterally-protruding fin portion that protrudes outward at each level of a first subset of the first electrically conductive layers that underlies the first reference electrically conductive layer; and a first-tier dielectric spacer that laterally surrounds the first contact via structure, is not in direct contact with the first dielectric pillar structure, and vertically extending through each first electrically conductive layer within a second subset of the first electrically conductive layers that overlies the first reference electrically conductive layer;

wherein the first dielectric pillar structure comprises:

a pillar dielectric liner vertically extending through each first electrically conductive layer within the first subset of the first electrically conductive layers; and a pillar dielectric material layer laterally surrounded by the pillar dielectric liner and comprising a vertically-extending portion that vertically extends from the first contact via structure into a portion of the substrate that underlies the first-tier alternating stack; and a first dielectric fill material portion that is laterally surrounded by the pillar dielectric material layer.

6. The memory device of claim 5, wherein the first-tier dielectric spacer comprises:

a first dielectric liner in contact with each first electrically conductive layer within the second subset of the first electrically conductive layers; and a first dielectric material layer laterally surrounded by the first dielectric liner and comprising a vertically-extending portion that extends through each first electrically conductive layer within the second subset of the first electrically conductive layers; and a first tubular dielectric material portion laterally surrounding the first dielectric material layer and contacting a segment of a cylindrical sidewall of the first contact via structure.

7. The memory device of claim 6, wherein the first tubular dielectric material portion is in contact within an annular top surface of a laterally-protruding annular portion of the first contact via structure.

8. A memory device, comprising:

a first-tier alternating stack of first insulating layers and first electrically conductive layers located over a substrate;

a second-tier alternating stack of second insulating layers and second electrically conductive layers overlying the first-tier alternating stack;

memory openings vertically extending through the first-tier alternating stack and the second-tier alternating stack;

memory opening fill structures located in the memory openings, wherein each of the memory opening fill structures comprises a respective vertical semiconductor channel and a vertical stack of memory elements;

a first support and contact assembly vertically extending through the first-tier alternating stack and the second-tier alternating stack and comprising:

a first contact via structure contacting an annular top surface of a first reference electrically conductive layer that is one of the first electrically conductive layers of the first-tier alternating stack and having a top surface located above a horizontal plane including a topmost surface of the second-tier alternating stack;

a first dielectric pillar structure having at least one first laterally-protruding fin portion that protrudes outward at each level of a first subset of the first electrically conductive layers that underlies the first reference electrically conductive layer; and a first-tier dielectric spacer that laterally surrounds the first contact via structure, is not in direct contact with the first dielectric pillar structure, and vertically extending through each first electrically conductive layer within a second subset of the first electrically conductive layers that overlies the first reference electrically conductive layer; and a second support and contact assembly vertically extending through the first-tier alternating stack and the second-tier alternating stack and comprising:

a second contact via structure contacting an annular top surface of a second reference electrically conductive layer that is one of the second electrically conductive layers of the second-tier alternating stack and having a top surface located within the horizontal plane including the topmost surface of the second-tier alternating stack; and a second dielectric pillar structure underlying and contacting the second contact via structure, and extending into the substrate;

wherein:

the first dielectric pillar structure lacks an air gap while the second dielectric pillar structure includes an air gap;

the second dielectric pillar structure comprises second laterally-protruding fin portions that protrude outward at each level of the first electrically conductive layers; and at least one additional laterally-protruding fin portion that protrudes outward at each level of a first subset of the second electrically conductive layers that underlies the second reference electrically conductive layer.

9. A memory device, comprising:

a first-tier alternating stack of first insulating layers and first electrically conductive layers located over a substrate;

a second-tier alternating stack of second insulating layers and second electrically conductive layers overlying the first-tier alternating stack;

memory openings vertically extending through the first-tier alternating stack and the second-tier alternating stack;

memory opening fill structures located in the memory openings, wherein each of the memory opening fill structures comprises a respective vertical semiconductor channel and a vertical stack of memory elements;

a first support and contact assembly vertically extending through the first-tier alternating stack and the second-tier alternating stack and comprising:

a first contact via structure contacting an annular top surface of a first reference electrically conductive layer that is one of the first electrically conductive layers of the first-tier alternating stack and having a top surface located above a horizontal plane including a topmost surface of the second-tier alternating stack;

a first dielectric pillar structure having at least one first laterally-protruding fin portion that protrudes outward at each level of a first subset of the first electrically conductive layers that underlies the first reference electrically conductive layer; and a first-tier dielectric spacer that laterally surrounds the first contact via structure, is not in direct contact with the first dielectric pillar structure, and vertically extending through each first electrically conductive layer within a second subset of the first electrically conductive layers that overlies the first reference electrically conductive layer; and a second support and contact assembly vertically extending through the first-tier alternating stack and the second-tier alternating stack and comprising:

a second contact via structure contacting an annular top surface of a second reference electrically conductive layer that is one of the second electrically conductive layers of the second-tier alternating stack and having a top surface located within the horizontal plane including the topmost surface of the second-tier alternating stack; and a second dielectric pillar structure underlying and contacting the second contact via structure, and extending into the substrate;

wherein the second dielectric pillar structure comprises:

a first dielectric liner vertically extending through each layer within the first-tier alternating stack;

a first dielectric material layer laterally surrounded by the first dielectric liner and comprising a vertically-extending portion that vertically extends through each layer within the first-tier alternating stack and laterally-extending annular portions laterally that laterally protrudes outward from the vertically-extending portion at each level of the first electrically conductive layers;

a first dielectric fill material portion that is laterally surrounded by the first dielectric liner;

an additional dielectric liner vertically extending from a bottom surface of the second contact via structure into a volume located inside the first dielectric fill material portion and having a bottom surface below a horizontal plane including a topmost surface of the first-tier alternating stack.

* * * * *